US006720589B1

(12) United States Patent
Shields

(10) Patent No.: US 6,720,589 B1
(45) Date of Patent: Apr. 13, 2004

(54) SEMICONDUCTOR DEVICE

(75) Inventor: Andrew James Shields, Cambridge (GB)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/396,438

(22) Filed: Sep. 15, 1999

(30) Foreign Application Priority Data

| Sep. 16, 1998 | (GB) | 9820192 |
| Jul. 10, 1999 | (GB) | 9916182 |
| Jul. 10, 1999 | (GB) | 9916184 |

(51) Int. Cl.$^7$ .......................................... H01L 31/0328
(52) U.S. Cl. ......................................... 257/194; 257/14
(58) Field of Search ........................................ 257/194

(56) References Cited

U.S. PATENT DOCUMENTS

| 5,396,089 A | * | 3/1995 | Wieck et al. ................ 257/192 |
| 5,440,148 A | | 8/1995 | Nomoto |
| 5,614,435 A | | 3/1997 | Petroff et al. |
| 5,663,571 A | | 9/1997 | Ugajin |
| 5,844,253 A | * | 12/1998 | Kim et al. ...................... 257/24 |
| 5,932,889 A | * | 8/1999 | Matsumura et al. ........... 257/14 |
| 5,936,258 A | | 8/1999 | Imamura et al. |
| 6,316,820 B1 | * | 11/2001 | Schmitz et al. ............... 257/649 |

FOREIGN PATENT DOCUMENTS

| GB | 2 283 128 A | 4/1995 |
| GB | 2 341 722 | 3/2000 |
| JP | 7 094 739 | 4/1995 |
| JP | 9 017 966 | 1/1997 |
| JP | 9 179 237 | 7/1997 |
| JP | 9-179237 | 11/1997 |

OTHER PUBLICATIONS

A.J. Shields, et al., Applied Physics Letters, vol. 74, No. 5, pp. 735–737, "Optically Induced Bistability in the Mobility of a Two–Dimensional Electron Gas Coupled to a Layer of Quantum Dots", Feb. 1, 1999.
G. Yusa, et al., Superlattices and Microstructures, vol. 25, No. 1/2, pp. 247–250, "INAS Quantum Dot Field Effect Transistors", 1999.
K. Imamura, et al., Jpn. J. Appl. Phys., vol. 34, Part 2, No. 11A, pps. L1445–L1447, "New Optical Memory Structure Using Self–Assembled InAs Quantum Dots", Nov. 1, 1995.
G. Yusa, et al., Appl. Phys. Lett., vol. 70, No. 3, pps. 345–347, "Trapping of Photogenerated Carriers by InAs Quantum Dots and Persistent Photoconductivity in Novel GaAs/n–AIGaAs Field–Effect Transistor Structures", Jan. 20, 1997.
R. Heitz, et al., Physical Review B, vol. 58, No. 16, pps. R10 151–R10 154, "Excitation Transfer in Self–Organized Asymmetric Quantum Dot Pairs", Oct. 15, 1998.
D. Psaltis, et al., Scientific American, pps. 52–58, "Holographic Memories", Nov., 1995.
F. Sabri, et al., Applied Physics Letter, vol. 74, No. 20, pps. 2996–2998, "Charges Storage in GaAs Metal Insulator Semiconductor Field Effect Transistor Metal Nanodot Memory Structures", May 17, 1999.

* cited by examiner

Primary Examiner—Douglas A. Wille
(74) Attorney, Agent, or Firm—Oblon, Spivak, McClelland, Maier & Neustadt, P.C.

(57) ABSTRACT

Semiconductor devices are provided which can be configured as optically activated memories or single photon detectors. The devices comprise an active layer with a plurality of quantum dots and an active layer. The devices are configured so that charge stored in the quantum dots affects the transport and/or optical characteristics etc of the active layer. Hence, measuring such a characteristic of the active layer allows variations in the carrier occupancy of the quantum dots to be determined

23 Claims, 41 Drawing Sheets

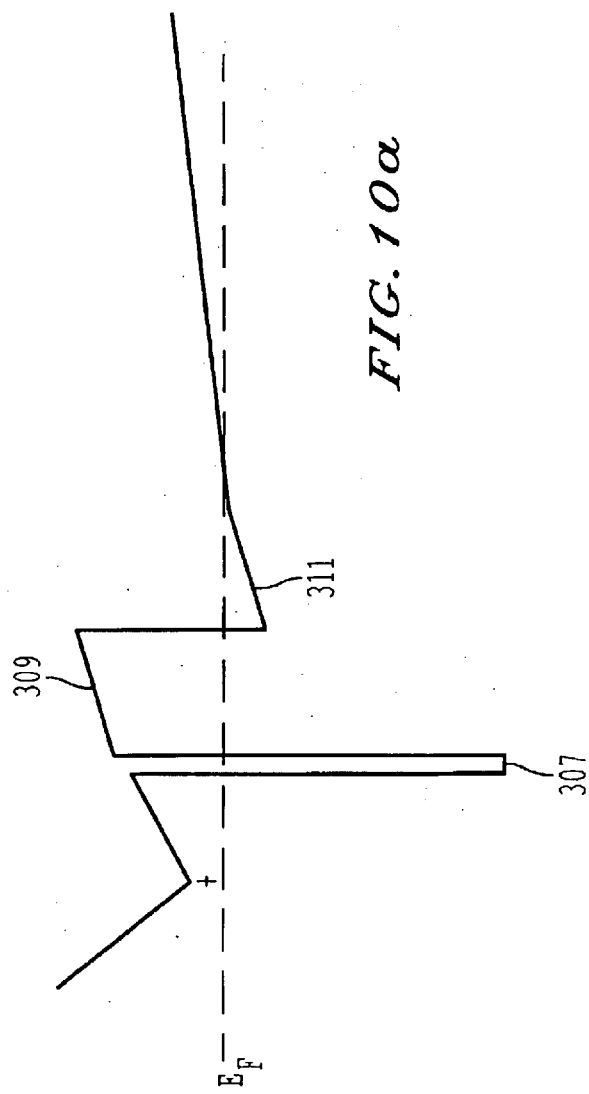
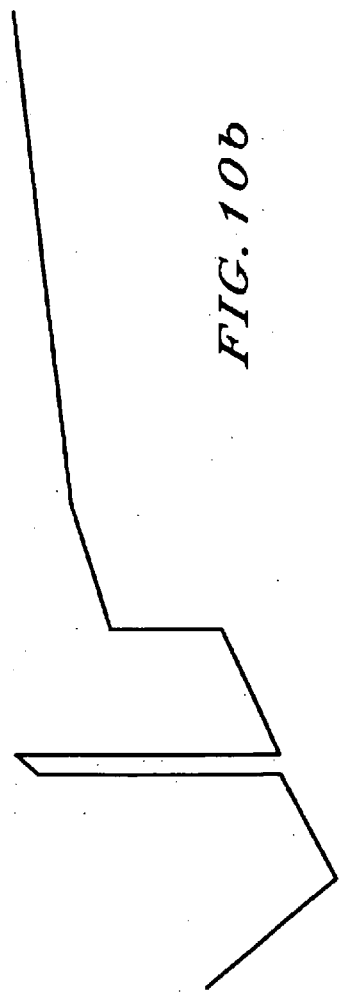
FIG.10a
FIG.10b

- 53 — GaAs          InAs OR InAlAs QUANTUM
- 51 — ⬜ ⬜ ⬜ ⬜ DOT SHEET
- 49 — AlAs OR AlGaAs
- 47 — InGaAs 2DEG
- 45 — UNDOPED GaAs
- 41 — DOPED GaAs
- 43

- 53 — GaAs          InAlAs QUANTUM
- 51 — ⬜ ⬜ ⬜ ⬜ DOT SHEET
- 49 — GaAs
- 47 — InGaAs 2DEG
- 45 — UNDOPED AlGaAs
- 41 — DOPED AlGaAs
- 43

- 53 — GaAs          InAlAs QUANTUM
- 51 — ⬜ ⬜ ⬜ ⬜ DOT SHEET
- 49 — AlGaAs
- 47 — InGaAs 2DEG
- 45 — UNDOPED AlGaAs
- 41 — DOPED AlGaAs
- 43

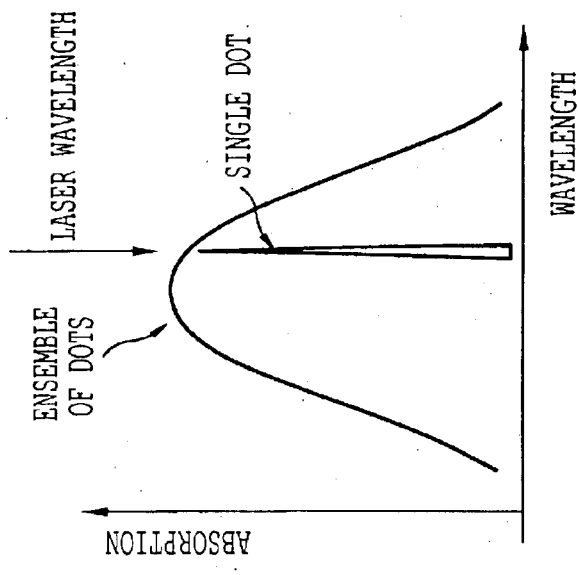
FIG. 18
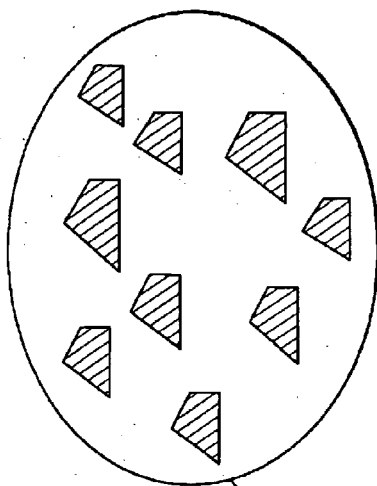
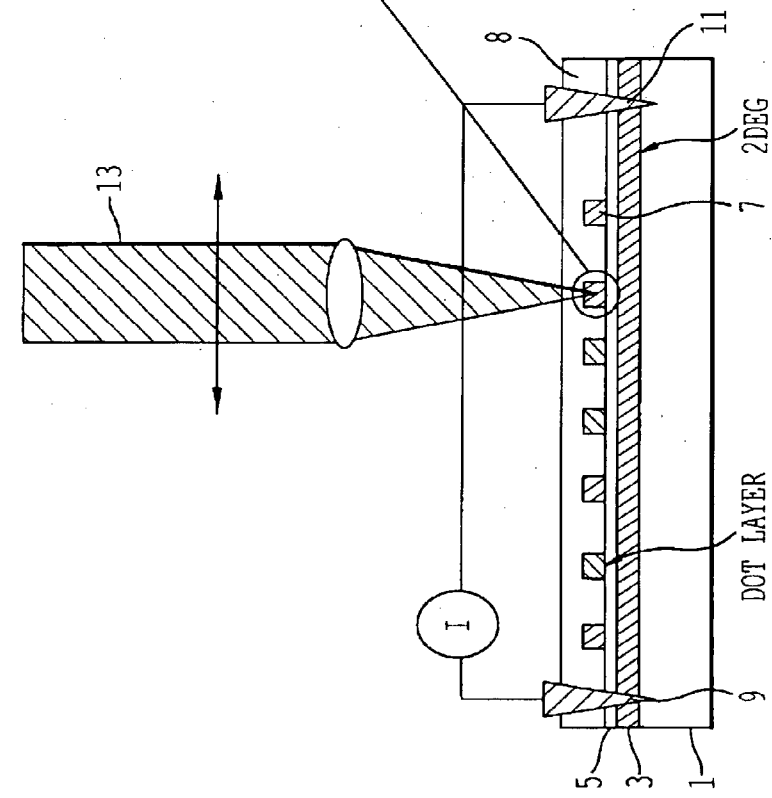
FIG. 17

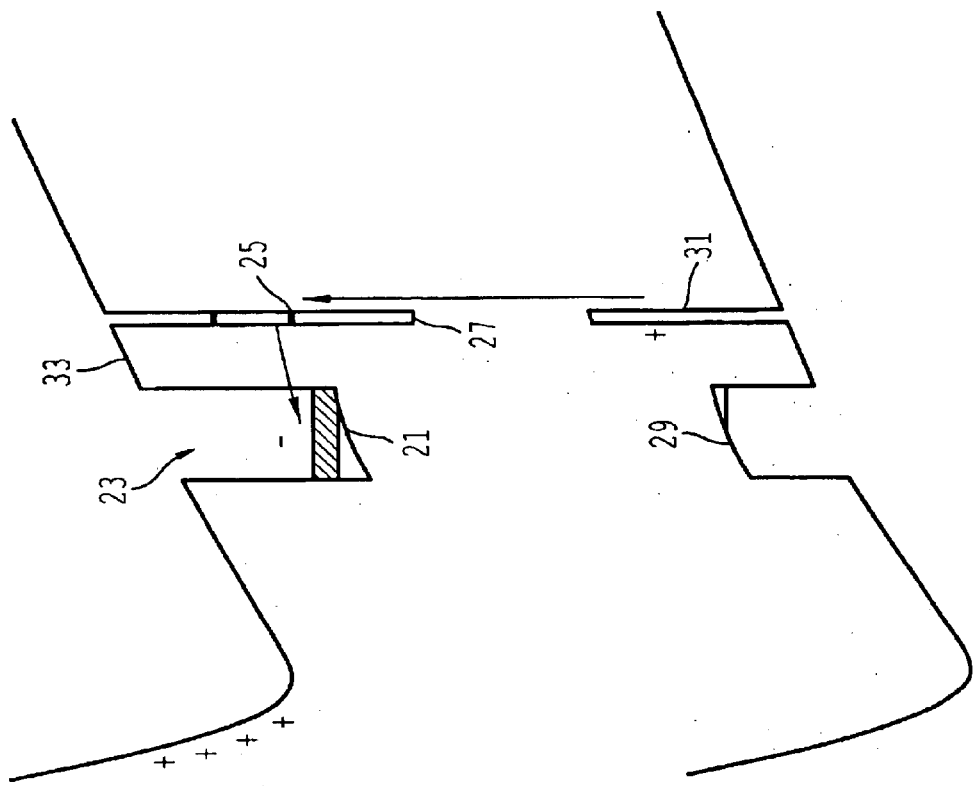
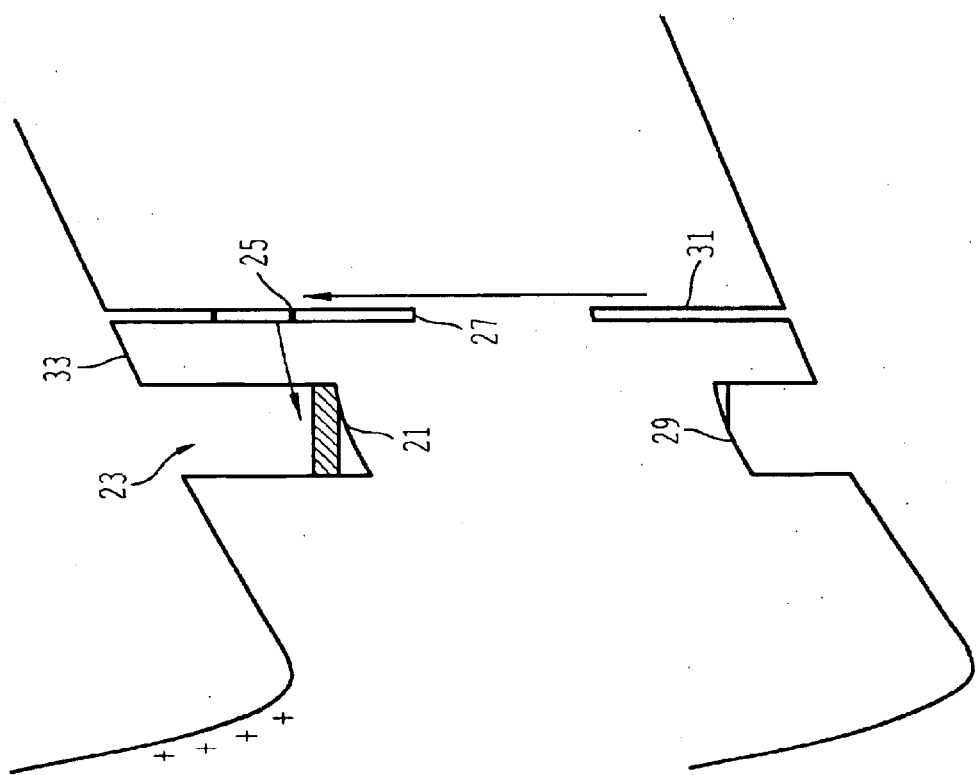

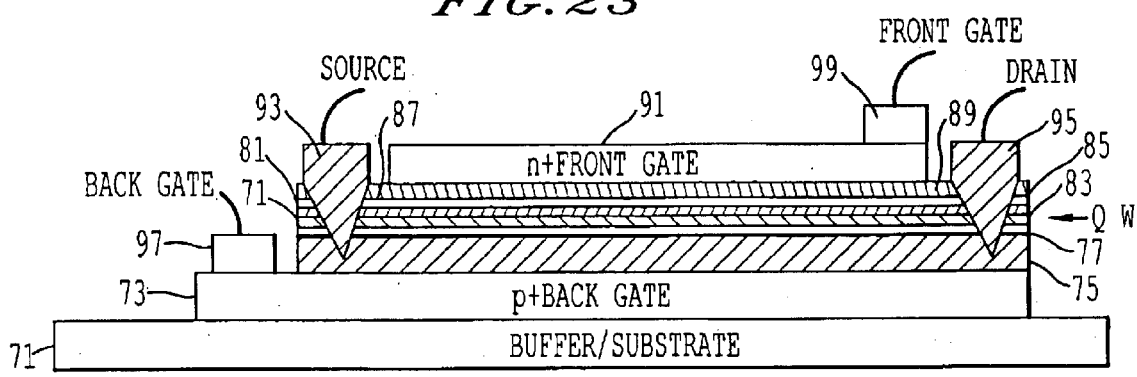
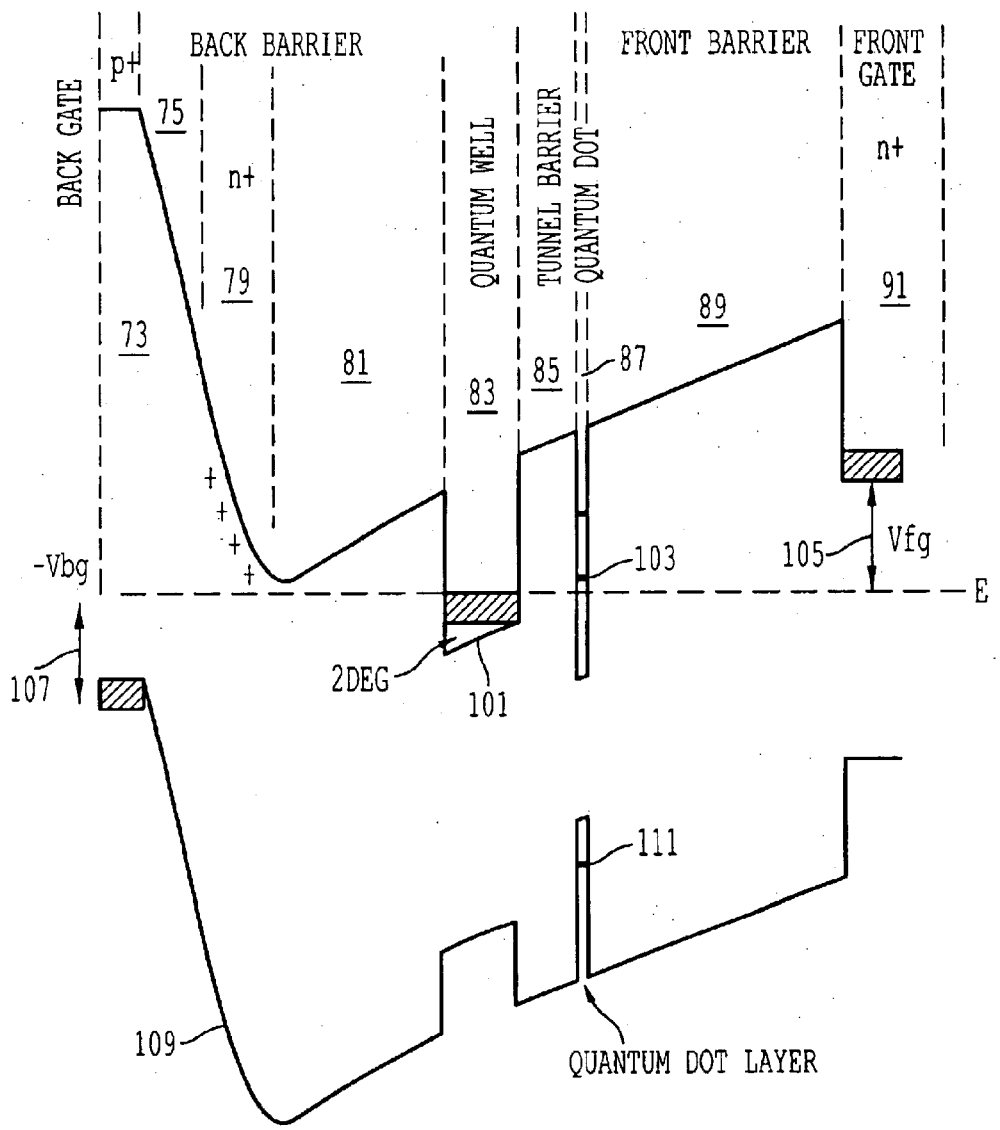

ELECTRON TUNNELS INTO OTHER DOT

LASER EXCITES ELECTRON-HOLE PAIR

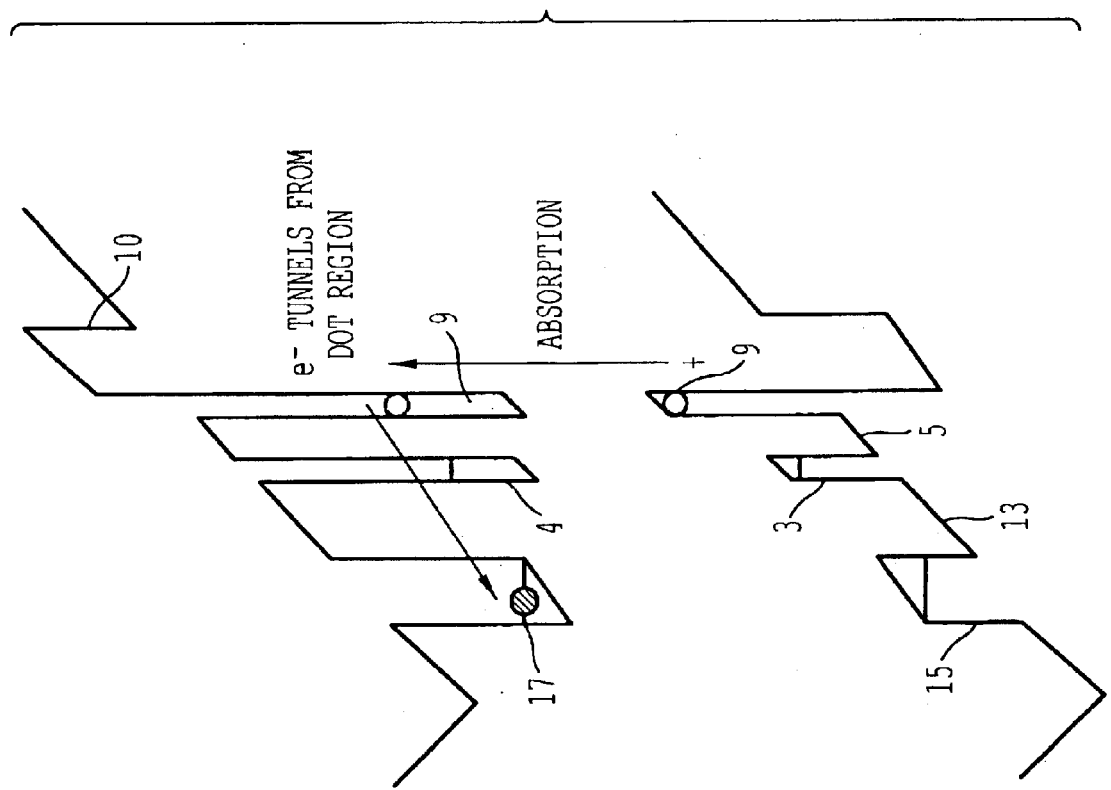

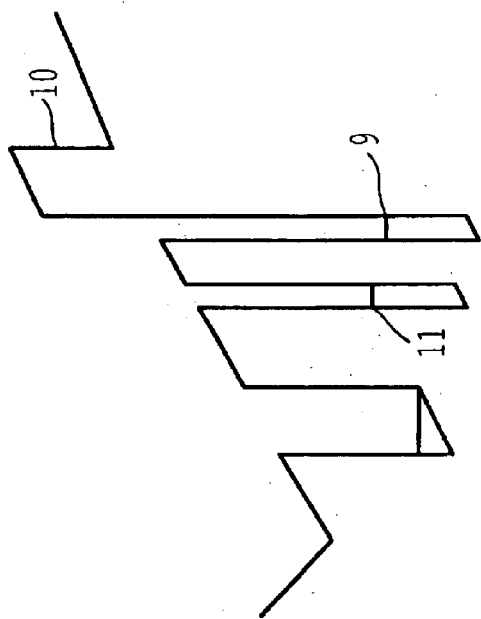
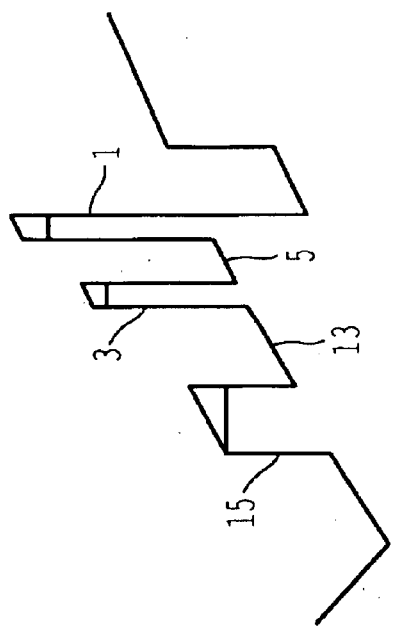

READ (EMPTY DOT)

READ (OCCUPIED DOT)

SEMICONDUCTOR DEVICE

TECHNICAL FIELD

The present invention relates to the field of so-called low dimensional semiconductor devices. More specifically, the present invention relates to semiconductor devices which use so-called quantum dots to either store charge or detect incident radiation. The devices can be used for a range of applications, but are particularly intended for use as optically activated devices such as optical detectors or memory structures.

BACKGROUND OF INVENTION

The electrons and holes in an ideal bulk semiconductor have a continuous spectrum of energy states. Confinement of the carriers in one or more dimensions modifies this energy spectrum by a quantisation of the k-vector along the confinement direction(s). In a quantum dot, the motion of the carriers is restricted in all three spatial dimensions. Consequently, the energy spectrum of the dots consists of a series of discrete levels. As the size of the quantum dot reduces, the energy spacing between these discrete levels increases. The maximum number of electrons which can occupy each electron level is two, corresponding to the up and down spin states. Similarly, each hole level has an occupancy of two. Optical transitions occur between the discrete electron and discrete hole levels.

There is a need for an optical detector which is capable of detecting a single photon. Recently, this need has been heightened by the advent of quantum cryptography of optical signals. In essence, quantum cryptography relies upon the transmission of data bits as single particles in this case photons, which are indivisible. One way in which the data can be encoded is via the polarisation of the electric field vector of the photons. The key component of such a system is a detector which can respond to individual photons. It has been proposed that quantum cryptography can be used to transmit the key for the encryption of data. Examples of information which might be encrypted in this way are internet data or data from automatic teller machines.

Single photon detection is also useful as a low level light detection means for spectroscopy, medical imaging or astronomy. An optimum signal to noise ratio is achieved when a single photon is detected, as the noise is then limited by the source and it is completely independent of noise arising due to the amplifier or detector itself.

A single photon detector could also be used for time-of-flight ranging experiments where the distance of an object from a fixed point is measured by calculating the time over which a single photon takes to return to a detector. This technique can also be used to scan the surface of an object, even a distant object, to form a spatial image of its surface depth, thickness etc.

Single photon detectors are available in the form of photo multiplier tubes (PMT) and single photon avalanche photo diodes (SPAD). PMTs have the disadvantage of having low quantum efficiency, being expensive, bulky, mechanically fragile, requiring high biasing voltages and cooling. They can also be damaged and can require a long settling time after exposure to high light levels or stay magnetic fields. On the other hand, SPADs have the disadvantage of having a relatively low gain and high dark count rates, especially when operated at higher repetition rates. They are also expensive and require high bias voltages and external cooling.

Applications for memory devices are well known. Memory devices which use quantum dots are also know, for example, Imamura et al. Jpn. J. Appl. Phys. Vol. 34 (1995) L1445-L1447. Here, the device has a plurality of InAs quantum dot of different sizes.

Upon illumination, an electron-hole pair is excited in the quantum dot. Due to the biasing of the structure, the electron is swept vertically down through the structure into an ohmic metal contact. The hole is trapped in the quantum dot Due to the movement of electrons, a photocurrent flows. Only a finite number of holes can be stored in a dot. If this finite number is reached, no further holes can be stored in the dots and hence no photocurrent due to dissociated electrons can flow. Thus, stored charge can by detected by a lack of photocurrent.

The carrier trapping properties of quantum dots is also illustrated in Yusa et al Appl. Phys. Lett. 70 (1997) 345. Here, a plurality of quantum dots are used to show trapping effects which occur when a two dimensional electron gas (2DEG) is illuminated.

SUMMARY OF INVENTION

The device of the present invention can be primarily configured as an optical detector which is capable of detecting single photons or an optical memory. Other device configurations are also possible.

In a first aspect, the present invention provides a semiconductor device comprising first and second active layers separated by a first barrier layer, means for applying electric field normal to the first and second active layers and detecting means for detecting a change in a characteristic of the first active layer, wherein the first active layer is a quantum well layer capable of supporting a two dimensional carrier gas and the second active layer comprises a plurality of quantum dots.

Initially, a second aspect of the present invention will be discussed where the device is configured as an optical detector which is sensitive to detect a single photon. The detector of the second aspect comprises first and second active layers separated by a first barrier layer, and detecting means for detecting a change in a characteristic of the first active layer, wherein the first active layer is a quantum well layer capable of supporting a two dimensional carrier gas and the second active layer comprises at least one quantum dot, the device further comprises means for separating a photo-excited electron-hole pair.

Preferably the means for separating an electron-hole pair will be provided by a means for applying an electric field normal to the active layers. However, the device may be fabricated such that the internal field of the device allows separation of photo-excited electron-hole pairs.

The device is capable of detecting a single photon. This is because optical illumination of the device leads to a change in the charge occupancy of the quantum dots and this, in turn induces a change in a transport or optical characteristic of the first active layer. The first active layer will have excess carriers provided by a doped barrier layer or a gate etc.

Absorption of a single photon by the device results in a change in the occupancy of a quantum dot by one carrier and this in turn induces a change in a transport or optical characteristic of the first active layer. A single photon incident on the device will photo-excite one electron-hole pair within the device. One of these photo-excited carriers is trapped by a quantum dot and induces a change in a characteristic of the first active layer. For simplicity, it will be assumed that the photo-excited hole is trapped within the quantum dot. However, it will be appreciated by those skilled in the art that the electron can be the photo-excited carrier which is trapped within the dot The detector of the second aspect is configured to detect the presence of a single photon either by the size of the device, the total number of dots in the second active layer, the layer structure of the device or in the actual detection mechanism of the device.

Preferably, to reliably detect single photons irradiating the device, the number of active dots in the device is less than 100,000, more preferably less than 10,000. To avoid confusion, the term active dot is intended to mean a dot in the active area of the device which is capable of trapping carriers during normal operation of the device. Dots which cannot trap charge or which are outside the active area are not active dots. Also, the term active area is intended to mean the area of the device which is subjected to the separating means and which contributes to a change in the characteristic of the first active layer. In some cases, the field will be applied by a gate and a mesa will be etched to define the device boundaries, the active area here will be the area of overlap between the gate and the mesa. In this case the size of the gate is chosen so that the number of active dots in the device is less than 100,000, more preferably less than 10,000. The active area defined by the gate can be less than $10^{-8} m^2$.

In alternative examples, the size of the active region is limited by reducing the size of the conduction channel within the first active layer. This may be done by using a split gate, which defines a conduction channel in the first active layer. Here the defined conduction channel will define the active area and not the area of overlap between the gate and the mesa. Preferably, the length of the conduction channel will not be more than 100 $\mu$m, more preferably not more than 10 $\mu$m. Another method to limit the size of the conduction channel is by etching or damaging regions of the first active region The detecting means can either measure a change in the transport characteristics of the first active layer or the optical characteristics of the layer. For example, a change in the optical characteristics due to a change in the carrier concentration or electric field across the layer could be detected. Changing the carrier density in the first active layer alters its absorption or emission spectrum. A change in the electric field across the first active layer will cause a change in the energy or intensity of its absorption or emission spectrum. Changes in the carrier concentration, mobility or field across the layer also manifest themselves in the transport characteristics of the layer.

Preferably, the means for detecting a change in a transport characteristic is configured to detect a change in a transport characteristic over a length of 100 $\mu$m in the transport direction of the first active layer.

The photon detector can operate to detect photons over a wide range of wavelengths.

The number of photons absorbed in each of the barriers and active layers depends on the incident photon flux, the absorption coefficient of the layers and their thicknesses. While not wishing to be bound by any theory, it is believed that the following mechanisms contribute to photon detection by the device.

If the incident radiation has a photon energy higher than that of the barrier layers of the device, electron-hole pairs will be photo-excited in the barriers of the device, in addition to either of the active layers. The internal field of the device, or the applied field, disassociates the electron-hole pair and sweeps them in opposite directions, one type of carrier will be trapped by the dot and this will produce a change in the transport characteristic of the first active layer.

In the situation where the photon energy of the incident radiation is lower than the band gap of the barrier layers, but higher than that of the first active layer and also higher than that of the second active layer, electron-hole pairs will be excited in both the first active layer and the second active layer. Essentially no carriers will be excited in the barrier. Since the first active layer typically has a higher absorption co-efficient than the second active layer, most of the carriers will be excited within the first active layer. Due to the internal or applied electric field, one of the carriers can tunnel into the quantum dot leaving the other carrier in the first active layer. This will also cause a change in the characteristics of the first active layer.

If the photon energy of the incident radiation is less than Me band gap of the first active layer but larger than the band gap of the quantum dot layer, then electron-hole pairs are excited in the quantum dot layer. One of these carriers can tunnel out of the first active layer leaving the other carrier trapped within the quantum dot layer. This also causes a change in the characteristic of the first active layer.

The device can also detect illumination which has a photon energy lower than the band gap of the quantum dot, if the quantum dot is designed to contain excess charge. In this situation, a single photon can excite excess charge out of the dot by an intra-band transition. It is then swept away from the quantum dot by applied electric field or an internal electric field. This will also lead to a change in the characteristic of the first active layer.

The applicant does not wish to be bound by a particular theory or explanation. However, it is believed that characteristics of the first active layer can be affected by the trapped carriers through two main mechanisms. In the first mechanism, the excess carries in the first active layer have an opposing polarity to the carriers which are stored in the dots. In the second mechanism, the carriers in the first active layer and the carriers trapped in the dots are of the same type.

The first mechanism will be explained using holes as the stored carrier and a detecting mean consisting of a 2DEG. However, it will be apparent to a person skilled in the art either electrons or holes can be stored in the quantum dots depending on the layer thickness and composition, doping polarities and applied biases.

A quantum dot in the second active layer is illuminated with a beam of radiation. The structure is biased so that it is energetically favourable for the electron to tunnel through the barrier to a 2DEG in the quantum well layer, leaving behind a hole stored in the quantum dot. This effects a change in the conductivity of the 2DEG.

Without wishing to be bound by any particular theory or explanation, the applicant believes that the change in conductivity is predominantly due to the positive charge stored in the barrier which alters the band bending and hence persistently alters the conductivity of the 2DEG. Thus, depending on the actual configuration of the device, the conductivity of the 2DEG can either increase or decrease. It is also believed that where the stored carriers are electrons, the negative charge stored in the barrier will change the conductivity of the quantum well layer. In the case where the stored charges are electrons, the quantum well will support a two dimensional hole gas.

In the second mechanism, the carriers stored in the dots are of the same type as the carriers stored in the well. In the situation where the carriers in the quantum well are electrons, the stored carriers in the quantum dots are electrons. Carriers are preferably provided to the dots via a doped barrier situated on an opposing side of the second active layer to the first active layer. This layer may also be a modulation doped barrier layer, with an undoped spacer layer adjacent the second active layer.

The applicant does not wish to be bound by any theory or explanation. However, it is believed that the dots contain excess electrons prior to illumination. The charged dots act as scattering centres for the electrons in the 2DEG, which consequently has a relatively low mobility. After illumination, the number of excess electrons in the quantum dots is reduced and the number of electrons in the 2DEG increases. A decrease in the negative charge in the dots results in an increase in the 2DEG conductivity. Also, the increase in the carrier concentration of the 2DEG causes an increase in the conductivity of the 2DEG.

The inverse structure may also be realised where excess holes populate the quantum dots prior to illumination and the quantum well supports a two dimensional hole gas.

To detect the presence of charge in the first active layer, it is preferable if at least two ohmic contacts are provided to the first active layer. A voltage will be measured between these two contacts, or a current will be measured flowing between them. For an accurate reading, it is more preferable if a four-terminal voltage measurement is used.

The detection means preferably differentiates (with respect to time), the measured characteristic of the first active layer in order to detect small changes in the characteristics e.g. the conductivity or resistivity of the first active layer. The detection means may also comprise means for detecting a change in the characteristic of the first active layer with respect to time. More preferably, the differentiated signal is fed through a pulse counter to count the number of detected photons. This pulse counter is ideally provided with a discriminator which determines the minimum signal level which will be registered by the counter. This helps to discriminate the pulses due to photons from the noise on the signal.

Preferably, the device is configured so that electrons are supplied to the first active layer. This is preferably done by means of a doped second barrier layer which is preferably provided adjacent the first active layer. More preferably, this doped barrier layer is a modulation doped bier comprising a doped barrier layer and an undoped spacer which lies adjacent the first active layer.

Devices according to the second aspect of the present invention either with or without a doped barrier layer overlying the layer of quantum dots, can also be used where the stored carriers provided to the first active layer are holes.

It should be noted that in some cases, it is preferable to provide a thin growth smoothing layer, say for example, GaAs, prior to forming the dot layer to aid growth of the dot layer. Often, the growth smoothing layer will be provided between a barrier layer and the second active layer.

The field normal to the active layers can be generated by providing a front-gate overlying the structure. The front gate may be a metal front gate or a doped semiconductor gate. More preferably, a back-gate is also provided. The back-gate may be a metal back-gate or a doped semiconductor back-gate. It is preferable if the front-gate is semi-transparent to radiation with an energy close to that of the quantum dot band-gap. Semi transparent is taken to mean that the gate transmits at least about 50% of the radiation incident on the gate. The front and/or back gate may be a fill gate, alternatively one or both of them may be a split gate. A full gate is preferable when the detection of photons causes a decrease in the resistance of the first active layer, a split gate is used to define a conduction channel and is preferably used when illumination causes an increase in the resistance of the first active layer.

The active area of the fill gate is preferably no more than $10^{-8}$ m$^2$. The split gate preferably defines a conduction channel of no more than 108 $\mu$m, more preferably no more than 10 $\mu$m.

The means for applying electric fields may also comprise a p-type and n-type terminal located on opposite sides of the first and second active layers. In other words, the structure is sandwiched between doped p and n-type layers.

The detector preferably comprises an antireflection coating provided on the surface of the device which is to be illuminated.

The energy spectrum of the quantum dots is dependent on its size, shape and local environment. Hence, different quantum dots possess different ground state energies and different optical transition energies. The device may comprise quantum dots of different sizes which require radiation of different frequencies to resonantly excite an electron-hole pair.

A convenient method of forming a layer of quantum dots is by using the Stranski-Krastanow growth mode wherein a first layer is grown on a layer with a different lattice constant to the first layer. The first layer proceeds by three dimensional island growth and small quantum dots can be produced which typically have lateral dimensions of less than 50 nm. A preferable material system for producing this device uses the growth of InAs, InGaAs or InAlAs quantum dots with GaAs or (AlGa)As barriers.

The device may be formed such that the 2DEG layer is grown before the quantum dot layer. However, the ordering may be reversed i.e. the 2DEG layer formed overlying the dot layer. Other lattice mismatched systems can be used such as InGaN or AlGaN. Another possible system for producing the dots uses strained SiGe Heterostructures The device may also conveniently be formed from silicon. Here, the dots would be formed from an amorphous layer of silicon which forms dots after annealing at 800°. It will also be appreciated by a man skilled in the art that germanium could also provide another possible material for fabricating the device.

Detection of single photons is also enhanced if the device further comprises an absorption layer. Such an absorption layer can be a relatively thick layer, for example greater than 100 mn, which forms a barrier layer to the quantum dots. Photons are absorbed within the absorbing layer, creating electron-hole pairs within the absorbing layer. An applied electric field, or internal electric field, within the absorbing layer separates the electron and holes which are swept in opposing directions by the field. One polarity of carrier is swept into the quantum dot layer. Generally, the absorption layer would be provided outside the active region of the device i.e. the absorption layer would not be placed in between the first or second active layers. Such a device will generally also comprise a semiconductor substrate.

The photon detector of the second aspect of the present invention is not limited to a device which has just a single layer of dots. Two or more layers of dots may be provided to trap charge to affect the conductivity of the first active layer. Alternatively, the detector may comprise a plurality of first and second layers separated by a barrier. This device can be thought of as a plurality of photon detectors arranged on top of one another.

A photon detector array may also be fabricated comprising a plurality of pixels, each pixel comprising a photon detector as previously hereinbefore described. Such a photon detector array may be provided with a grid of bit-lines and word-lines, wherein each pixel is addressable by applying an appropriate voltage to a word-line and/or a bit-line. Preferably, the bit-lines and word-lines are configured to apply a control signal to the means for separating a photon-excited electon-hole pair.

In a third aspect, the present invention provides a method of operating the detector of the second aspect of the present invention, the method comprising the steps of:

illuminating the device with a beam of radiation to excite at least one electron-hole pair such that at least one carrier becomes trapped in the second active layer;

detecting a change in the transport characteristics in the first active layer.

Preferably, a external field will be supplied to separate the electron-hole pairs.

The device of the first aspect of the present invention may also be configured as a memory device. The operation of the memory device is largely similar to that of the photon detector in that illumination of the device causes a change in the occupancy of the dots, which, in turn, affects a characteristic of a quantum well layer which can be measured. The memory device will be described with electrons as the excess carriers within the quantum well. However, it will be appreciated that the inverse structure can also be fabricated with holes as the excess carriers within the quantum well The device can be largely configured as that of the single photon detector. However, the device will usually have a larger active area than that of the optical detector. Also, the number of dots in the memory device will usually be larger than that of the photon detector.

As mentioned for the photon detector, the memory is believed to operate using either a first mechanism or a second mechanism. In the first mechanism, as described for the photon detector, the carriers in the quantum well have an opposing polarity to the carriers stored in the quantum dots. As for the detector, the first mechanism will be described using holes as the stored carrier. For a 'write' operation, the device is illuminated with a beam of radiation with an energy close to that of the band-gap of the quantum dot. As for the photon detector, the structure is biased so that it is energetically favourable for the electron to tunnel through the barrier to a 2DEG in the quantum well layer, leaving behind a hole stored in the quantum dot. As previously described, this affects the change in the conductivity of the 2DEG.

For a 'read' operation, the device is again illuminated with energy of near the quantum dot band gap, but now with a weaker intensity. If two holes have already been stored in the dot during the write operation, another hole cannot be stored. Hence, there will be no further change in the conductivity of the 2DEG. If no holes are trapped in the dot, a change in the conductivity of the 2DEG will be detected To reset the device with this mechanism, a bias is applied across the device so that the energy of the electrons in the 2DEG lie above that of the conduction band level electrons in the quantum dot. Therefore, electrons are transferred into the quantum dot which can then combine with the holes. This will set the device on the electron-hole pairs relax back to the ground state.

The memory can also work using the second mechanism. Here, the carriers stored in the dots are of the same type of carrier stored in the well. As we have assumed that electrodes are stored in the quantum well, the stored carriers and the quantum dots will also be electrons. It is believed that the dots contain excess electrons prior to illumination. The charge dots act as scattering centres for the electrodes in the 2DEG which consequently is a relatively low mobility. After a write operation, the number of excess electrons in the quantum dot is reduced and the number of electrons in the 2DEG is increased. A decrease in the negative charge of the dots results in a decrease in the scattering and hence an increase in the 2DEG conductivity.

During the read operation, the dot is illuminated yet again. If the excess electrons in the dot have recombined due to a write operation, then no change in the conductivity of the 2DEG will be seen. However, if the excess electrons in the 2DEG have not recombined, then there will be a decrease in the conductivity as previously described.

For both read and write modes of the first mechanism, the conduction band edge of the 2DEG lies below the first confined conduction band level of the quantum dot. Thus, electrons transfer from the dot to the 2DEG, as the 2DEG is energetically more favourable. To reset the device, the bias across the device is changed so that the energy of an electron in the 2DEG lies above that of the conduction band level of electrons in the dot. Thus, electrons are transferred to the quantum dots which can then combine with the holes. This resets the device as the electron-hole pairs relax back to the ground state.

To produce a memory structure with a good retention time, it is preferable if there is a large confining potential for the trapped carriers. This is equally applicable to devices which are believed to operate by either the first or the second mechanism. The confining potential is largely dependent on the characteristics of the first barrier layer. For the avoidance of doubt as used hereinafter, a barrier layer is a layer with a larger band-gap than that of the active layers.

To produce a large confining potential, it is advantageous to maximise the carrier potential discontinuity between the quantum dot and the barrier layer. The 'size' of the confining potential is dependent on both the potential height of the barrier layer and the width of the barrier layer itself. A large barrier is taken to mean a barrier which has a large carrier potential discontinuity with respect to the quantum dot layer and/or a barrier which is relatively wide.

For example, if the holes are stored in InAs quantum dots, a large trapping potential can be created by choosing AlAs as the barrier material both above and below the dots.

The electric field normal to the layers can be varied to modulate the band structure of the device.

More preferably, the first and second active layer are coupled layers. For the memory structure, the layer are preferably weakly coupled. The coupling between the layers needs to be sufficiently strong to allow tunnelling of some carriers from the second active layer to the first active layer. However, the coupling must also be sufficiently weak to suppress the tunnelling of carriers from the first active layer back to the second active layer.

The quantum well can be thought of as a sheet of charge located within the first active layer. The position of the quantum well within the first active layer, with respect to the adjacent layers of the first active layer is dependent on the band structure. In order to achieve sufficiently weak coupling between the quantum well and the plurality of dots, it is preferable if the separation between the quantum well and the dots is between 10 nm and 500 nm.

For example, if the plurality of quantum dots are InAs (or AlInAs) and the first active layer is InGaAs (or GaAs), the tunnel barrier layer could be AlAs or $Al_xGa_{1-x}As$ (or GaAs) with a width of between 10 nm and 500 nm. More preferably between 10 nm and 200 mm.

The above described memory device can only be reliably read once, as the read operation causes a carrier to be trapped in a quantum dot. However, the device of the present invention can be modified to function as a memory which can be read an infinite number of times by using two (or more) layers of quantum dots.

In a fourth aspect, the present invention provides a semiconductor device comprising first and second dot layers separated by a first barrier layer, each of the first and second dot layers comprising at least one quantum dot and there being at least one aligned double quantum dot provided by a quantum dot in the first dot layer being aligned with a quantum dot in the second dot layer, the device further comprising means for separating an electron hole pair in an aligned quantum dot and dipole detection means for detecting the presence of a dipole in at least one aligned double quantum dot.

The means for separating an electron hole pair preferably comprises means for applying an electric field normal to the first and second dot layers. As for the photon detector, separating means may also be provided by an internal field in the device due to band-gap engineering.

The means for detecting a dipole will preferably be provided by a first active layer comprising a two dimensional carrier gas located close enough to the at least aligned double quantum dot, such that the presence of a dipole in the quantum dot affects a characteristic of the two dimensional carrier gas. The dipole may affect a transport characteristic and/or an optical characteristic.

The applicant does not wish to be bound by any particular theory or explanation, however, it is believed that the memory operates in the following manner:

Generally, there will be a plurality of aligned quantum dots between the first and second dot layers, however, to aid explanation, the device will be described just with one aligned quantum dot. The quantum dot in the first layer will be called a storage dot. The quantum dot in the second layer will be called a sense dot.

Write Operation

During a write operation, the storage quantum dot is irradiated with radiation of a predetermined wavelength such that electron hole pairs are photo-excited within the storage quantum dot. Electrons are created in the conduction band and holes in the valence band. The electric field across the device is set so that electrons tunnel from the conduction band of the storage quantum dot and escape from the region of the two quantum dots, while the holes remain trapped by the storage quantum dot. The quantum dot is illuminated so as to fill the valence band level with holes, which corresponds to bit '1' being written to this dot.

Read Operation

In a read operation, a lower electric field is applied across the device; lower than that for the write operation and the device is again illuminated with radiation of a predetermined wavelength. If bit '1' has previously been written to this quantum dot, so that the appropriate valence band level is fully occupied with holes, the illumination is unable to excite electron-hole pairs within the quantum dot. Therefore, there is no variation in the charge state of either the storage quantum dot or the sense quantum dot.

On the other hand, if bit '0' has previously been written to the quantum dot, so that it is empty of holes, the incident light is able to excite electron-hole pairs within the quantum dot. The electric field is set so that holes are trapped within the storage quantum dot, while the photo-excited electrons are swept into the sense quantum dot. Since the electric field for reading is lower than the electric field for writing, the electrons are not swept out of the storage quantum dot, instead there are typed within the storage quantum dot. Thus, a dipole is formed between the electrons trapped in the sense quantum dot and the holes are trapped in the storage quantum dot This dipole is detected by the means described below.

Thus detection of an electrical dipole under optical illumination at the predetermined wavelength means that the dot was storage dot was empty of holes and corresponds to bit '0'. On the other hand, if no dipole is detected under illumination by the predetermined wavelength, the dot must have been occupied by holes and corresponds to bit '1'.

A dipole detection means, for example, a means for detecting a variation in the characteristics of a carrier gas in the vicinity of the first and second quantum dot layers, can be used to detect the presence of a dipole and hence can be used to detect whether or not the quantum dot has previously been written with bit 1.

After the read operation, the electric field across the dot layers can be reduced to allow the electrons trapped within the sense quantum dot and the holes trapped within the storage quantum dot to recombine, Also, the electrons trapped in the sense quantum dot will combine with holes in the storage quantum dot over time, after the illumination is switched off. It should be noted, because the electron and holes which are excited during the read operation are able to recombine with one another after the read operation, this will not overwrite the previously stored information.

For optimum operation, it is highly preferable that during the read or the write operations, carriers are not photo-excited in the sense quantum dot. Therefore, preferably, the band gap energy of the sense quantum dot is larger than the band gap energy of the storage quantum dot, so that the sense quantum dot is transparent to light with an energy equal to the band gap of the storage quantum dot. The sense quantum dot can be between the storage quantum dot and the active layer, it may also be located on an opposite side of the storage quantum dot to the active layer.

This variation in the band gap between the quantum dots of the first dot layer and the second dot layer can be achieved in a number of ways. For example, the first and second dot layers can be made out of different materials or materials with different alloy compositions. Also, the strain environment of the dots in the first and second layers could also be varied to provide a difference in the band gap of the quantum dots. Preferably, the first dot layer forms a type I heterojunction with its barrier materials and the second dot forms a type II heterojunction with its barrier material.

The detecting means can either measure a change in the transport characteristics of the active layer or the optical characteristics of the active layer. For example, a change in the optical characteristics due to a change in the carrier concentration or electric field across the layer induced by a dipole in an aligned double quantum dot could be detected. Changing the carrier density in the active layer alters its absorption or emission spectrum. A change in the electric field across the active layer will cause a change in the energy or intensity of its absorption or emission spectrum. Changes in the carrier concentration, mobility or field across the layer also manifest themselves in the transport characteristics of the layer.

The configuration of the barrier layers in the device with an aligned quantum dot, is generally different to that described above for the single layer of dots. The terms 'first barrier layer' etc have been re-defined below for the device with the aligned quantum dot. The definitions of the barrier layers below only refer to the device with the aligned quantum dot and do not refer to the single dot layer structure.

The first barrier layer is a barrier layer located between the two dot layers. The first barrier layer will generally have a larger band gap than the first dot layer and the second dot layer.

Preferably, there will also be a second barrier layer located between the active layer and the closest of the dot layers to the active layer. However, this is not always required. For example, in certain device configurations, both the first active layer and the second "barrier layer" may be the same material e.g. GaAs. The GaAs barrier layer is an effective barrier layer even though it has the same band gap as the active layer.

There may also be provided a third barrier layer, which is located on an opposite side of the first dot layer to the second dot layer. This third barrier layer will have a larger band gap Man the first dot layer. It may also have a larger band gap than the first barrier layer. The third barrier layer prevents trapped carriers tunnelling out of the first dot layer. The third barrier layer may be doped to provide excess charge for the first dot layer.

Preferably, excess carriers are supplied to the active layer from a fourth doped barrier layer. More preferably, the fourth barrier layer is provided on an opposing side of the active layer to the dot layers. The fourth barrier layer may preferably be a modulation doped barrier layer comprising an undoped spacer layer adjacent the active layer and a doped layer adjacent the undoped spacer layer.

Barrier layers may be located adjacent to either or both of the first and/or second dot layers. However, in some cases, a thin layer may be formed between a barrier layer and a dot layer to aid smooth growth of the dots during fabrication. Such a thin layer will be referred to s a growth smoothing layer. Typically, if the dots are formed by depositing InAs or InGaAs, the layer may be GaAs.

To produce a memory structure with a good retention time, it is preferable if there is a large confining potential for the trapped carriers. The confining potential is largely dependent on the characteristics of the second and third barrier layer.

To produce a large confining potential, it is advantageous to maximise the carrier potential discontinuity between the dot layers and the barrier layers. The 'size' of the confining potential is dependent on both the potential height of the barrier layer and the width of the barrier layer itself. A large barrier is taken to mean a barrier which has a large carrier potential discontinuity with respect to the quantum dot layer and/or a barrier which is relatively wide.

For example, if the holes are stored in InAs quantum dots, a large trapping potential can be created by choosing AlAs or $Al_xGa_{1-x}As$ as the barrier material both above, below and between the dot layers.

The electric field normal to the layers can be varied to control the tunnelling of photo excited electrons and holes through the structure.

The first barrier layer can be fairly thin, for example less than 30 nm. The width of the first barrier is generally determined by the limits of the fabrication technology available to produce InAs aligned quantum dots, at present, good aligned quantum dots can be produced with a first barrier width of about 15 nm.

More preferably, the active layer and the second dot layer are coupled layers, preferably, weakly coupled layers. The coupling between the layers needs to be sufficiently strong to allow tunnelling of some carriers from the dot layer closest to the active layer. However, the coupling must also be sufficiently weak to suppress the tunneling of carriers from the active layer back to the dot layers.

The quantum well can be thought of as a sheet of charge located within the active layer. The position of the quantum well within the active layer, with respect to the adjacent layers of the active layer is dependent on the band structure In order to achieve sufficiently weak coupling between the quantum well and the second dot layer, it is preferable if the separation between the quantum well and the second dot layer is between 10 nm and 500 nm.

For example, if the plurality of quantum dots in for the second dot layer are InAs (or AlInAs) and the active InGaAs (or GaAs), the second barrier layer could be AlAs or $Al_xGa_{1-x}As$ or GaAs with a width of between 10 nm and 500 nm. More preferably between 10 nm and 200 nm.

To detect the presence of a dipole formed in an aligned double quantum dot, it is preferable if at least two ohmic contacts are provided to the active layer. A voltage will be measured between these two contacts or a current flowing between the two contacts. For an accurate reading, it is more preferable if a four-terminal voltage measurement is used.

Preferably, the measured characteristic from the active layer will be differentiated with respect to time or the change in the characteristic will be measured with respect to time. When the signal is differentiated, the differentiated signal comprises a plurality of pulses, these pulses can be counted by a pulse counter.

The memory device with the aligned double quantum dot either with or without a doped barrier layer overlying the first dot layer, can also be used where the tunnelling carriers are holes.

If the electron hole pair is separated by an externally applied electric field normal to the dot layers, this can be provided by a front-gate overlying the structure. More preferably, a back-gate is also provided in addition to or instead of the front gate. Either or both of the front or back gates can be metal or a doped semiconductor. It is preferable if the front-gate is transparent to radiation with an energy close to that of the quantum dot band-gap of the first dot layer.

The means for applying electric fields may also comprise a p-type terminal and n-type terminal located on opposite sides of the first and second dot layers. In other words, the structure is sandwiched between doped p and n-type layers.

The energy spectrum of the quantum dots is dependent on the dot size, shape and local environment. Hence, different quantum dots possess different ground state energies and different optical tuition energies. Preferably, as mentioned previously, there may be a difference between the size of the dots in the first and second dot layers. The device may also comprise quantum dots of different sizes within each layer which require radiation of different frequencies to excite an electron-hole pair.

A convenient method of forming a layer of quantum dots is by using the Stranski-Krastanow growth mode as described for the photon detector of the second aspect of the present invention. The Stranski-Krastanow growth mode can also be used to produce aligned double quantum dots. This involves depositing a first strained layer which self-assembles into a layer of quantum dots. This is followed by a first barrier layer. Then a second strained layer is deposited which self-assembles into a second layer of quantum dots. It has been found that if the first barrier layer is thinner than a cent thickness, the quantum dots in the second quantum dot layer spatially align above the dots in the first. This is thought to be because the strain created by the dots in the first quantum dot layer seeds the growth of quantum dots in the second quantum dot layer. For the growth of InAs dots on $Al_xGa_{1-x}As$, for instance, the second barrier layer should be no more than about 15 nm thick. Conveniently, it has been found that the dots in the second quantum dot layer have a larger band gap energy than those in the first.

The above description of growth has used the terms "first quantum dot" layer etc. The terms "first" and "second" in the above paragraph refer to the layers in order of growth and are not intended to suggest that the storage dot layer must be grown before the sense dot layer. The dot layers may be fabricated in any order. However, due to the dots in the second grown layer having a larger hand gap than the dots in the first grown layer, if the dots in the fist and second dot layers are fabricated from the same material, the dots in the second grown dot layer lend themselves more easily to sense dots which preferably require a larger band gap.

The device may also be fabricated from an $SiO_2/Si$ based system.

The above described memory devices, i.e. both the device with the single dot layer and the aligned dot can also be used as a holographic type of optical storage device. Here, the optical beam is split into a signal beam and a reference beam. The signal beam is passed through a spatial light modulator in order to encode the information to be stored. The signal and reference beams are focused onto the surface of the sample where they produce an interference pattern. This creates a spatial variation in the carrier occupancy of the dots which acts to store information in the dots. The information can be recalled by illuminating the same area of the sample by the reference beam. The stored variation in the dot occupancy acts to diffract the reference beam and thereby to recover the signal beam which is detected by a suitable means, such as a charge coupled device array.

The memory structures may be provided with upper and lower cladding layers to channel light in a direction parallel to the plane of the first active layer. The structure may also be provided with guide means to confine light to a region of the active layer, for example, a stripe type waveguide could be used.

The memory structures may also be illuminated in the plane of the dot layers instead of or in addition to illuminating generally perpendicular to the layers.

The device of the fourth aspect could be operated by:
  applying a field across the dot layers sufficient to allow carriers of a predetermined polarity to tunnel from the first dot layer to the second dot layer under illumination;
  selectively illuminating one or more of the plurality of quantum dots with a beam of radiation to excite at least one electron-hole pair such that at least one carrier can tunnel from the first dot layer to the second dot layer; and
  detecting the presence of a dipole in an aligned double quantum dot.

The above method is primarily intended as a "read" operation.

More preferably, the method also comprises a write operation which can be performed before or even after a read operation.

Therefore, it is preferable if the method also comprises a step of changing the electric field across the device such that the field can be changed between a field configured to allow a carrier to tunnel from the first dot layer to the second dot layer wherein the carrier becomes trapped in the second dot layer and a field configured to allow a carrier to tunnel from the first dot layer such that the carrier does not become trapped in the second dot layer.

For a "write" operation the carrier does not become trapped in the second dot layer.

The device has been described with just two dot layers, a sense dot layer and a storage dot layer. However, the device could be fabricated with a plurality of dot layers such that one layer acts as a storage dot layer and one or more of the plurality of dot layers acts as a sense dot layer. In some cases, this might be useful to enhance confinement between the storage dot layer and the sense dot layer during the read operation.

The device may also comprise a plurality of first and second dot layers separated by a tunnel layer and means for each of the plurality of first and second dot layers of detecting a dipole between the first and second dot layers.

The present invention is primarily intended for use as an optical memory. Therefore, preferably, an optical memory is provided comprising a plurality of pixels wherein each pixel comprises a device according to the fourth aspect of the present invention or the device configured as a memory according to the first aspect of the present invention.

Each device can be addressed by applying a voltage to a word-line or a bit-line, or both, in the conventional manner. However, the present invention provides yet another dimension to the memory as each pixel can comprise a plurality of quantum dots each of which have a different predetermined excitation energy. Therefore, not only is it possible to address each pixel by varying the voltages on the bit-line and the word-lines, it is also possible to address a single quantum dot by illuminating a pixel with a specific wavelength. Preferably a monochromatic light source should be used for this excitation such as a laser diode. Each of these pixels may contain one or more switching transistors for addressing of the appropriate device.

The bit-line and word-line voltage can be applied directly to the semiconductor device to provide the field for either reading or writing to the quantum dot The array of pixels can be illuminated by a relatively broad beam of light, which can illuminate more than one, or all, of the pixels simultaneously. However, in this case only the active pixel i.e. the pixel with the correct word and bit-line voltages applied to it will store or provide data Also, if the wavelength of the input beam can be varied then another dimension of storage is provided since a plurality of dots may be provided with different band gaps and hence different excitation energies.

Therefore, it is preferable if the optical device of the fourth aspect of the present invention used in the pixel comprises a plurality of aligned double quantum dots, wherein at least one aligned quantum dot has a different excitation energy to that of the other aligned quantum dots.

The memory devices describes above are a subset of an addressable optically active memory structure. Therefore, in a fifth aspect, the present invention provides a memory structure comprising a grid of bit-lines and word-lines defining a plurality of pixels, each pixel being addressable by applying potentials to the bit-line or word-line, at least one pixel comprising a device having a plurality of optical storage means, wherein at least one optical storage means capable of storing data due to optical activation at a different wavelength to that of at least one other optical storage means in the same pixel.

Therefore, the memory according to a fifth aspect of the present invention is addressable via two voltages and a wavelength A method of operating such a device could comprise the steps of applying one or both of the voltages to select the pixel and illuminating with light with a wavelength which can excite a transition in the required memory element of the pixel.

The terms bit-lines and word lines have been used as these are well understood in the an to mean a grid of wires or tracks, which can be used to address a pixel.

The device having optical storage means may be provided by any optically activated memory structure. The above described memory structure with either a single dot layer or a layer of aligned can be devices having the plurality of optical storage means. The individual storage means being a single quantum dot or an aligned quantum dot etc.

Alternatively, the device may be addressed by a focused light source which can be scanned over the surface of the device into different pixels. Preferably this is a monochromatic light source such as a laser diode. Preferably the light is focused to a spot with a diameter of 10 microns or less. In this case it is possible to deflect the focused laser spot across the surface of the device using a pair of mirrors mounted on galvanometers.

Therefore, in a sixth aspect, the present invention provides a method of operating a device comprising a grid of bit-lines and word-lines addressing a plurality of pixels, each pixel being addressable by applying appropriate potentials to the bit-line and/or the word-line, at least one pixel comprising a device having a plurality of optical storage means, wherein at least one optical storage means is capable of storing data due to an optical activation at a different wavelength than that of at least one other optical storage means, the method comprising the steps of:

setting the word-line and/or the bit line voltage to switch a pixel into a read mode or a write mode;

illuminating at least the said pixel which is in a read or write mode, with a beam of radiation with a predetermined wavelength which can activate at least one of the optical storage means in the said pixel.

In the above method, the step of illuminating the pixel can comprise the step of illuminating a plurality of pixels with a broad beam, or scanning a narrow beam, which can only illuminate one pixel at a time to the said pixel.

The step of scanning the read/write beam could be performed by moving the beam via moving mirrors. The mirrors could be controlled by galvanometers.

The device according to a first aspect of the present invention can also be configured as an amplifying phototransistor. The change in the conductivity of the 2DEG can be used to detect the absorption of light After the photon is absorbed, the photon-excited electron and hole are spatially separated into the well and dot layers creating a detectable change in the conductivity of the 2DEG. The mobility of carriers in the first active layer can be modulated by changing the electric field across the first active layer. The mobility can be optimised such that when a carrier tunnels from a dot to the first active layer, a larger rise in conductivity of the device is seen than if the vertical photo-current was measured directly.

A high speed MODFET can also be realised using this structure. Here, the total carrier density in both the well and the dot is maintained constant. When the device is biased so that all the electrons are in the well, the source-drain conductivity is high. However, when the device is biased so that some of the electrons are transferred to the dots, these electrons are trapped and cannot contribute to the conductivity of the device. Therefore, the conductivity is reduced. The electrons tapped in the dots also contribute to scattering of the carriers in the 2DEG, fiber reducing the mobility of the 2DEG.

The switching speed of this device is limited by the tunnelling time between the dots and the well. For fast switching response a smaller barrier should be used, the can be either a thin barrier or a barrier with a relatively small band-gap for a barrier layer. Typically, for example, the barrier could be between 0.5 nm to 5 nm of AlGaAs.

The MODFET can potentially be switched with frequencies of about 100 GHz to 10 THz.

A barrier layer is required otherwise a large separation between the first and second active layers is required to allow resonance of the electron levels at achievable electric fields.

The MODFET could be operated by a method comprising the steps of:

measuring the resistivity of the first active layer via the ohmic contacts; and changing the resistivity of the first active layer by transferring carriers between the first and second active layers by altering the field across the active layers.

The absorption of incident radiation is dependent on the population of the quantum dots.

Therefore, this device can be configured to work as an optical switch or an electro-optical modulator. When the dots have excess carriers, optical absorption is suppressed increasing the optical transparency of the device. In a zero dimensional system there is a large energy separation between the ground and excited states. Therefore, just adding two electrons or holes to the quantum dot completely suppresses absorption of radiation with an energy close to that of the quantum dot band gap.

The optical modulator will be practically realised by incorporating the quantum well Structure into a waveguide for channelling the light along the plane of the layers. Preferably, upper and lower cladding layers are provided, wherein the first active layer overlies the lower cladding layer and the upper cladding layer overlies the second active layer. Again, this device can be operated at a very high frequencies (>100 GHz).

It may also be preferable to provide guide means for confining light to a predetermined region of the first active layer. For example, a strip-type waveguide layer may be provided overlying the structure.

For the MODFET or optical modulator structures, it is preferable if the first and second active layers are more strongly coupled than for the memory structure to allow tunnelling in both directions between the first and second layers. The smaller separation between the dot layer and the 2DEG allows more effective coupling of the dots to the 2DEG and hence, faster and more efficient tunnelling.

BRIEF DESCRIPTION OF THE DRAWINGS

The present invention will now be described a way of example and with reference to the accompanying figures in which;

FIG. 10 shows a schematic band structure of the device of FIG. 9;

FIG. 17 shows a selectively addressable optical memory in an embodiment of the present invention;

FIG. 18 is a plot showing the contribution of and individual quantum dot to the absorption of the ensemble;

FIG. 19 shows a band structure of the embodiment of FIG. 17, in a "write mode";

FIG. 20 shows a band structure of a device of FIG. 17, in a "read mode";

FIG. 23 shows a memory structure and a high speed MODFET in accordance with an embodiment of the present invention;

FIG. 24 shows a layer structure of the device band structure of FIG. 23;

FIG. 32 shows the device of FIGS. 30 and 31 with a dipole detecting means in the write mode;

FIG. 33 shows the device of FIG. 32 in an inactive mode;

DETAILED DESCRIPTION

FIGS. 1 to 16 are primarily concerned with the device as a photon detector.

Figure 1A:
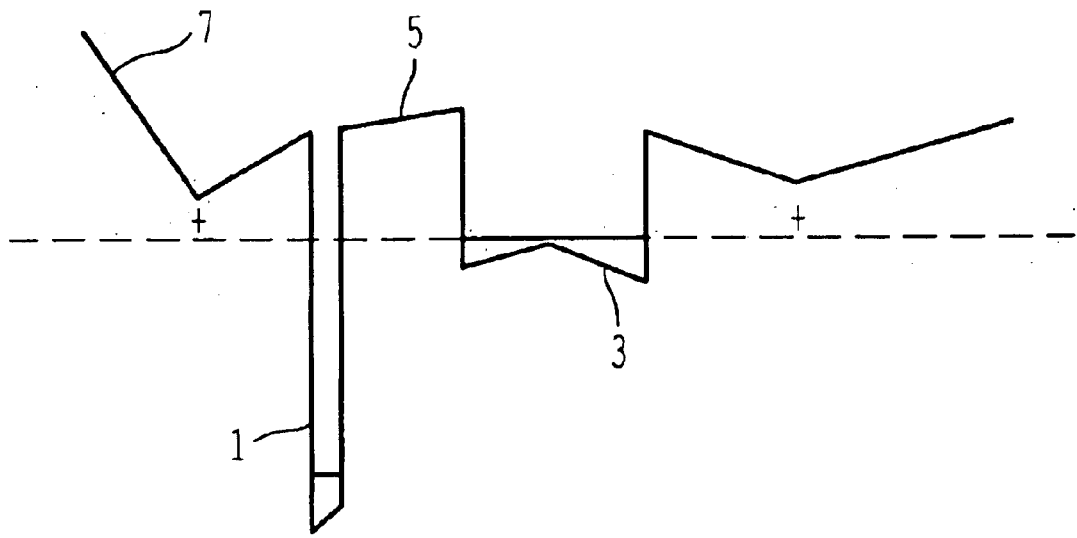
FIG. 1 shows a schematic band structure or part of a device in accordance with an embodiment of the present invention.
Figure 1B:
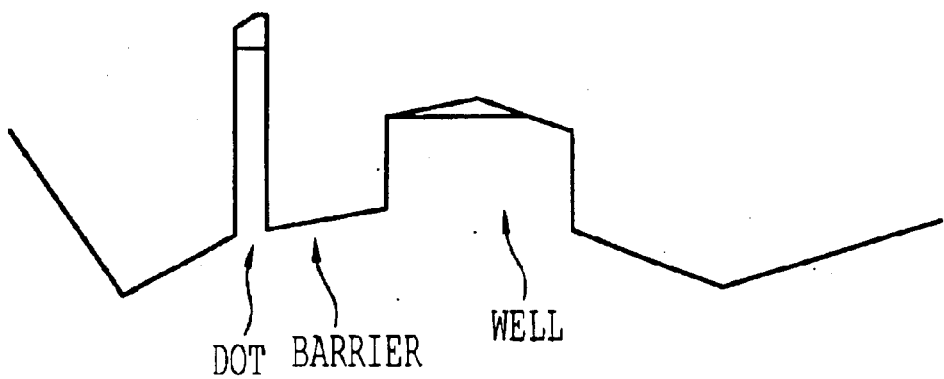

FIG. 1 shows a schematic partial band diagram of a single photon detector having a quantum dot layer 1, a quantum well or 2DEG layer 3. The quantum dot layer 1 and the 2DEG layer 3 are separated by a tunnel barrier 5. The device can be irradiated with illumination of almost any wavelength. When the device is illuminated, a single photon will excite an electron-hole pair. The probability of absorption of an electron-hole pair at any point in the device will depend on the wavelength of the incident radiation, the specific band structure of the device and the position of the illuminated surface of the device with respect to the 2DEG and/or dot layer.

The layers inside the device are subject to electric fields. This can either be an internal electric field due to the internal layer structure of the device or it may be an applied electric field. The electric field causes the photon-excited electron hole pair to separate. Dependent on the band structure and applied electric field, the electron will either become trapped in the conduction band of the quantum dot, or the hole will become trapped in the valence band of quantum dot 1. The presence of a trapped carrier in the quantum dot causes a change in the characteristics of the 2DEG layer 3. Hence, the change in the characteristic of the 2DEG provides a means for detecting a photon.

This discussion will now concentrate on detecting a transport characteristic of the 2DEG. However, it will be appreciated by those skilled in the art that an optical change in the characteristics of the 2DEG could also be used to measure single photons.

It has been mentioned above that the device can be illuminated with radiation of virtually any wavelength. The number of carriers excited in each of the barriers, wells and dots depends on the incident photon flux, the absorption coefficient of the layers and their thicknesses. While not wishing to be bound by any theory, it is believed that the following mechanisms contribute to photon detection by the device.

If the radiation has a photon energy higher than the barrier layer 5 or the second barrier layer 7, then electron hole pairs are photo-excited in either the barriers 5 or 7, the quantum well 3 or the dot 1. The internal electric field of the device, or the applied electric field, disassociates the electron hole pair and sweeps them in opposite directions, one type of carrier (either the electron or the hole) will be trapped by the dot and hence produce a change in the transport characteristic of the 2DEG.

If the photon energy of the incident radiation is lower than the band gap of the barrier layers 5 or 7, but higher than the band gap of the 2DEG 3 and also higher than the band gap of the dot layer 1, then electron hole pairs are excited in both the quantum well layer 3 and the dot layer 1. Essentially no carriers will be excited in the barrier. Since the absorption co-efficient of the quantum well 5 is typically higher than that of the dot layer 1, most of the carriers will be excited in the quantum well. Due to the internal field or the applied electric field, one of the carriers (i.e. either the electron or the hole) can tunnel into the quantum dot 1, leaving the other carrier in the quantum well 5. This causes a change in the characteristic of the 2DEG in the quantum well 3.

If the photon energy of the incident radiation is less than the band gap of the 2DEG (and also the barrier layers) but it is larger than the band gap of the quantum dot 1, then electron hole pairs are excited in the quantum dot 1. One of the carriers can tunnel into the 2DEG layer leaving the other carrier trapped within the dot 1. This also causes a change in the characteristic of the 2DEG 3.

The device can also detect illumination which has a photon energy lower than the band gap of the quantum dot 1, if the quantum dot 1 is designed to contain excess charge. In this situation, a single photon can excite excess charge out of the dot 1 by an intra-band transition. It is then swept away from the quantum dot 1 by applied electric field or an internal electric field. This will also lead to a change in the characteristic of the 2DEG 3.

It should be understood that the quantum well can support either a two dimensional electron gas or a two dimensional hole gas. The polarity of the trapped carriers in the quantum dot 1 can either be the same as that of the two dimensional carrier gas or it can have a different polarity. Regardless of the relative polarities of the carriers trapped in the dot and the carriers in the two dimensional carrier gas, hers trapped in the dot still affect the characteristics of the two dimensional carrier gas. The applicant does not wish to be bound by a particular theory or express explanation However, it is believed that the device can operate via two different mechanisms. In the first mechanism, carriers in the quantum well have an opposing polarity to the carriers which are stored in the dots 1. In the second mechanism, the carriers in the quantum well and the carriers stored in the dots are the same type.

The first mechanism will be explained using holes with a stored carrier. However, it will be apparent to a person skilled in the art that either electrons or holes can be stored in the quantum dots depending on the layer thickness and composition, doping polarities (n- or p-type) and applied biases.

In this situation, it is believed that the positive charge stored in the dot 1, alters the band bending and hence persistently alters the characteristics (for example the conductivity of the two dimensional electron gas).

In the second mechanism the carriers stored in the dots are of the same type as the carriers stored in the well. It is believed that the dot 1 contains excess carriers prior to illumination. The charged dots act as scattering centres for the 2DEG which consequently has a relatively low mobility. After illumination, the number of excess carriers in the quantum dots increases and the number of electrons in the 2DEG increases. A decrease in the negative charge of the dots results in an increase in the 2DEG conductivity. Also, an increase in the carrier concentration of the 2DEG causes an increase in the conductivity of the 2DEG.

Figure 2:
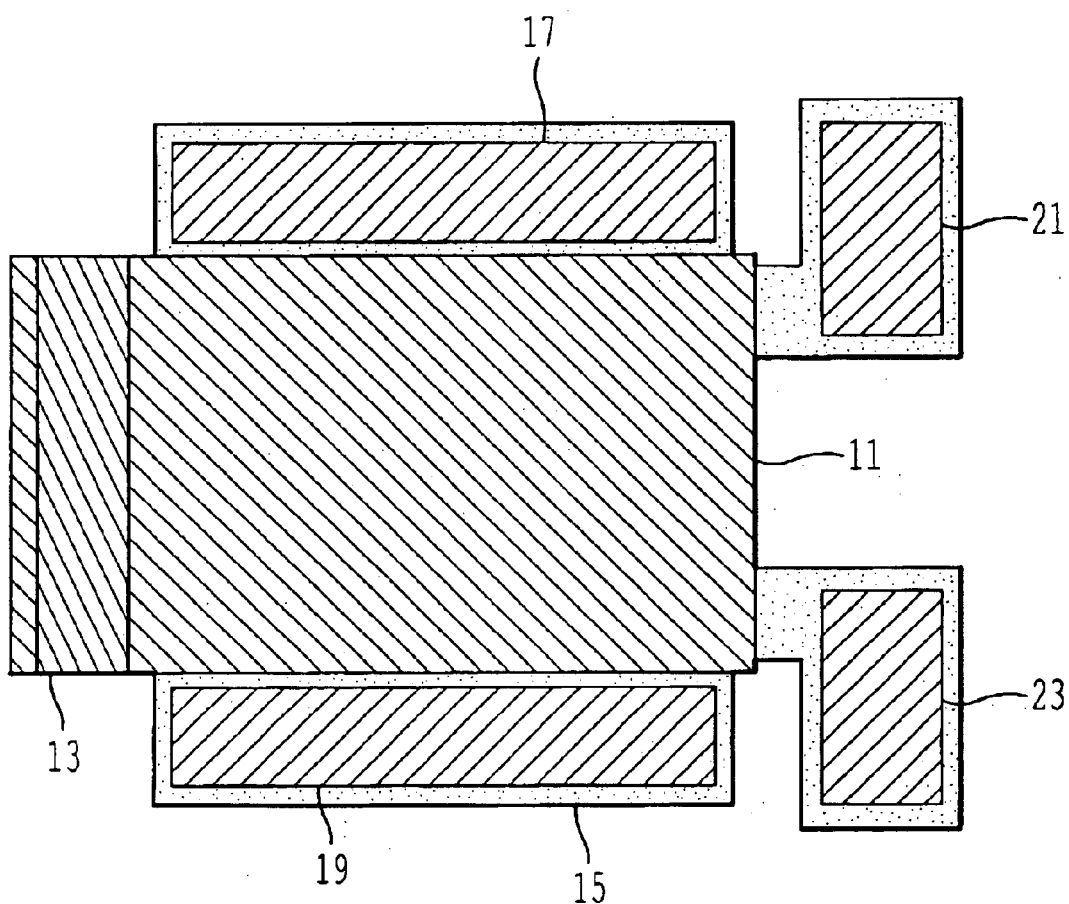
FIG. 2 shows a plan view of a device in accordance with an embodiment of the present invention.

When a transport characteristics of the two dimensional carrier gas is measured and where the electric field is applied via gates to the device, there are two preferred gate designs. FIG. 2 shows the preferred gate for the case when illumination leads to a decrease in the resistance (or an increase in the conductivity) of the two dimensional carrier gas. The active area of the device is defined by a small full gate 11. The gate is contacted by gate contact 13. To fabricate this device, the layers to produce the quantum dot layer and the active layer are grown in the way described later. The layers are then etched to form a mesa 15. The shape of the mesa is such that four-terminal resistance measurements can be made. Four ohmic contacts are shown in the figure, ohmic contacts 17 and 19 are the source and drain. Ohmic contacts 21 and 23 are voltage probes which allow a four-terminal measurement to be performed. Of course, it will be understood by a man skilled in the art that these two voltage probes 21 and 23 can be omitted to allow a two-terminal resistance or conductivity measurement. The gate 11 is then formed over the mesa 15. The overlap area of the gate 11 and the mesa 15 defines the active area of the device.

Figure 3:
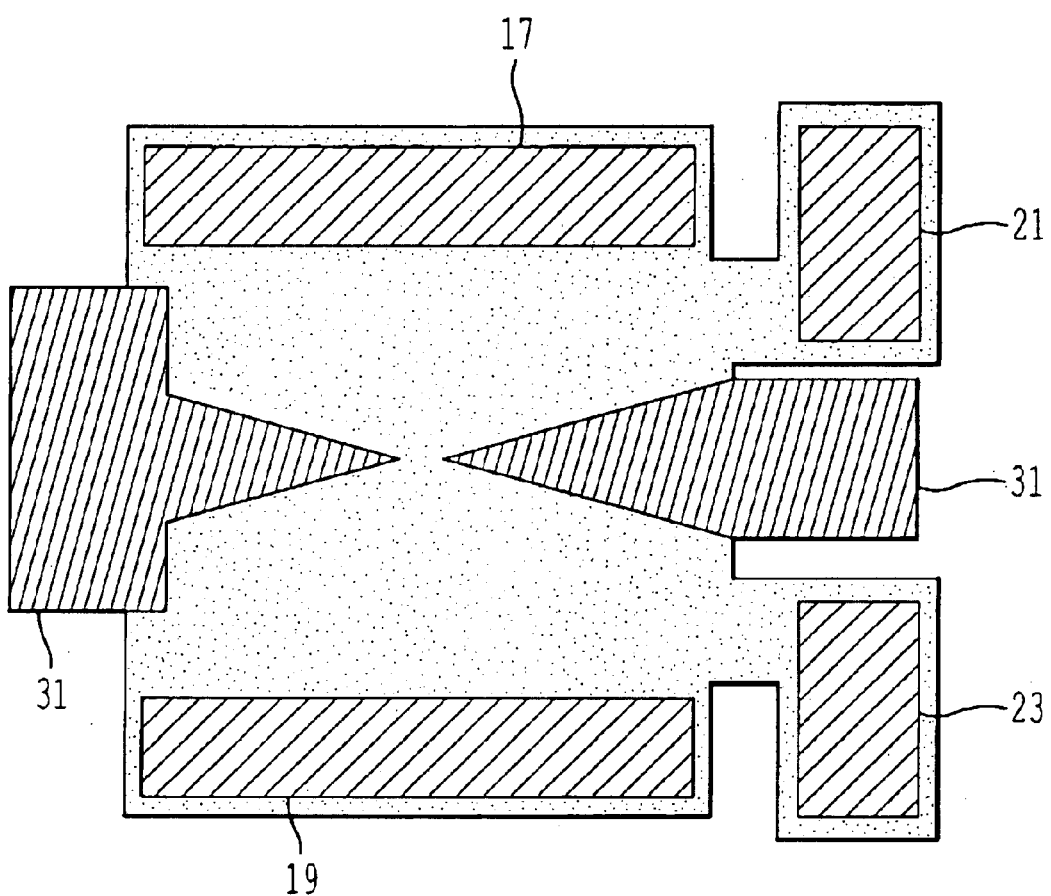
FIG. 3 shows a plan view of a device in accordance with another embodiment of the present invention.

FIG. 3 shows a plan view of the device structure which is preferably used when illumination of the structure leads to a increase in the resistance of the carrier gas (or decrease in the conductivity). In this situation, the gate shown is not a full gate. Instead, it is a split gate 31 is defined on the top surface of the structure. As explained for FIG. 2, a mesa 15 is formed by etching the dot layer and preferably the 2DEG layer. Source and drain contacts 17 and 19 are provided on either side of the mesa and voltage probes 21 and 23 are provided to allow four-terminal resistance measurements.

In FIG. 2, the active area is defined by the region of the device where the gate 11 overlapped with the mesa 15. This is not the case here. The active area of the device is a small conduction channel which is defined in the two dimensional carrier gas by the depleting split gates 31. For this device, the electric field which separates the photo-excited electrons and holes may also be supplied by biasing a back gate contact (not shown in FIG. 3) with respect to an Ohmic contact to the carrier gas, or by the internal field due to the back gate. The trapped photo-excited charge in the quantum dots may also be removed by applying a bias to the back gate.

It will be apparent to those skilled in the art that a narrow channel in carrier gas may also be defined in a number of other ways. For instance photolithography could be used to etch the carrier gas layer so as to define a narrow conduction channel. Alternatively a narrow channel may be defined by damaging regions of the carrier gas layer outside the channel by ion-bombardment.

Figure 4:
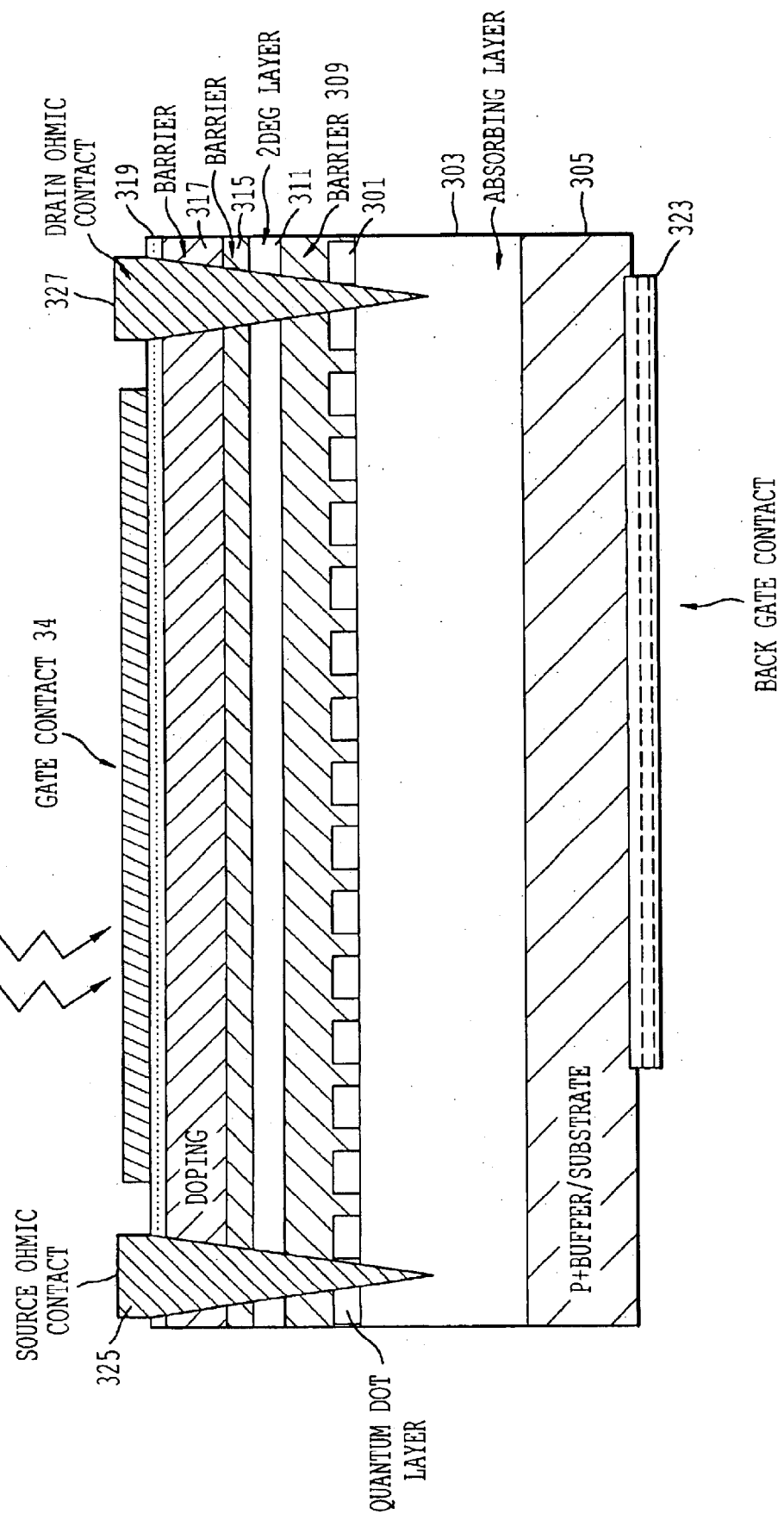
FIG. 4 shows a layer structure of a single photon detector in accordance with the present invention.

FIG. 4 shows an example of a semiconductor layer structure for a single photon detector. An absorbing barrier layer 303 is formed on an upper surface of a $P^+$ substrate 305. A layer of quantum dots 307 is then formed on an upper surface of the absorbing layer. A first barrier layer 309 is formed on an upper surface of the layer of dots 307. A layer capable of supporting a two dimensional electron gas 311 is formed on an upper surface of the barrier layer 309, an upper barrier layer 313 is then formed on the upper surface of the 2DEG layer 311. The upper barrier layer is a modulation doped barrier layer comprising an undoped barrier layer 315 formed overlaying the 2DEG barrier layer 311 and a doped barrier layer 317 formed overlaying the undoped barrier layer 315. A capping layer 319 overlies the structure. On top of the capped layer is formed a front-gate 321. This gate needs to be able to pass radiation of certain wavelengths. Typically, the gate is made from a thin layer of NiCr with a thickness of about 8 nm. The gate may also be provided by a doped semiconductor layer. A back gate contact 323 is then formed on the $p^+$ buffer/substrate layer 305. The $p^+$ back gate 305 and the front gate 321 serve as a means for applying the an electric field. A source ohmic contact 325 and a drain ohmic contact 327 are made to the 2DEG 311 in the conventional manner. The back gate 305 and front gate 321 may be biased with respect to an Ohmic contact 327 to the 2DEG.

Figure 5:
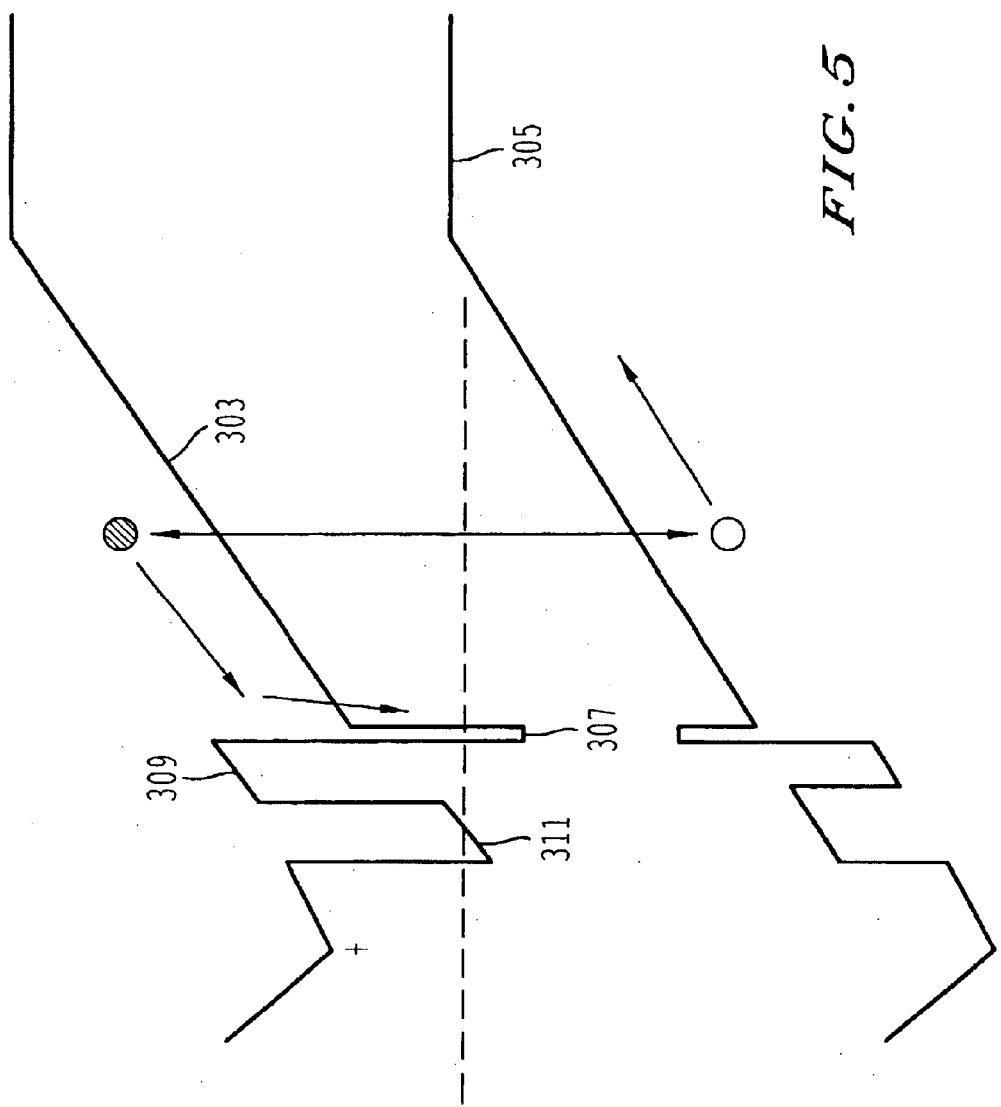
FIG. 5 shows a schematic band structure of the device of FIG. 4.

FIG. 5 shows the band structure of the device of FIG. 4. For clarity, the same reference numerals are used in FIGS. 4 and 5. The device can be illuminated from the front (i.e. through the gate 321) or from the back. When the device is illuminated from the back with light with a photon energy larger than the bandgap of the substrate, part of the substrate within an active window defined by lithography should be removed by etching. When the device is illuminated, an electron hole pair is photo-excited in the absorbing layer 303. Due to the electric field induced between the two gates, the electron is swept into the quantum dot 307 and the hole is swept towards the $p^+$ buffer/substrate 305. The electron will become trapped in the dot. For the band structure shown here, the trapped electron in the dot increases the resistivity of the 2DEG 311. It can either reduce the 2DEG density and/or the mobility. To monitor this increase in resistance due to single electrons, the structure is preferably provided with a split gate (as shown in FIG. 3).

If the device is used with a split gate, then the device requires a back-gate to modulate the field across the layers (i.e. the field to separate the photo-excited hole pairs) or the band structure of the device needs to be configured such that there is an internal electric field.

Figure 6:
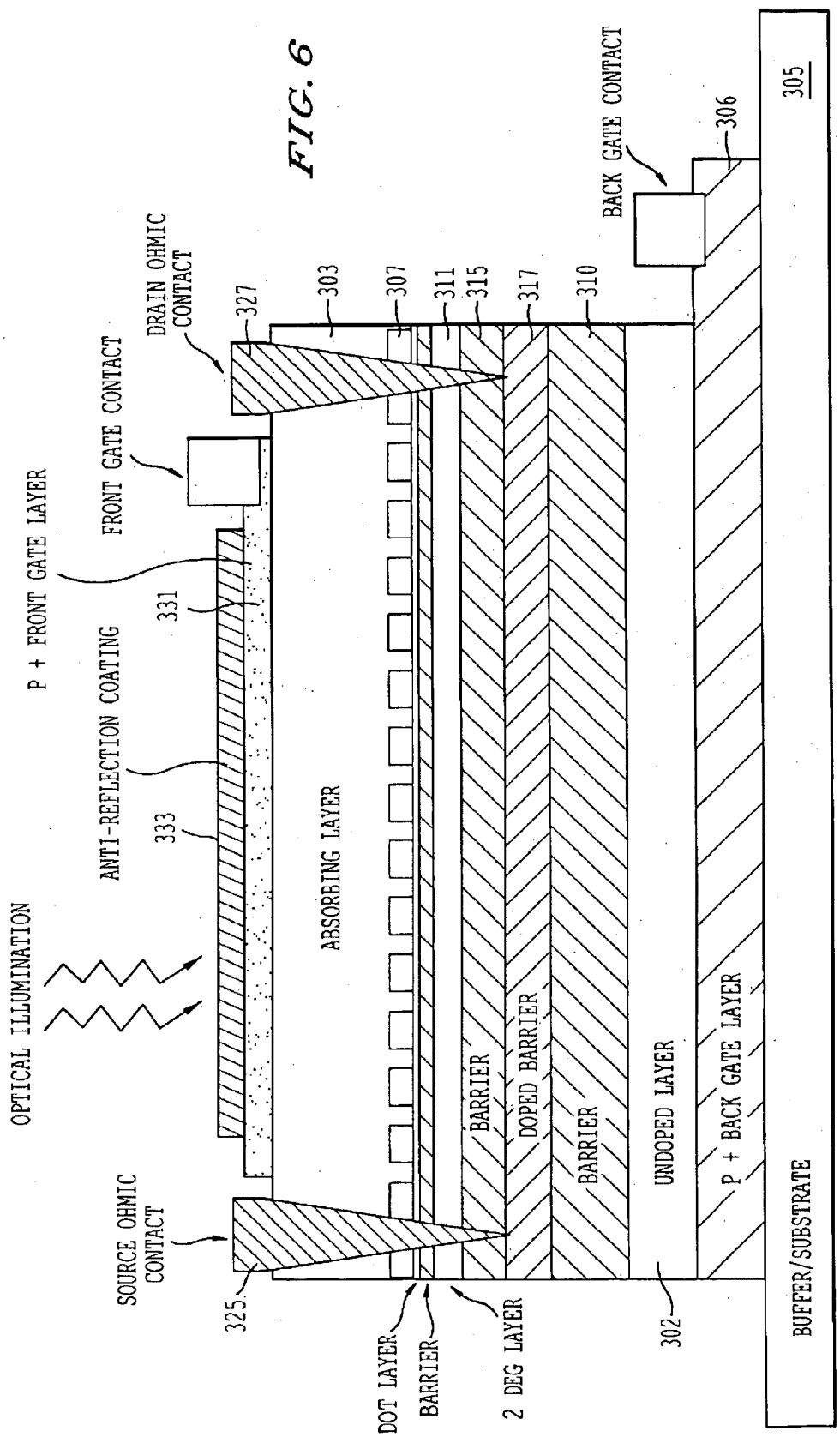
FIG. 6 shows a variation on the device of FIG. 4.

FIG. 6 shows the structure of FIG. 4 inverted. For clarity, the same reference numerals will be used as those for FIG. 4. A substrate forms the base of the device 305. A $p^+$ back gate layer is formed overlying the upper surface of the substrate 305. An undoped layer 308 is formed overlying the back-gate 306. An undoped barrier layer 310 is formed overlying the undoped layer 306. A modulation doped barrier layer 313 comprising a doped barrier layer 317 and a spacer layer 315 formed overlying the doped barrier layer is formed overlying the undoped barrier layer 310.

A 2DEG layer 311 is formed on an upper surface of the spacer layer 315. A first barrier layer 309 is formed overlying the 2DEG layer 311. A dot layer 307 is formed overlying the barrier layer 309. An absorbing layer 303 is then formed overlying the dot layer 307. Here, a $p^+$ front gate is provided 331. Overlying the $p^+$ front gate 331 is formed an anti-reflective coating 333. This anti-reflective coating can be formed on the illuminated surface of any of the devices discussed in this application.

As described with reference to FIG. 4, a source ohmic contact 325 and a drain ohmic contact 327 are made to the 2DEG layer 311. This device will work in the same way as FIG. 4 as described with reference to FIG. 5.

Figure 7:
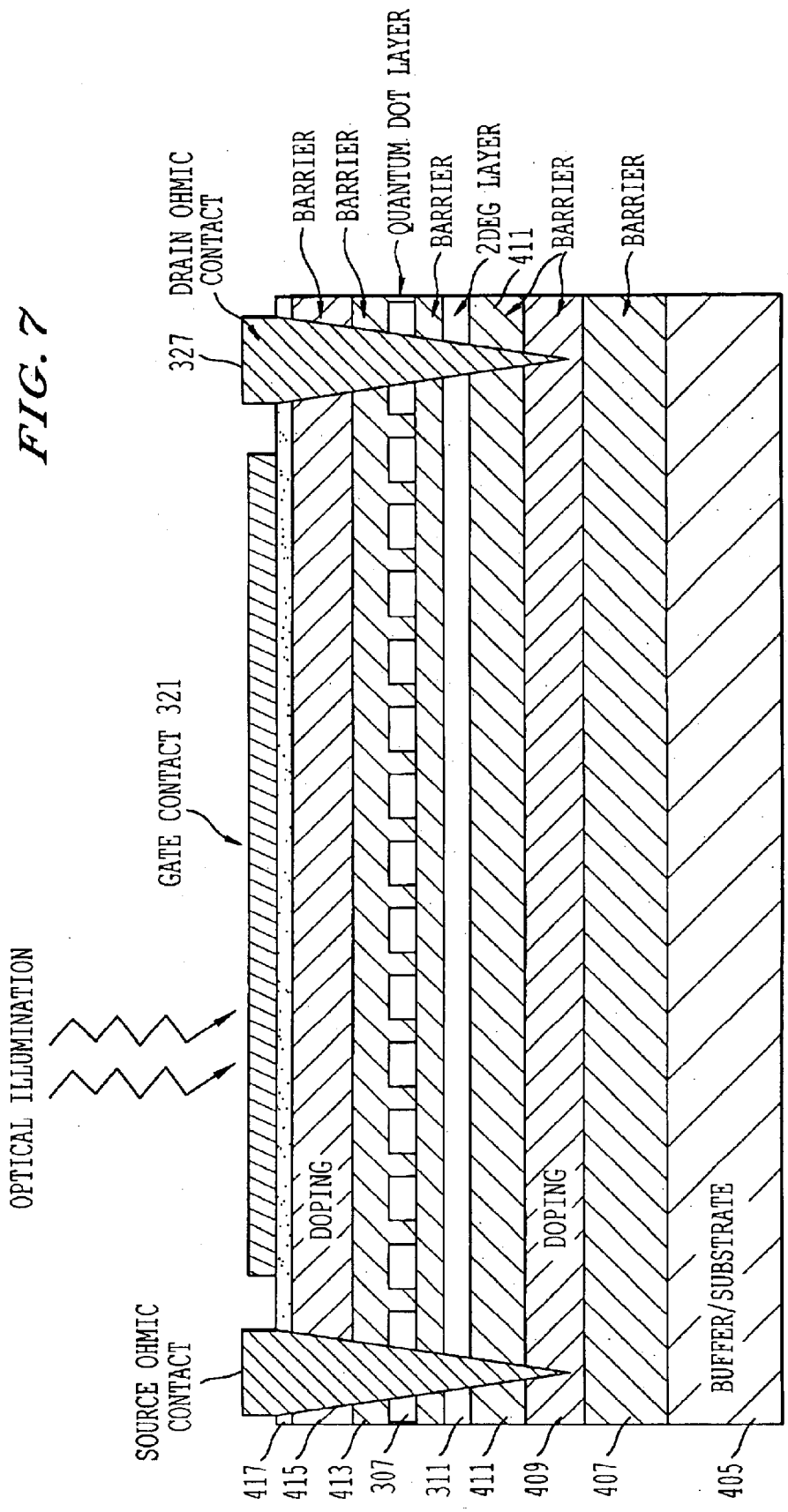
FIG. 7 shows yet another variation on the layer structure of FIG. 4.

FIG. 7 shows a variation on the structure of FIG. 4. Here, an undoped barrier layer 407 is provided overlaying a buffer/substrate 405. A modulation doped barrier layer comprising a doped barrier layer 409 and an undoped spacer layer 411 overlying the doped barrier layer 409 is provided overlying barrier layer 407. A 2DEG layer 311 is provided overlying the modulation doped barrier layer 411, 409. A first barrier layer 309 is provided overlying the 2DEG layer 311. A quantum dot layer 307 is provided overlying the first barrier layer 309. An undoped spacer barrier layer 413 is provided overlying the dot layer 307 and a doped barrier layer 415 is provided overlying the spacer layer 413. A capping layer 417 is provided overlaying the doped barrier layer 415. A gate contact 321 is provided overlying the capping layer 417. Source and drain ohmic contacts 325 and 327 are made to the 2DEG layer 311 in the same manner as with FIG. 4. This device does not have a back gate. The means for separating the photon-excited electron hole pairs will either be provided by the front gate 321 or by the internal field inherent in the device.

Figure 8A:
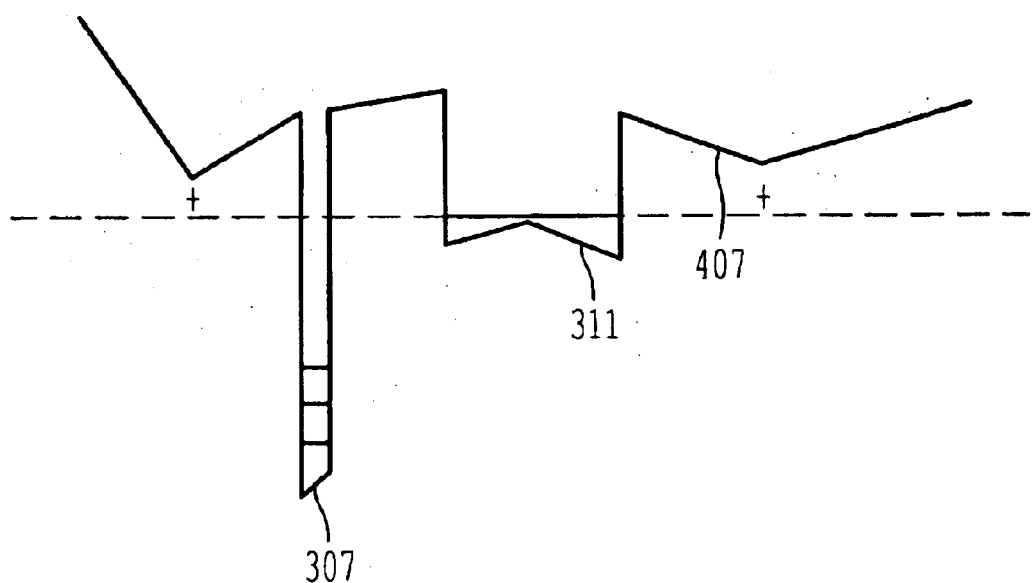
FIG. 8 shows a schematic band diagram of the device of FIG. 7.
Figure 8B:
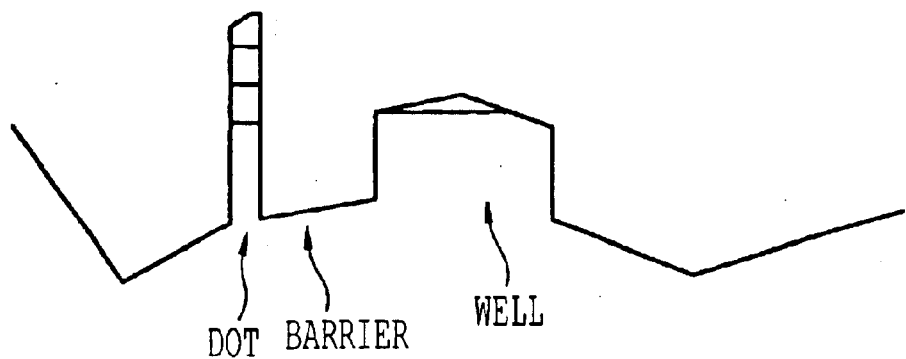

FIG. 8 shows a band structure of the device of FIG. 7. For easy comparison, the reference numerals have been kept the same. In the device with the biasing conditions shown in FIG. 8, excess electrons are trapped within the quantum dot 307. If the device is illuminated with radiation with a photon energy greater than that of the band gap of the quantum well 311, electron hole pairs are photo-excited in the quantum well 311. Photo-excited holes tunnel from the quantum well into the dots. These photo-excited holes recombine with the excess electrons already present in the dot 307 reducing the total number of trapped electrons in the dots. The lowering of the number of electrons in the dot 307 decreases the resistance of the 2DEG 311. Therefore, this device will ideally be used with the small full gate structure of FIG. 2.

It should also be noted that if the photon energy of the illuminating radiation is larger than the band gap of the barrier layers, photo-excited holes will be captured by the dots. These will also recombine with the excess electrons reducing the total number of electrons in the dots and decreasing the resistance of the 2DEG 311.

If the photon energy of the radiation is smaller than the bandgap of the quantum well 311, it will tend to photo-excite electrons trapped in the dot 307 into the surrounding barrier layers. The electric fields in the device will tend to sweep these liberated electrons away from the dot 307. The reduction in the negative charge in the dot causes a decrease in the resistance of the 2DEG 311.

Figure 9:
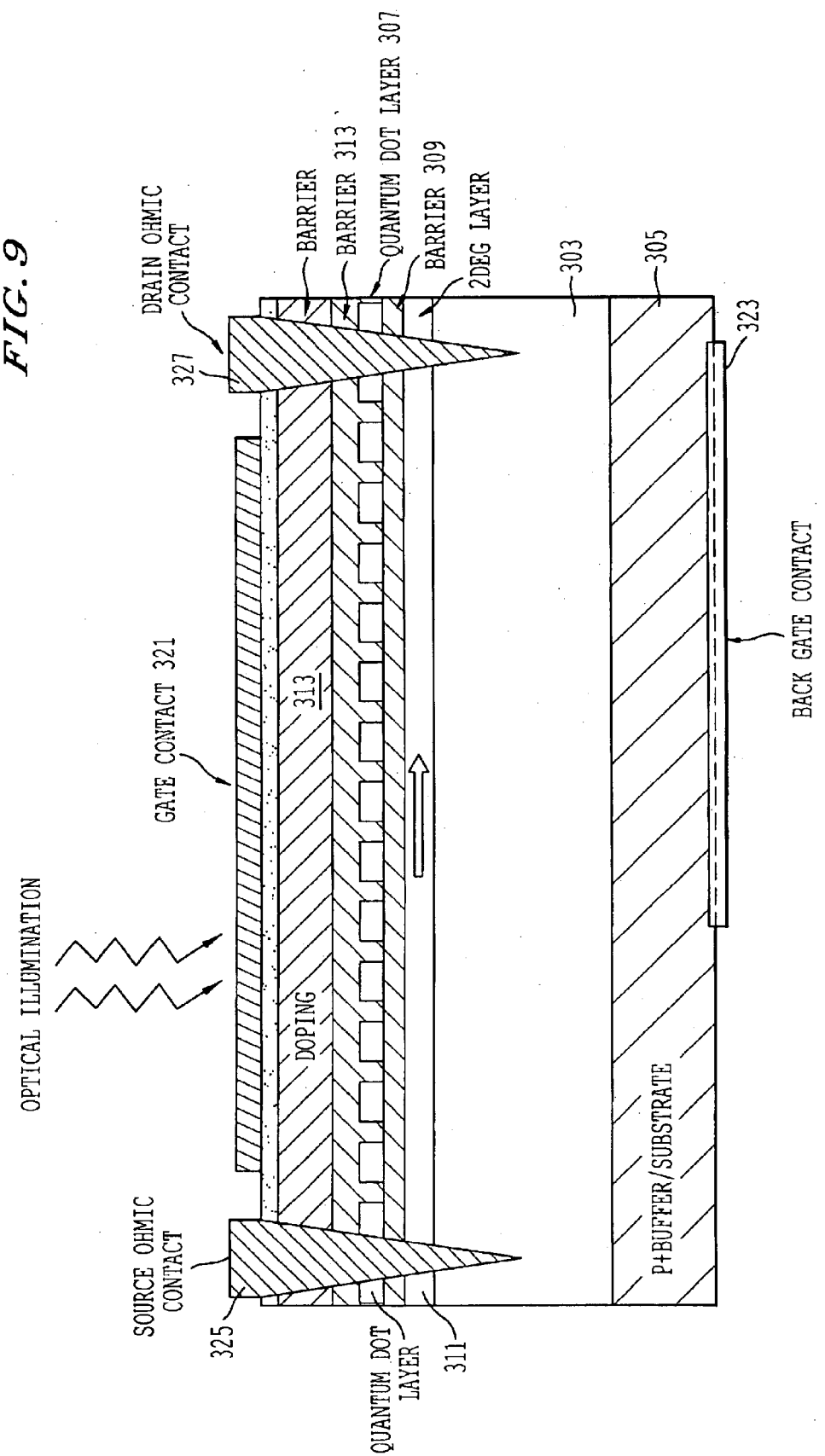
FIG. 9 shows another variation on the layer sure of the device of FIG. 4.

FIG. 9 shows a variation on the device of FIG. 4. For the sake of clarity, the same reference numerals will be used for FIG. 9 (and its accompanying band structure which is shown in FIG. 10). The relative positions of the 2DEG layer 311 and the quantum dot layer 307 have been interchanged so that the dot layer 307 is grown after the 2DEG layer 311. Hence, in order of growth, the layers follow the pattern of a 2DEG layer 311 being formed on the upper surface of the absorbing layer, a barrier layer 309 is formed on an upper surface of the 2DEG layer 311 and a dot layer 307, is formed on the upper surface of the barrier layer 309.

Figure 11:
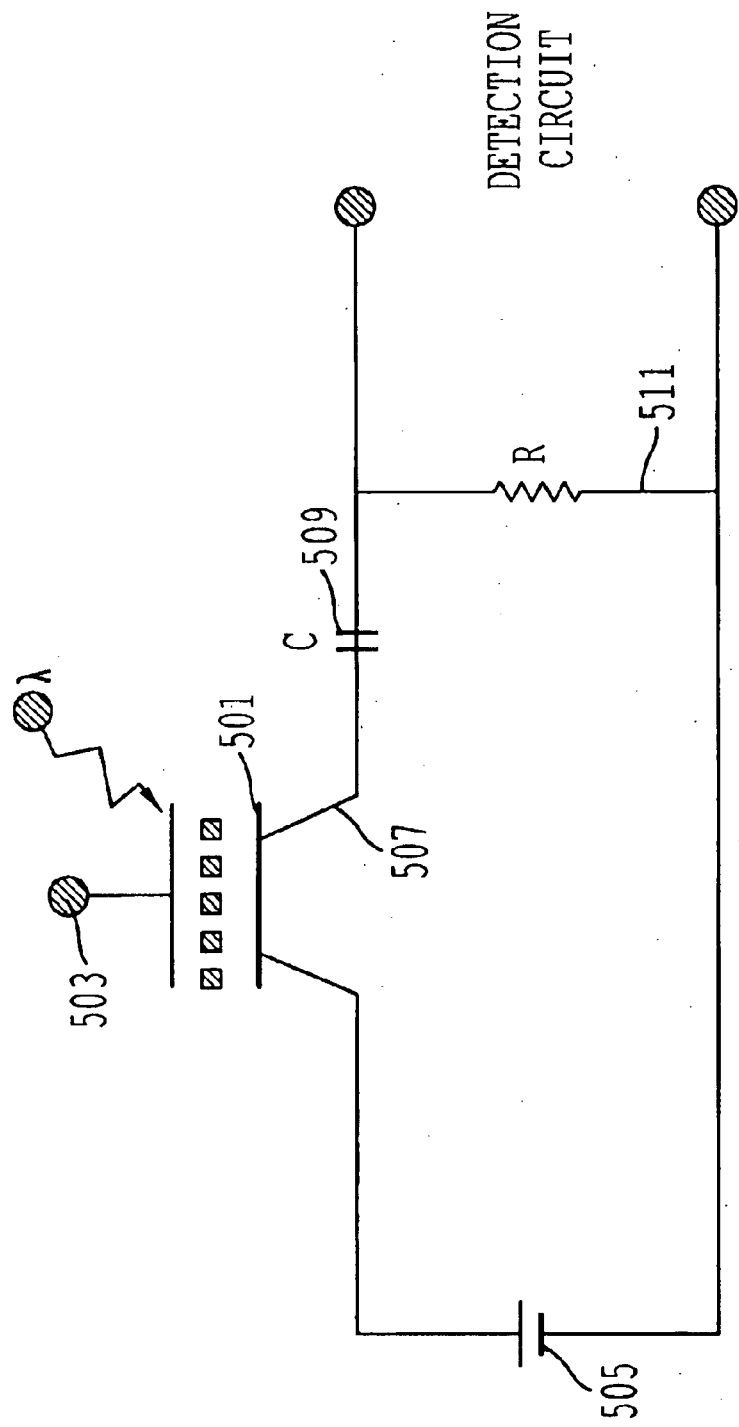
FIG. 11 shows a detection circuit incorporated in a device in accordance with an embodiment of the present invention.

FIG. 10 shows a schematic band structure of the device of FIG. 11. Again to aid easy comparison, the same reference numerals will be used as for FIG. 11. Again as in FIG. 10, the conduction band-edge of the 2DEG layer 311 and the quantum dot layer 307, both lie below the Fermi level and hence, they both have excess electrons.

The device of FIG. 9 can work in both ways. Electrons or holes can be trapped in the quantum dot 307. The absorbing layer increases the absorption and the quantum efficiency of the device. This device can either be used with the full gate of FIG. 2 or the split gate of FIG. 3 depending on whether the device is configured to increase or decrease the resistance of the 2DEG 311.

FIG. 11 shows a detection circuit using the detection device previously described. The detection device 501 is controlled by a control voltage applied to point 503 which is connected to the front gate of the device 501. The conductivity of the first active layer of the device is measured by passing a current from source 505 through the first active layer of device 501.

The measured potential will increase or decrease due to the detection of single photons.

The circuit shown is designed to detect this change in the resistance of the first active layer 501. The signal 507 from the first active layer is passed through a low pass filter arrangement comprising a capacitor 509 in series with the device 501 and a resistor 511 in parallel with the device 501.

The high pass filter arrangements acts as a differentiator. The output of the high pass filter arrangement is a plurality of spikes, each spike corresponding to a single photon. The output from the high pass filter unit is fed into a pulse counter to count the number of photons detected. The pulse counter (not shown) will be provided with a discriminator which will allow the pulse counter only to count peaks higher than a fixed level. This allows the counter to discriminate between spikes due to photons and noise.

Figure 12:
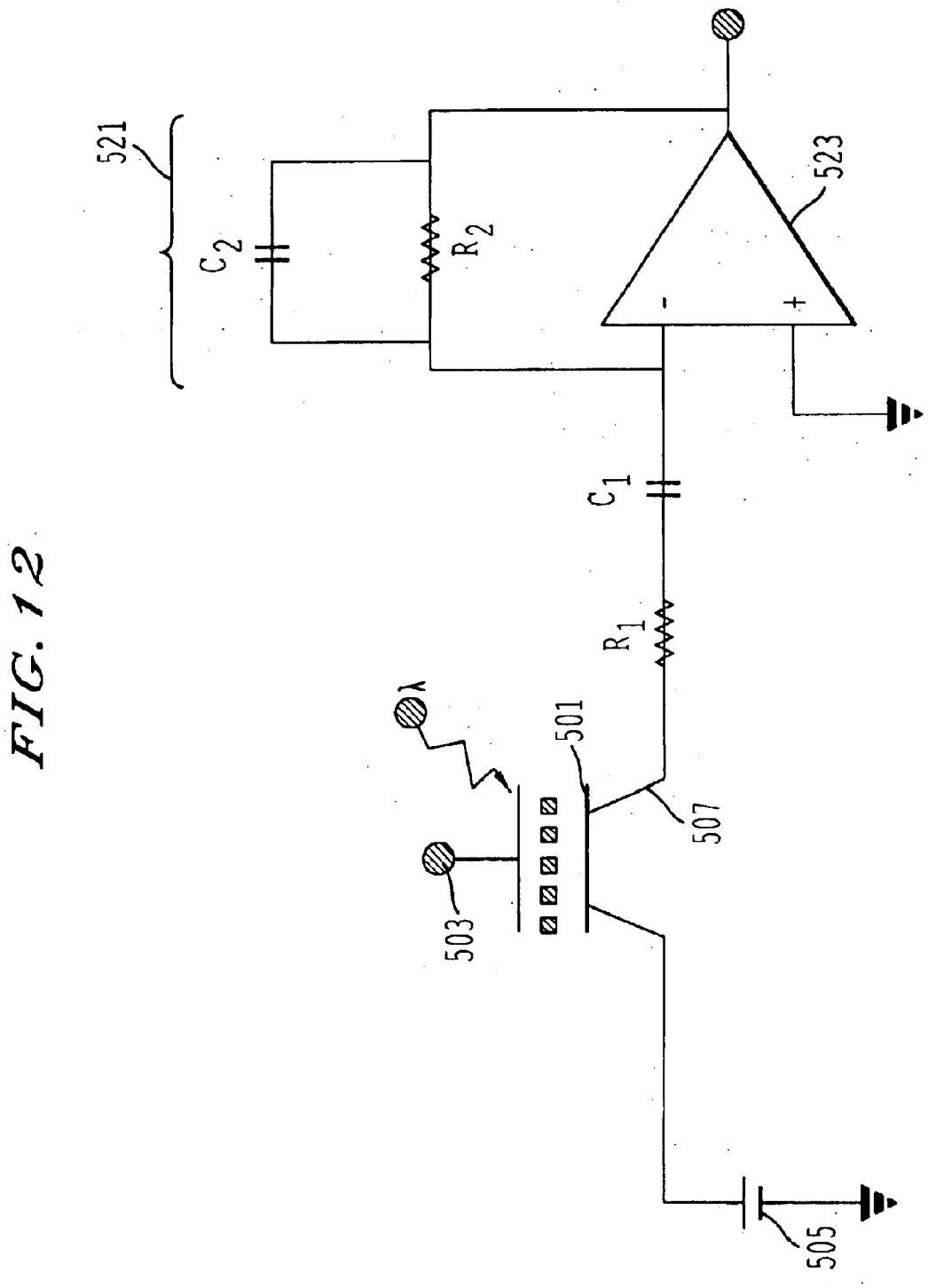
FIG. 12 shows a variation of the detection circuit of FIG. 11.

FIG. 12 shows a more sophisticated version of the detection circuit of FIG. 11. The signal derived from output 507 is passed into differentiating circuit 521. The differentiating circuit comprises an op amp 523 with a resistor R2 and a capacitor C2 connected in parallel with the op-amp 523. The capacitor C2 and the resistor R2 are also connected in parallel with one another. A resistor R1 and a capacitor C1 are connected in series with one another and between the inverting input of the op-amp and the device 501.

The basis differentiating circuit is provided by the opamp 523 and C1 and R2. Differentiators tend to be unstable at high frequencies, therefore, components R2 and C1 are provided to block high frequency components. Again, as for FIG. 11, the output of the differentiator is a series of pulses, each pulse being caused by a single photon. The output of the differentiator is read into a pulse counter.

Figure 13:
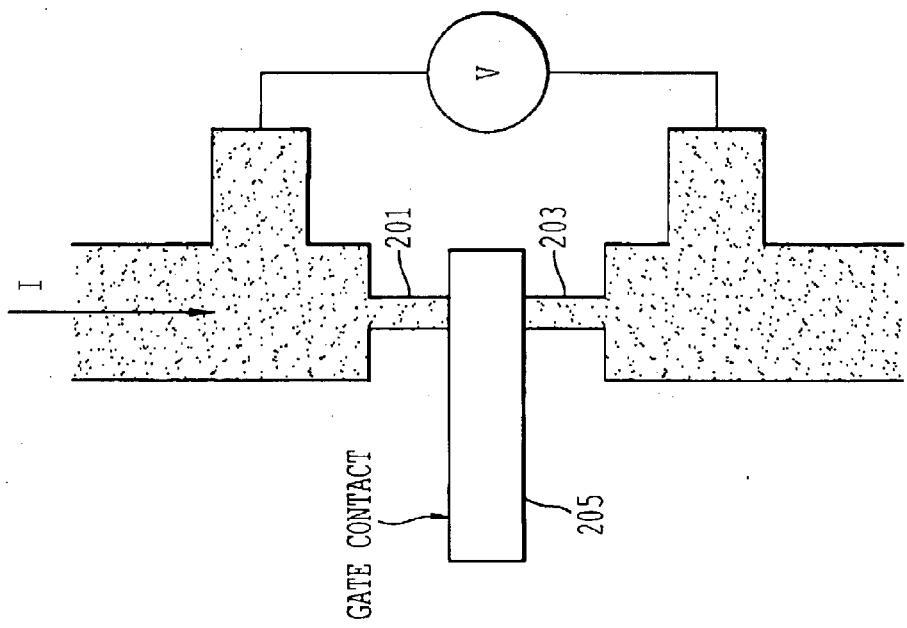
FIG. 13 shows a simplified plan view of the device in accordance with an embodiment of the present invention.

FIG. 13 shows the device of the present invention configured for single photon detection. In this specific geometry the mesa has been etched with a narrow central portion which has a width of 2 microns. NiAuGe Ohmic contacts (not shown) are annealed to the first active layer. A constant current I is allowed to flow between the source and drain contacts and the voltage between Ohmic contacts 201 and 203 to the first active layer is measured A gate contact layer 205 consisting of a 7 nm thick NiCr layer is defined intersecting the centre of the mesa. The width of the gate 205 is 8 microns, thus defining an active area of 2×8 microns, which will cover roughly 3000 quantum dots.

Figure 14:
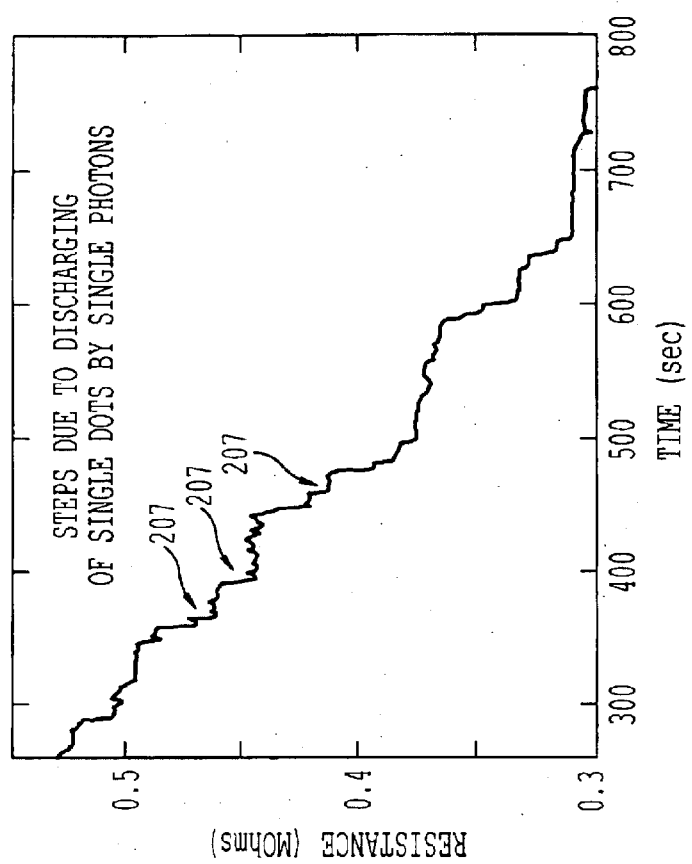
FIG. 14 shows results taken from the device of FIG. 13.

FIG. 14 shows results from the device of FIG. 13, the detection of single photons can be seen in the data. The source drain resistance of the first active layer (measured between points 201 and 203 in FIG. 13). As the device is illuminated, the resistance is seen to drop as the sample is illuminated During the course of this experiment, the sample was under constant illumination The resistance of the first active layer drops due to electrons tunnelling from the second active layer into the first active layer. A single electron tunnels when it is excited by a photon. The steps 207 indicated on the data show the effects of discharging by a single dot due to a single photon. This figure proves the single photon detection.

The actual layer structure of the device from which the results in FIG. 14 were taken is listed in the table. The layers are listed in order of growth by MBE on a (100) oriented GaAs substrate.

| Material | thickness (nm) | doping | substrate temp |
|---|---|---|---|
| GaAs | 500 | undoped | 590° C. |
| Al0.33Ga0.67As | 250 | undoped | 590 |
| Al0.33Ga0.67As | 40 | Si 1018 cm−3 | 490 |
| Al0.33Ga0.67As | 15 | undoped | 490 |
| Al0.33Ga0.67As | 25 | undoped | 590 |
| GaAs | 20 | undoped | 590 |
| Al0.33Ga0.67As | 10 | undoped | 590 |
| GaAs | 2 | undoped | 590 |
| InAs | 1.7 monolayers | undoped | 520 |
| Al0.33Ga0.67As | 10 | undoped | 520 |
| Al0.33Ga0.67As | 30 | undoped | 590 |
| Al0.33Ga0.67As | 40 | Si $10^{18}$ cm$^{-3}$ | 590 |
| GaAs | 10 | undoped | 590 |

The substrate temperature is lowered during the growth of the InAs layer to facilitate the formation of quantum dots via the Stranskii-Krastinow growth mode. The substrate temperature must be 530° C. or less so that Indium does not segregate above the growth surface. For this structure 1.7 monolayers of InAs were deposited. However, a higher dot density can be achieved by depositing slightly more Indium (1.7–3 monolayers). This would be advantageous for increasing the storage capacity of the memory. It is preferable for the layer grown immediately after the quantum dots is also grown at a lower temperature (520° C.) to prevent Indium segregation destroying the dots. The growth temperature can be raised again after 10 nm of growth. The 2 nm of G grown before the InAs layer were deposited in order to smooth the growth sure. The lower Si doped layer and its overlayer were also grown at a lower substrate temperature to prevent the Si impurities segregating and thus being incorporated into subsequently grown layers.

The wafer was etched into a mesa using standard photolithographic techniques. NiAuGe Ohmic contacts to the electron gas were deposited and annealed. In addition to the source and drain contacts at the ends of the mesa. A semitransparent NiCr layer (7 nm thick) was evaporated over a central portion of the mesa to act a Schottky front contact.

FIG. 15 shows typical layer structures which may be used to fabricate a photon detector in accordance with an embodiment of the present invention. There are many methods for producing quantum dots. For example, they can be produced by photolithographic techniques, electron lithography methods, etc. A preferable method is to use the Stranski-Krastanow growth mode. When a first layer is grown on top of a substrate which has a different lattice constant from the first layer, the first layer proceeds by island growth. In other words, 3D islands arc formed over the top of the substrate, which when capped with a barrier material produce a plurality of quantum dots. In FIG. 15a, a doped barrier layer 41 of AlGaAs is formed on a substrate or buffer layer 43. An undoped spacer layer is then formed on an upper surface of the doped barrier 41. This undoped spacer layer 45 and the doped barrier layer 41 together form a modulation doped barrier layer. A 2DEG layer 47 of GaAs is formed overlying the undoped spacer layer 45. An undoped AlGaAs layer 49 is formed overlying the GaAs 2DEG layer 47. A doped layer 51 is then epitaxially growth on an upper surface of the barrier layer 49. This layer is InAlAs which has a substantially different lattice constant from AlGaAs. Thus, a plurality of quantum dots are formed. The structure is then finished with a barrier layer of AlGaAs 53.

Figure 15A:
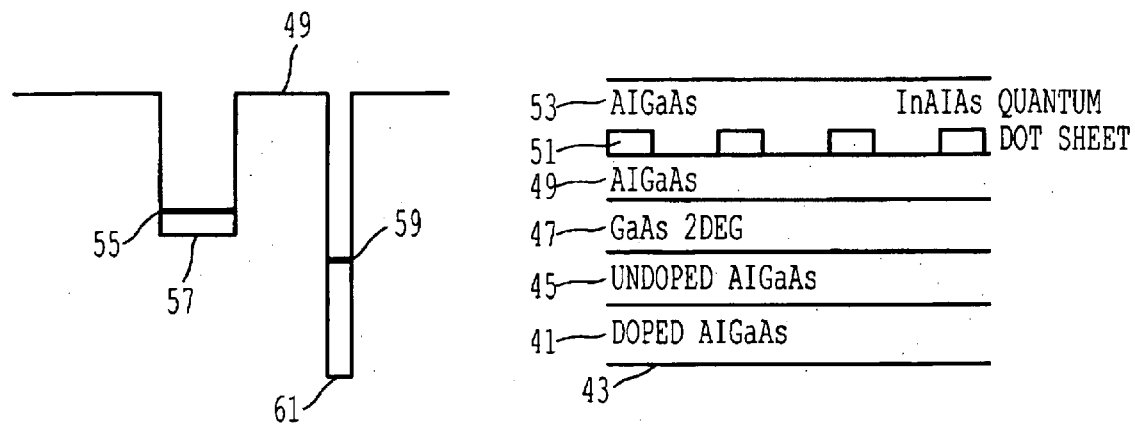
FIG. 15 shows possible layer structures of fabricating the single photon detector according to an embodiment of the present invention.

A schematic band structure for FIG. 15a is shown on the right of the diagram, carriers can tunnel from the 2DEG layer 51 through the tunnel barrier 49, to the 2DEG layer 47 and vice versa.

Figure 15B:
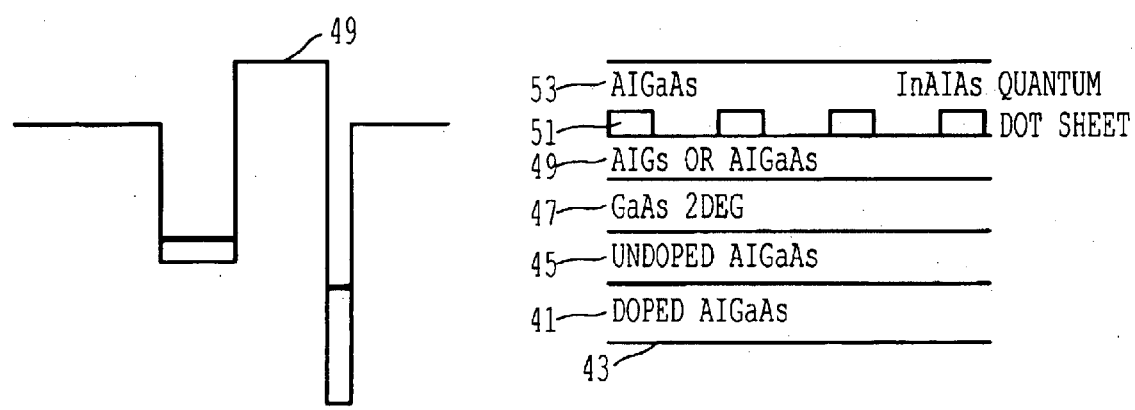

FIG. 15b shows a similar structure to that of FIG. 15a. For comparison, the layers are numbered as FIG. 15a. Here, an AlAs (or AlGaAs) tunnel barrier layer 49 is present between the dot layer 51 and the 2DEG layer 47. The schematic band structure shows that the tunnel barrier 49 is higher in this case than the structure in FIG. 15a. The AlGaAs tunnel barrier layer 49 has a different Al content to layer 49 in FIG. 15a or layer 41 and 53 in FIG. 15b.

Figure 15C:
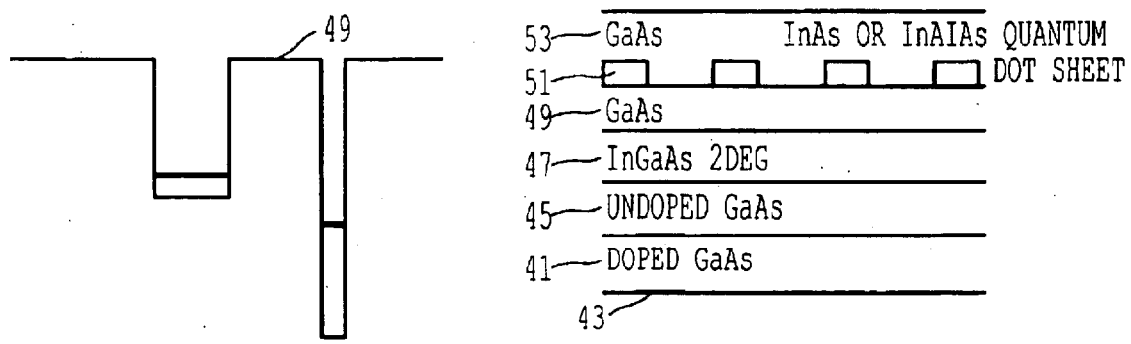

FIG. 15c shows a variation on the structure of 15a. The barrier layers 41, 49 and 53 and the space layer 45 are GaAs and the 2DEG layer 47 is InGaAs. The dot layer 51 is formed from either InAlAs or InAs.

Figure 15D:
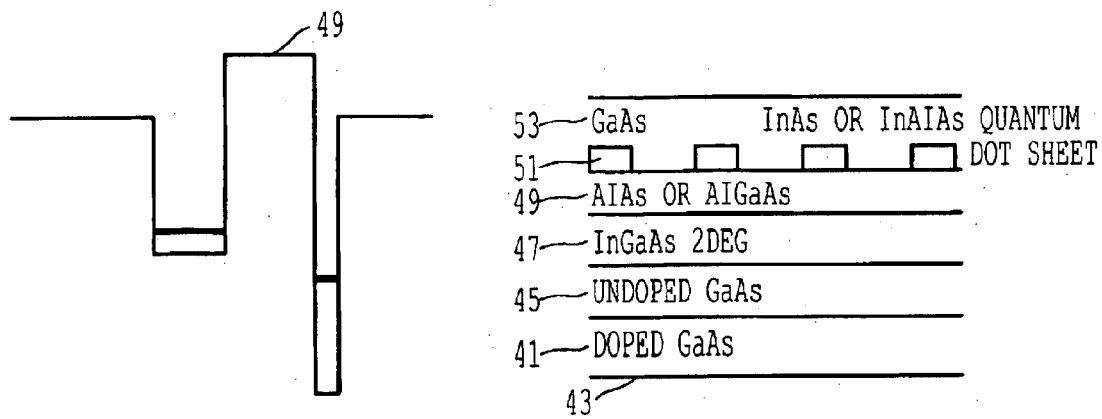

FIG. 15d shows a slight modification of the structure in FIG. 15c. Here, the tunnel barrier 49 is either AlAs or AlGaAs. This provides a larger tunnel barrier 49 as can be seen by comparing the band structures of FIG. 15c and 15d.

FIG. 15e again shows a slight modification on the structure as shown in FIG. 15c. Here, the doped barrier layer 41 and undoped spacer layer 45 are both AlGaAs. These layers have a larger band gap than GaAs. Therefore, it can be seen in the band structure of FIG. 15e that the conduction band edge is higher for these layers.

Figure 15E:
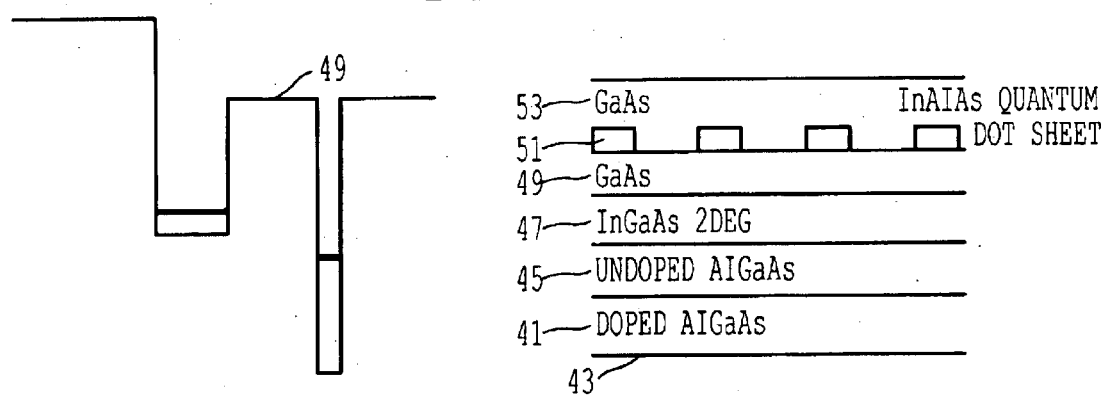
Figure 15F:
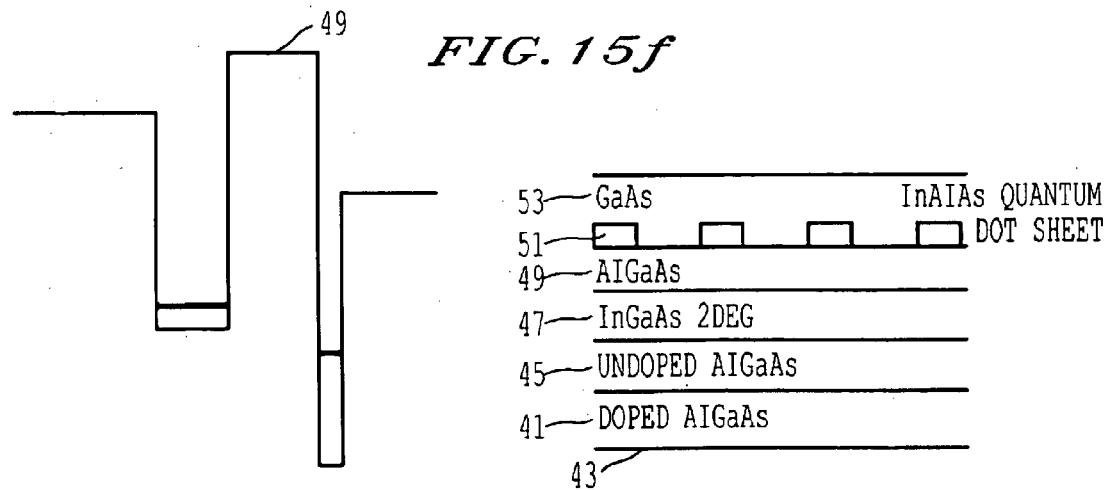

FIG. 15f shows a further modification on the structure shown in FIG. 15e. Here, the tunnel barrier 49 is also AlGaAs. The band structure shows a larger tunnel barrier 49 than that shown for the structure of FIG. 15e.

Also, the structure can be made using an Si/SiO$_2$ based system. Silicon provides an attractive material system for fabrication of the single photon detector because it is a relatively mature technology and cheap.

Figure 16A:
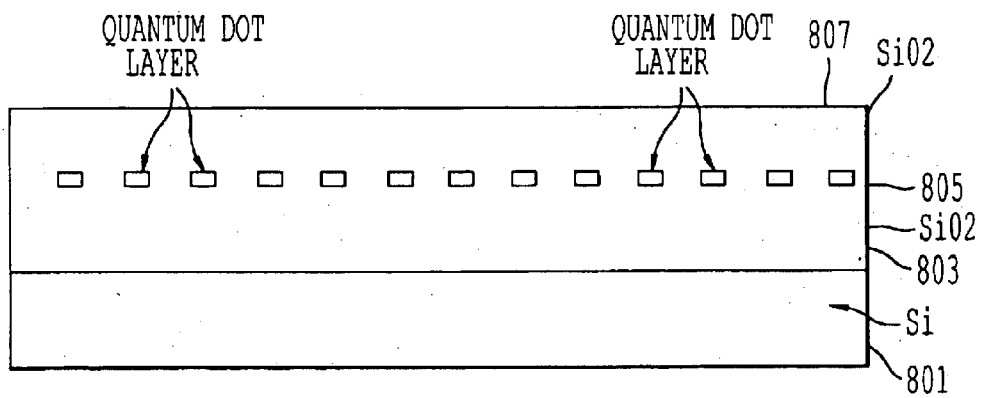
FIGS. 16A and 16B show a device in accordance with an embodiment of the invention fabricated from Silicon.

An example of such a structure is shown in FIG. 16. First a thermal oxide 803 is formed on the Si wafer 801 using well know techniques. Next an amorphous layer of Si 805 is deposited on the oxide using UHV-CVD for instance. Silicon quantum dots are formed from this layer by annealing the sample at 800° C. under high vacuum conditions. Alternatively other semiconductor materials, for example Germanium, can be used to form the quantum dot layer in a similar manner. After this a further SiO$_2$ 807 is deposited on top of the quantum dots.

Figure 16B:
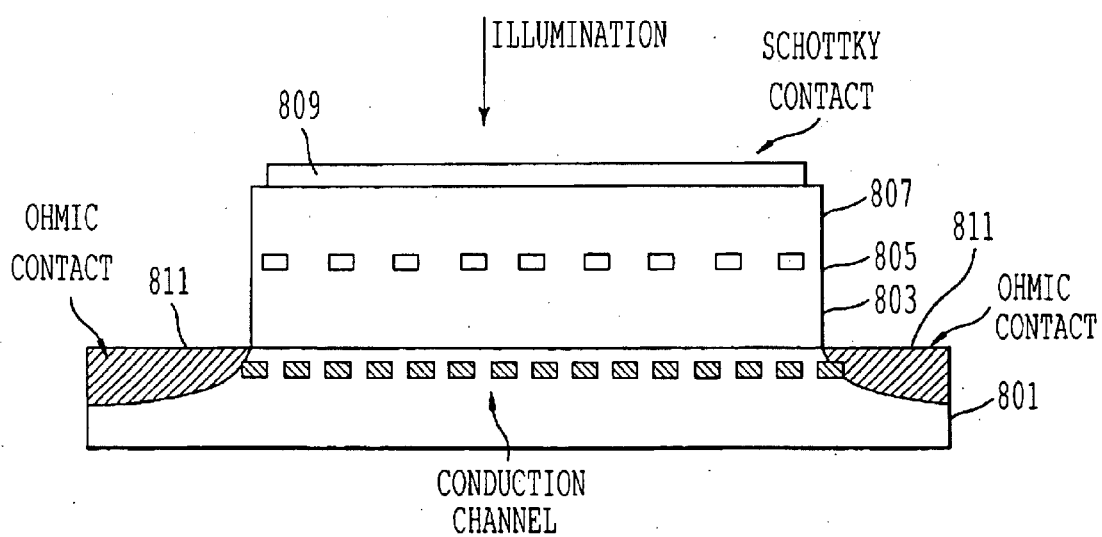

The wafer is processed into field effect transistor structures as shown in FIG. 16B. First a semitanspant gate metal 809 is defined on a region of the top surface using well known lithographic techniques. The SiO$_2$ in areas outside of this gate layer 809 are etched so as to expose the Si wafer beneath. N-type ohmic contacts 811 are formed to the exposed Si region on either side of the gate/oxide region.

FIGS. 17 to 29 are primarily intended to describe a memory structure. The reference numerals in FIGS. 17 to 29 will be defined below. No significance should be attached to the act that some reference numerals are repeated from FIGS. 1 to 16.

FIG. 17 shows an outline structure of a selectively addressable optical memory structure. A first active layer which is a 2DEG layer 3 is provided overlying a substrate or buffer layer 1. A barrier layer 5 is provided overlying the 2DEG layer 3. The barrier layer 5 has a larger band gap than the 2DEG layer 3. A second active layer comprising a plurality of quantum dots 7 overlies the barrier layer 5. An upper undoped barrier layer 8, is provided overlying the quantum dot layer 7. For simplicity, front and back gates or other means of applying an electric field across the device are not shown in this diagram. Two ohmic contacts 9 and 11 are provided to the 2DEG layer 3. A current I can be measured between the two ohmic contacts.

For a "write" operation, a laser beam 13 is scanned across the sample. The laser beam 13 has an energy close to the quantum dot band gap, i.e. it is capable of exciting an electron-hole pair in a predetermined dot. If the laser beam illuminates such a dot, an electron 10 tunnels tom the dot layer 7 through the tunnel barrier 5 to the 2DEG layer 3. This causes a change in the conductivity of the 2DEG.

The laser can be focused on an area of the device so as to excite all the dots in that area. Alternatively, the wavelength of the laser can be used to write to different dots within the laser spot size. The enlarged portion of FIG. 1 shows part of the layer of dots 7 in detail. The dots are inhomogeneously broadened at each position. Thus, the plurality of dots comprise dots with different transitions energies. Dots with different transition energies can be individually addressed by changing the laser wavelength.

FIG. 18 shows a graph of the absorption of the dot layer against laser wavelength. The dots have a plurality of different transition energies.

A possible mechanism to explain the operation of the device will be described with reference to the band structure in FIG. 19. A field is applied across the device such that, in the write operation, the conduction band edge 21 of the 2DEG 23 lies below the first conduction band confined energy state 25 of the quantum dot 27. Also, the conduction band edge 29 of the 2DEG 23 lies below the first confined conduction band state 31 of the quantum dot 27. Upon illumination, an electron hole pair is excited in the quantum dot 27. The electron transfers to the quantum well at first excited energy state 25 and the hole is trapped in the first confined valence band state 31. The electron trapped in the first confined energy state 25 tunnels through the barrier 33 into the 2DEG 23. The hole in the first confined valence band state of 31 is trapped here as it is not energetically viable for it to transfer to the 2DEG 23.

The "read" operation is shown in FIG. 20. The biasing of the structure remains the same as for FIG. 19. Here, the device is illuminated but an electron/hole pair cannot be separated as there is no free energy level to accommodate the electron hole pair. Therefore, an electron is not transferred to the 2DEG 23 and no change in the conductivity of the quantum well is observed by illuminating a dot which already contains holes.

Figure 21:
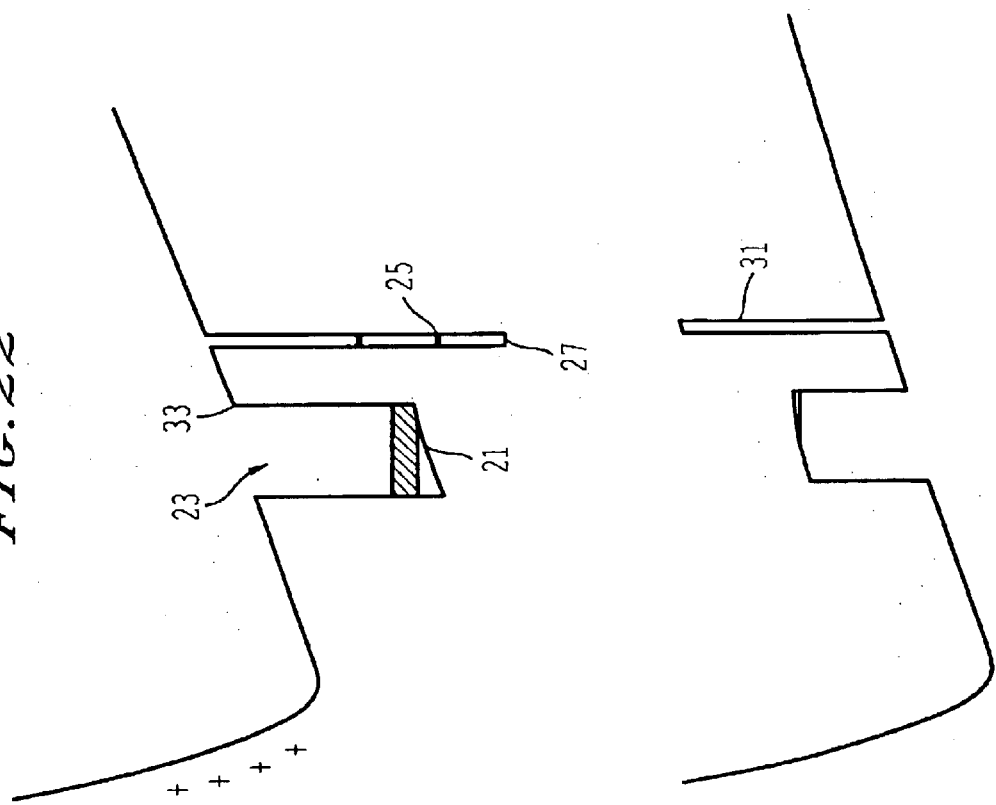
FIG. 21 shows a band structure of the device of FIG. 17, with the conduction band edge of the 2DEG below the first conduction band level of the quantum dot.
Figure 22:
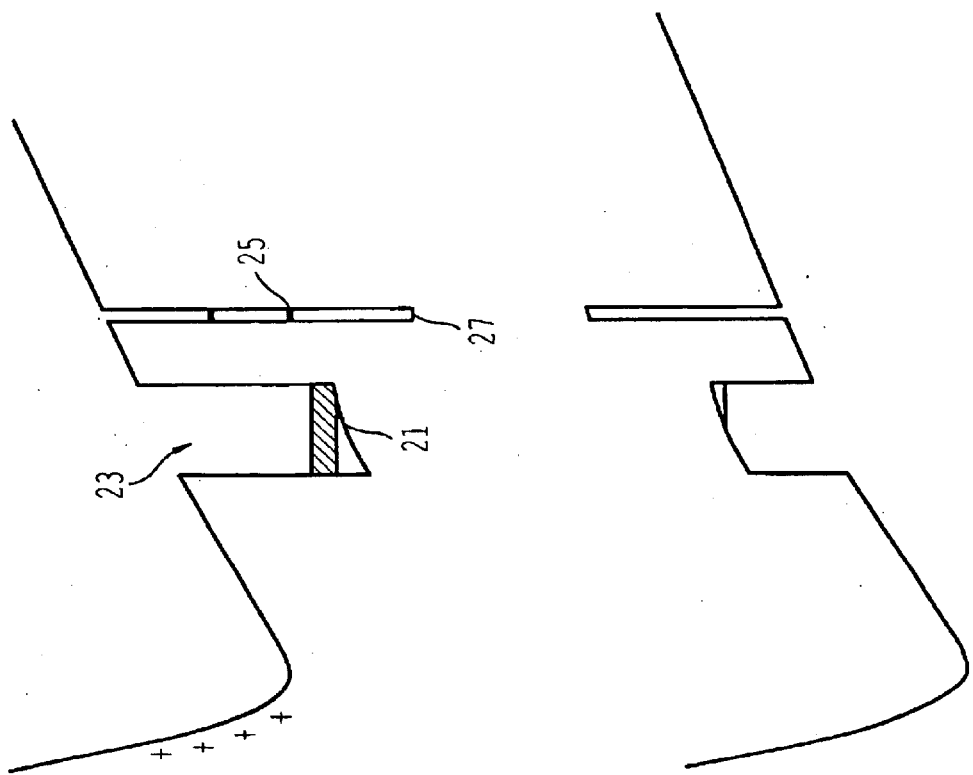
FIG. 22 shows a band diagram of the device of FIG. 17, where the conduction band edge of the 2DEG is located higher than the first confined conduction band level of the quantum dot.

FIG. 21 and 22 shows how the excess charges in the quantum dot can be erased. In FIG. 21, the conduction band edge 21 of the 2DEG 23 is at a lower energy than the first confined conduction band level of the quantum dot 27. Therefore, electrons trapped in the first confined conduction band level 25 tunnel to the energetically more favourable 2DEG.

FIG. 22 shows the situation where the field normal to the active layers is adjusted so that confined level 25 of the quantum dot 27 is below the conduction band edge of the 2DEG 23. This results in electrons from the 2DEG 23 tunnelling through the tunnel barrier 33 into the vacant state 25. A dot located in the first confined valance band level 31 can then recombine with the electron in level 25. Once the holes trapped in level 31 have combined with electrons, the biasing can be returned to the levels shown in FIG. 21 so that the excess electrons tunnel through barrier 33 back into the 2DEG 23.

The possible device operation described in relation to FIGS. 19 to 22 has assumed that an undoped barrier layer overlies the dot layer 27. If barrier layer is doped, the observed external operation of the device is similar to that described above, i.e. a change in the conductivity of the 2DEG 23 is observed in response to a write operation. The applicant does not wish to be bound by a particular theory or explanation. However, it is believed that if an n-doped barrier layer is provided overlying the quantum dots 27, the quantum dots are populated with electrons prior to illumination. These occupied dots 27 act as scattering centres for transport in the 2DEG 23. When the dots 27 are illuminated, the number of excess electrons in the quantum dots 27 are reduced and the number of electrons in the 2DEG 23 is increased. The increase in the carrier concentration of the 2DEG 23 causes the conductivity of the 2DEG 23 to increase. Also, the decrease in the negative change of the dots 27 results in an increase in the conductivity of the 2DEG 23.

The structure can be fabricated using the same layers as described with reference to FIGS. 15 and 16, which were described with reference to the photon detector.

FIG. 23 a variation on the device. Here, the field normal to the active layers is modulated by a front-gate and a back-gate. Essentially, the structure is a field effect transistor. A p$^+$ back-gate 77 is formed on an upper surface of a buffer layer or substrate 71. An undoped barrier layer 75 is formed overlying an upper surface of the back-gate 73. A modulation doped barrier layer 77 is formed overlying an upper surface of the undoped barrier layer 75. The modulation doped barrier layer has a doped barrier layer 79 and an undoped spacer layer 81. A quantum well layer is formed on the upper surface of the spacer layer 81. A tunnel barrier layer 85 is then formed on the upper surface of the quantum well layer 83. The dot layer 87 is then formed on an upper surface of the tunnel barrier layer 85. A capping layer 89 is then formed overlying the dot layer. Then an n$^+$ front-gate 91 is formed on the upper surface of the capping layer 89.

Two ohmic contacts 93 and 95 which form a source and drain respectively are made to both the quantum well layer 83 and the dot layer 87. A back-gate contact 97 is made to the back-gate 73 and a front-gate contact 99 is made to the front-gate 91. A bias can be applied between the front-gate 91 and the back-gate 73 so as to modulate the electric field normal to the quantum well layer 83 and the dot layer 87.

FIG. 24 shows the band structure of the device of FIG. 23. For simplicity, the layers in the band structure have retained the same reference numerals as for FIG. 8. For the bias condition shown, the conduction band edge 101 of the quantum well layer 83 lies below that of the first excited state 103 of the quantum well layer 87 and the Fermi level of the system (E$_f$). Therefore, electrons in the quantum well form a 2DEG.

Decreasing the voltage on the front-gate 91 causes the potential separation 105 to decrease. This pulls down the conduction band edge and hence, under appropriate biasing conditions, the first excited energy level 103 of the quantum dot 87 can be pulled below the conduction band edge 101 of the quantum well level 83 Similarly, decreasing the back-gate energy separation 107 can have a similar effect.

Increasing the back-gate energy separation (and/or decreasing the front-gate energy separation 105) causes the separation between the conduction band edge 101 of the quantum well level and the first confined energy state 103 of the quantum dot layer to increase.

Looking at the valence band edge 109, the first confined valence band state 111 lies above the valence band level in the quantum well. Therefore, it is not energetically favourable for the hole trapped in the valence band state 111 to transfer to the quantum well layer.

The type of device shown in FIG. 23 can also operate as a high speed MODFET. The source and drain ohmic contacts are connected to both the first and second active layers. Carriers stored in the second active layer 85 contribute relatively little to the source-drain current. Therefore, the resistance of the device can be modulated by transferring carriers between the first 81 and second 85 active layers. This can be done by applying appropriate biases to the front and back gates 73, 91.

In the optical memory device the tunnel barrier 83 needs to allow tunnelling from the second active layer 85 to the first active layer 81 as the device is illuminated. However, the barrier needs to be large enough to prevent tunnelling back from the first active layer 81 to the second active layer 85 during the charge storage operation. In the MODFET device, the switching speed is determined by the time it takes the carriers to tunnel between the first and second 81, 85 active layers. This can be improved if the layers are strongly coupled. Therefore, although the device of FIG. 23 can be used for both devices, in practice a larger tunnel barrier will be used for the optical memory device.

Figure 25:
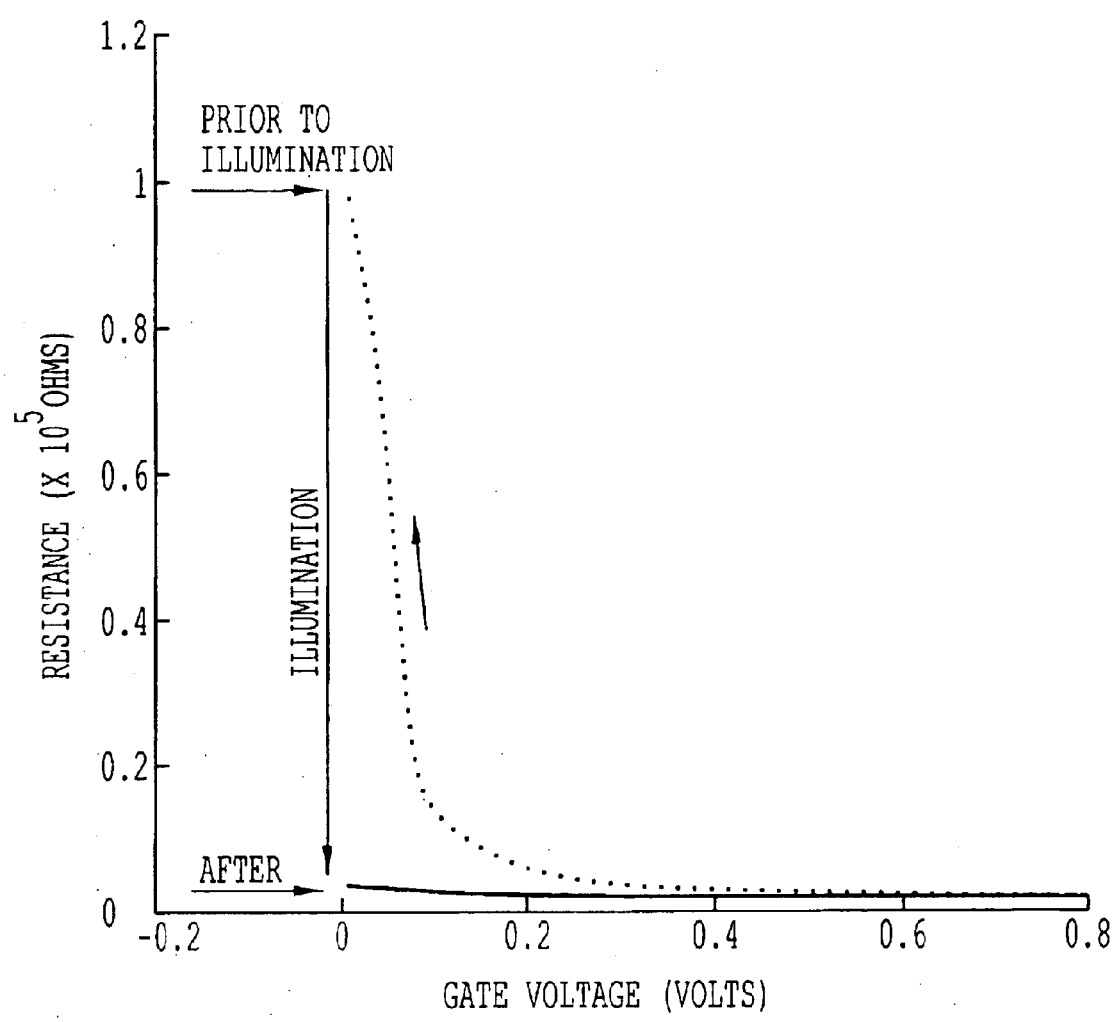
FIG. 25 shows results from a memory device in accordance with an embodiment of the present invention.

FIG. 25 shows some preliminary results from a device with the following layer structure. The layers are listed in order of growth with the growth temperature in brackets. The layers were formed by MBE:

| | | |
|---|---|---|
| 500 nm | undoped GaAs | (590° C.) |
| 250 nm | undoped Al$_{0.33}$Ga$_{0.67}$As | (590° C.) |
| 40 nm | doped (Si 1 × 10$^{18}$ cm$^{-3}$) Al$_{0.33}$Ga$_{0.67}$As | (490° C.) |
| 15 nm | undoped Al$_{0.33}$Ga$_{0.67}$As | (490° C.) |
| 25 nm | undoped Al$_{0.33}$Ga$_{0.67}$As | (590° C.) |
| 20 nm | undoped GaAs | (590° C.) |
| 10 nm | undoped Al$_{0.33}$Ga$_{0.67}$As | (590° C.) |
| 2 nm | undoped GaAs | (590° C.) |
| 1.7 monolayers | undoped InAs | (520° C.) |
| 10 nm | undoped Al$_{0.33}$Ga$_{0.67}$As | (520° C.) |
| 50 nm | undoped Al$_{0.33}$Ga$_{0.67}$As | (590° C.) |
| 30 nm | doped (Si 1 × 10$^{18}$ cm$^{-3}$) Al$_{0.33}$Ga$_{0.67}$As | (590° C.) |
| 10 nm | undoped GaAs | (590° C.) |

The substrate temperature is lowered during the growth of the InAs layer to facilitate the formation of quantum dots via the Stranskii-Krastanow growth mode, The substrate temperature must be 530° C. or less so that the indium does not segregate above the growth surface. For this structure, 1.7 monolayers of InAs were deposited. However, a higher dot density can be achieved by depositing slightly more InAs (e.g. 1.7 to 3 monolayers). Increasing the number of dots increases the storage capacity of the memory. It is important that the layer grown immediately after the quantum dots is also grown at a lower temperature (520° C.) to prevent indium segregation destroying the dots. The applicant has found that the growth temperature can be raised again after 10 nm of growth. 2 nm of GaAs is grown before the InAs layer to smooth the growth surface. The lower Si doped barrier layer and its overlayer were also grown at a lower substrate temperature to prevent the Si impurities segregating and thus being incorporated into subsequently grown layers.

The wafers were etched into mesas measuring about 1 mm×1 mm using standard photolithographic techniques. NiGeAu Ohmic contacts to the electron gas were deposited and annealed. A semitransparent layer was evaporated over the central portion of the mesa to act as a Schottd front contact.

FIG. 25, plots experimental data collected on this structure at a sample temperature of 100K. The sample was illuminated with a range of wavelengths to store information in a large number of dots simultaneously. The Figure plots the four terminal resistance (R) between two ohmic contacts as a function of the bias ($V_g$) applied between the Schottky gate and one of the ohmic contacts. The device is initially in its high resistance states with the gate maintained at 0V ($V_g$=0V). This can be regarded as the "off" state. After illumination by a polychromatic red light, the resistance undergoes a dramatic decrease. The resistance does not change after further illumination. The low resistance state of the device (the "on" state) is long lived and the structure is therefore suitable as a non-volatile memory. The dramatic change in resistance is triggered by very low light levels, illustrating the alternative use of the device as a sensitive photo-transistor.

The memory can be reset by setting the gate bias to forward bias for a few seconds so that a current flows through the gate of about 1 $\mu$A. Upon returning the gate bias to $V_g$=0V, the device is once again in the high resistance state. This is illustrated in FIG. 10, which plots the change in resistance of the device (initially in the low resistance state) when the gate bias is swept from $V_g$=0V to +0.8V and then back to 0V.

For the memory to have a long retention time, it is important that there is a large potential barrier to prevent the escape of stored carriers in the dots. The retention time can be increases by replacing the $Al_{0.33}Ga_{0.67}As$ layer below and above the dot layer by AlAs. The retention time can further be increased by growing a thicker barrier between the quantum well layers and the quantum dot layer. For example, the barrier could be about 50 nm thick.

In the above device, the barrier next to the dot is a remotely doped barrier layer. Thus, in this device, carriers of the same sign are confined in the dots as in the wells. In order to trap the opposite type of carrier in the dots, the dopants should be removed from the upper doped barrier layer.

Figure 26:
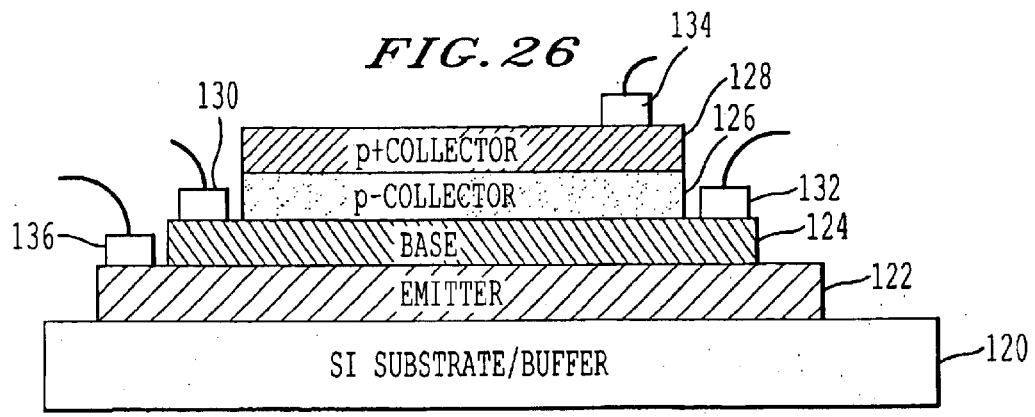
FIG. 26 shows a heterojunction bi-polar transistor in accordance with an embodiment of the present invention.

FIG. 26 shows a heterojunction bipolar transistor structure. The simplified structure shown in FIG. 26 has a semi-insulating substrate or buffer 120 with an emitter layer 122 formed on its upper surface. A base 124 comprising a plurality of layers (which will be described with reference to FIG. 12) formed on an upper surface of the emitter layer 122. A lightly doped p-type collector 126 and a heavily doped p+ collector 128 are formed on an upper surface of the base 124.

Two ohmic contacts 130 and 132 corresponding to a source and drain are provided to the base. A collector contact 134 is made to the P+ collector 128 and an emitter contact 136 is made to the emitter layer 122.

Figure 27:
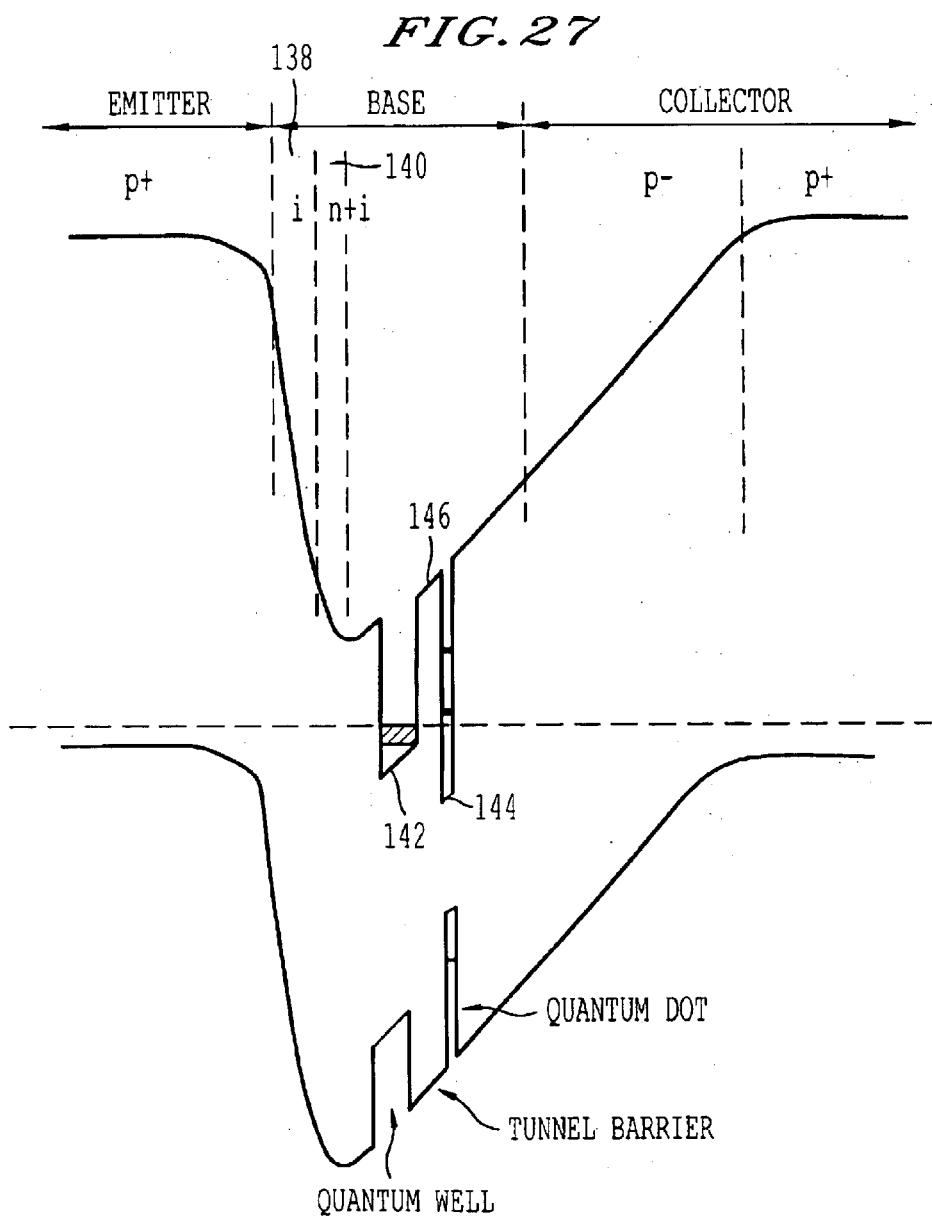
FIG. 27 shows a band structure of the device of FIG. 26.

The structure of the device is shown in more detail in FIG. 27. The collector layers 126 and 128 are p-type, the base layer 124 is n-type and the emitter layer is p-type. The base section 124 comprises an undoped section 138, an n+ barrier region 140, a quantum well layer 142 which is separated from a quantum dot layer 144 via a barrier layer 146. The field across the base can be modulated by appropriate biases across the emitter and collector. Thus, the relative separations of the conduction band edge 142 of the 2DEG and the first excited confined energy level of the quantum dot 144 can be modulated.

Figure 28:
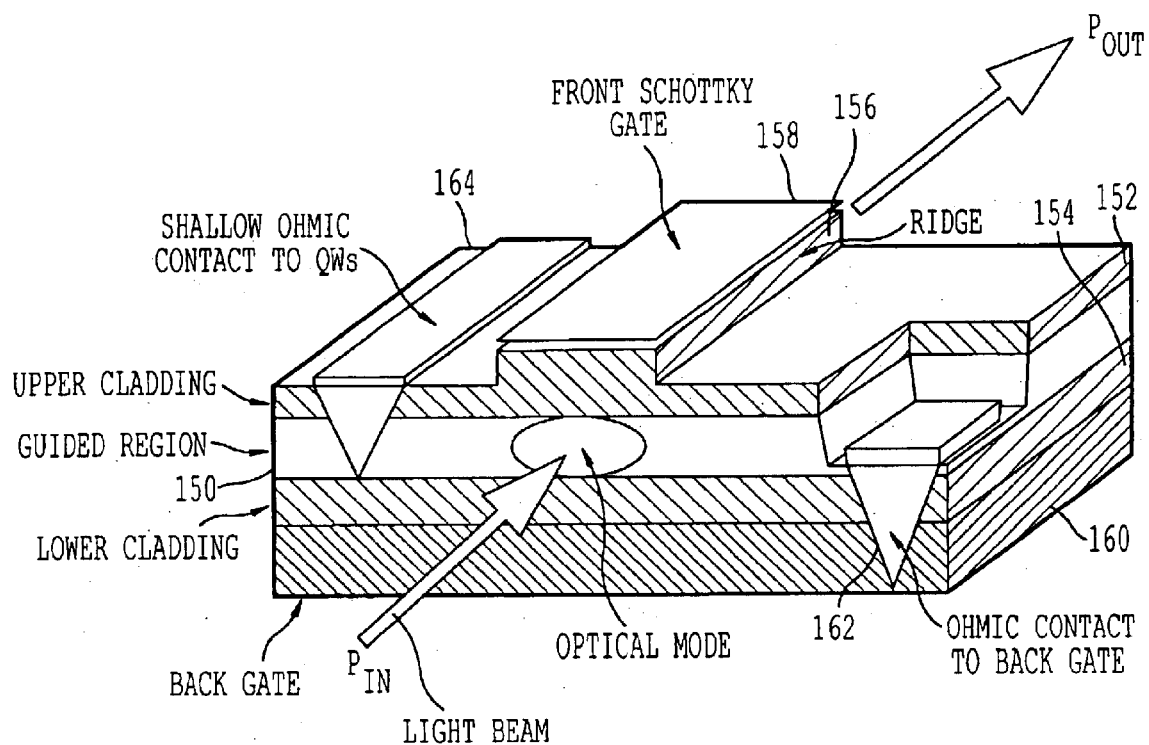
FIG. 28 shows an optical modulator in accordance with an embodiment of the present invention.

FIG. 28 shows an optical modulator. The optical modulator has a guided region through this light can propagate through. The light can propagate parallel to the plane of the layers of the guided region 150. The guided region 150 is sandwiched between upper 152 and lower 154 cladding layers. The cladding layers 152, 154 serve to confine the transmitted light in the guided region 150.

The upper cladding layer 152 is provided with a ridge 156 to form a strip waveguide. This structures confines the transmitted light to the part of the guided region 150, under the ridge 156.

A front Schottky gate 158 is provided on the upper surface of the ridge 156. A back-gate 160 is provided on the lower surface of the lower cladding layer 154. An ohmic contact 162 is provided to the back-gate 160. A second ohmic contact 164 is provided to the guided region 150.

Figure 29:
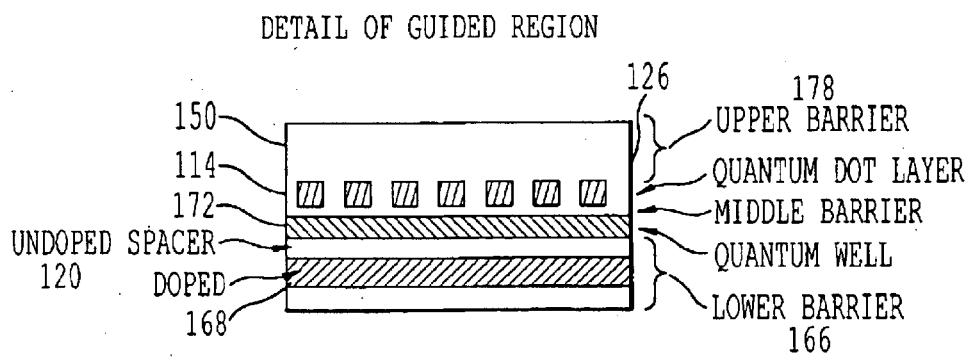
FIG. 29 shows in detail, the guided region of FIG. 28.

FIG. 29 shows the layers of the guided region 150. A active layer 172 or quantum well layer is formed on an upper surface of a modulation doped barrier layer 166. The modulation doped barrier layer has a doped barrier layer 168 which is separated from the quantum well layer 172 by an undoped spacer layer 170.

The quantum well layer 172 is separated from a layer of quantum dots 176 by tunnel barrier layer 174. An upper barrier layer 178 is formed overlying the quantum dot layer 176.

The above structure can function as an optical modulator or a memory device. A beam $P_{in}$ is incident on the structure. Absorption of the beam by a quantum at the band-gap of the quantum dot is completely suppressed if the dot already has two carriers.

FIGS. 30 to 50 describe a semiconductor memory structure using a double layer of quantum dots. The reference numerals used in FIGS. 30 to 50 will be defined below.

No significance should be attached to the fact that some reference numerals are repeated from FIGS. 1 to 29.

Figure 30:
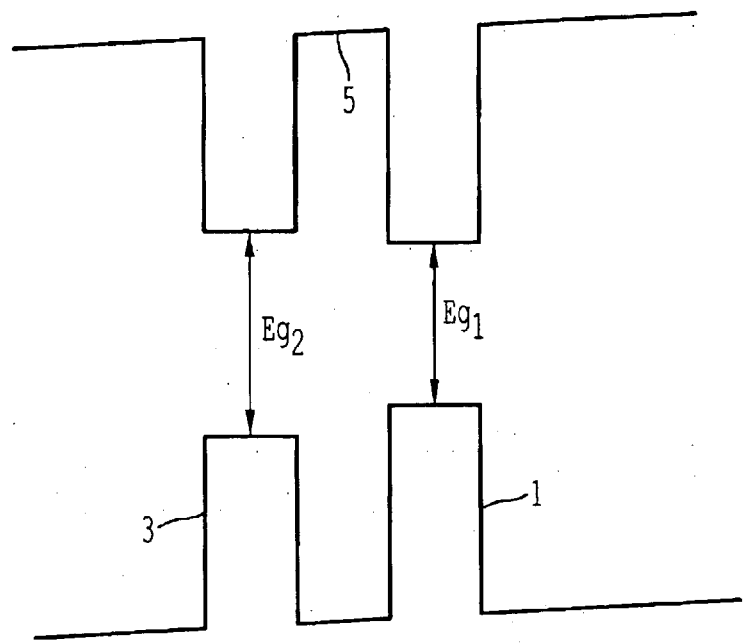
FIG. 30 shows a schematic band structure of a device with a storage quantum dot and a sense quantum dot.

FIG. 30 shows a quantum dot or a storage dot 1 separated from a second quantum dot or sense dot 3 via a barrier layer 5. The band gap $Eg_1$ of the storage dot 1 is smaller than the band gap $Eg_2$ of the sense dot 3. It is desirable if the sense quantum dot has a larger band gap energy than the storage quantum dot as there should be a radiation energy which can only excite carriers in the storage quantum dot and not the sense dot.

Figure 31:
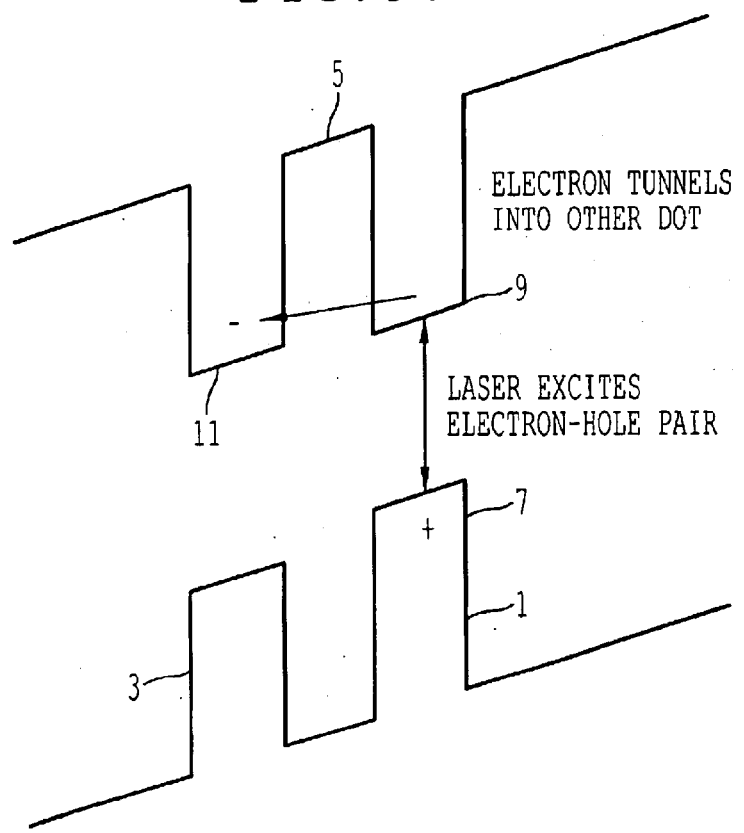
FIG. 31 shows a schematic band structure of the device in FIG. 30 with an electric field applied.

FIG. 31 shows the structure of FIG. 30 with an electric field applied. Initially the device will be described with electrons as the tunnelling carrier. However, it will be appreciated by those skilled in the art and explained hereinafter that holes could also be the tunnelling carrier. Holes can form the tunnelling carrier if the electric field is applied in the opposite direction.

Upon illumination with radiation of a predetermined energy, an electron hole pair is excited in the storage quantum dot 1. The energy of the radiation is low enough not to excite electron-hole pairs in the sense quantum dot. The electron hole pair is created such that the hole is excited in the valence band layer 7 of quantum dot 1 and the electron is excited in the conduction band layer 9 of quantum dot 1. Due to the electric field, the electron in layer 9 tunnels through barrier 5 into the conduction band 11 of the sense quantum dot 3.

Depending on the magnitude of the applied electric field across the dots 1 and 3, the electron will either be trapped within the conduction band 11 of the sense quantum dot 3 or it will tunnel again out of the conduction band of the sense quantum dot 3.

If the electric field is such that the electron becomes trapped in conduction band 11, a dipole is formed by the positive charge in the storage quantum dot 1 and the negative charge in the sense quantum dot 3. In the present invention this dipole is detected.

FIG. 32 shows a write operation. In this device, a two dimensional electron gas is used both to detect the dipole between the sense 1 and storage 3 quantum dots and also to receive the tunnelling carriers.

As described in relation to FIGS. 30 and 31, a storage quantum dot and a sense quantum dot are separated by a tunnel barrier 5. A second tunnel barrier 13 separates the 2DEG layer 15 from the sense quantum dot 3. When the storage quantum dot 1 is irradiated with illumination near the band gap of the first quantum dot 1 (but less than the band gap of the sense quantum dot 3), an electron—hole pair is excited in the storage dot 1. The electric field is set so that it is energetically favourable for an electron to tunnel from the conduction band 9 of the storage quantum dot 1 to the conduction band 11 of the sense quantum dot 3 and through to the conduction band 17 of the 2DEG 15. A hole 19 is trapped in the valence band of the storage quantum dot 1. Further illumination results in the trapping of a second hole within the valence band of storage dot 1. Due to the Pauli exclusion principle, it is not possible to add more than two holes into this valence band level of the storage quantum dot 1.

A "blocking" layer 10 is provided overlaying the storage dot layer 9. This is a large barrier layer which prevent carriers trapped in the storage dot 9 from tunnelling out of the storage dot.

FIG. 33 shows the same device as FIG. 32 but here, the electric field is such that tunnelling of the electron from the conduction band 9 of the storage 1 quantum dot to the conduction band 3 of the sense quantum dot is suppressed. This is because the conduction band 11 of the sense quantum dot has a higher energy level than that of the conduction band 9 of the storage quantum dot. A device with this electric field would not allow a write (or even a read) operation.

Figure 34:
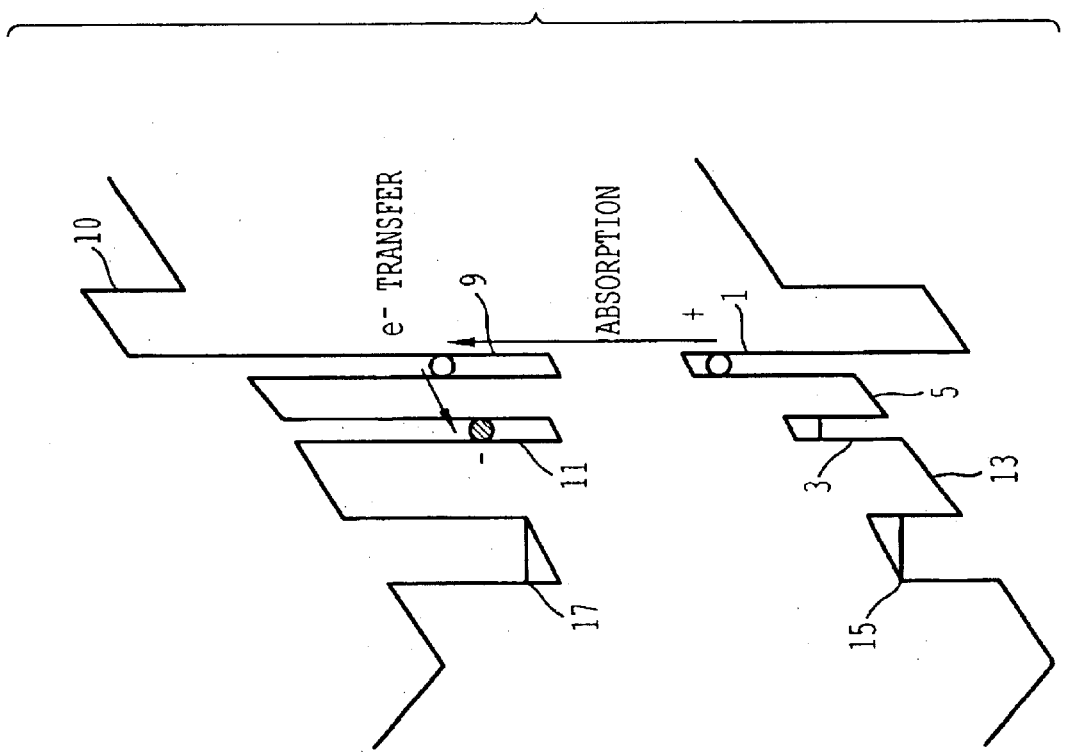
FIG. 34 shows the device of FIGS. 32 and 33 during reading of an empty dot.

FIG. 34 shows the device configured for a read operation. Here, the storage dot 1 which is being read is an empty dot. The storage quantum dot 1 is irradiated and an electron hole pair is photo-excited. The electron is excited into the conduction band 9 of the storage dot 1 and tunnels due to the electric field into the conduction band 11 of the sense quantum dot 3. However, the electric field here is not large enough to allow tunnelling from the conduction band 11 of the sense quantum dot into the conduction band 17 of the quantum well 15. Therefore, the electron becomes trapped in the conduction band 11 of the sense quantum dot 3. Meanwhile the photo-excited hole is trapped in the valence band of the storage dot 1.

Thus, a dipole is formed by the positive charge in the storage quantum dot 1 and the negative charge in the sense quantum dot 11. This dipole affects the characteristics of the quantum well 15. Hence, the presence of the dipole can be detected by measuring a characteristic of the quantum well 15, such as its conductivity.

After reading the device is returned to inactive mode, for which the electric field is such that the electron and hole photo created in the reading process in the storage and sense quantum dots recombine. However, this field does not allow electrons to tunnel from the 2DEG to recombine with hole trapped in the storage dot due to a write process.

Figure 35:
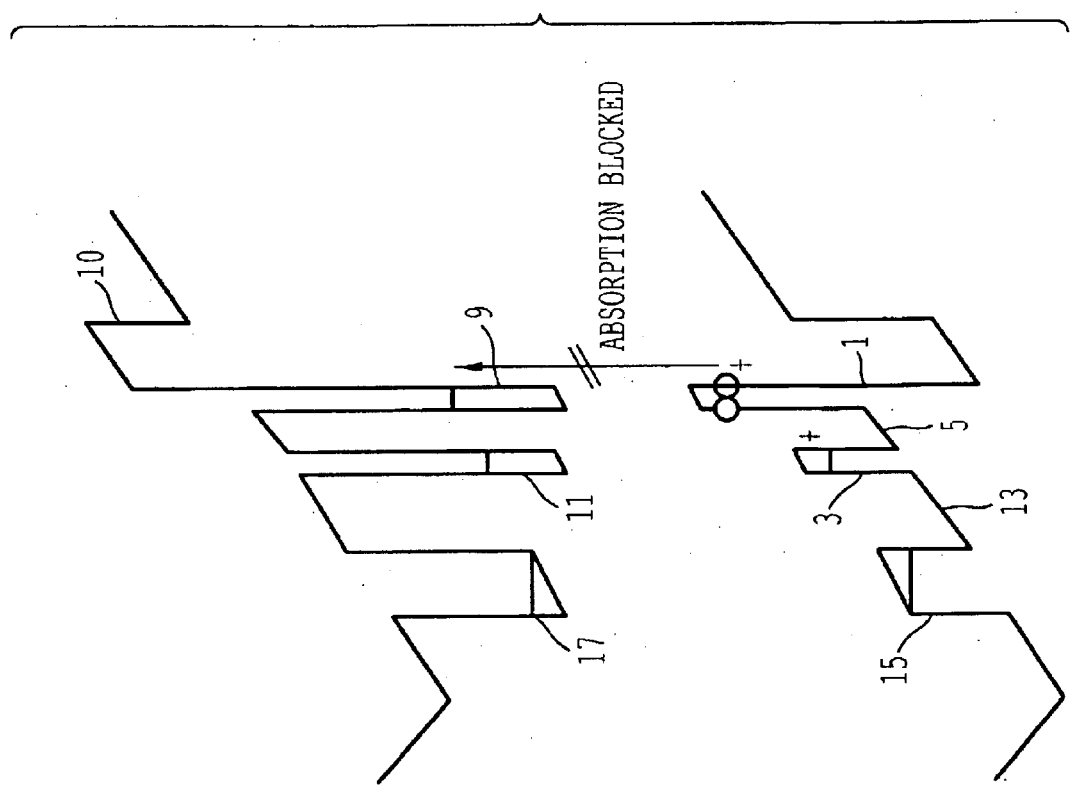
FIG. 35 shows the device of FIGS. 32 to 34 during reading of an occupied dot.

FIG. 35 shows the read operation for an occupied dot i.e. a dot which has been previously written to. Here, the valence band of the storage quantum dot has been filled during the write operation. Subsequent illumination will not cause electron-holes to be photo-excited as the valence band of the storage dot is fill and cannot accommodate any more holes. Hence, illumination does not change the charge trapped within the storage or sense quantum dots. Consequently no change is observed in the characteristic of the quantum well, such as its conductivity.

Figure 36A:
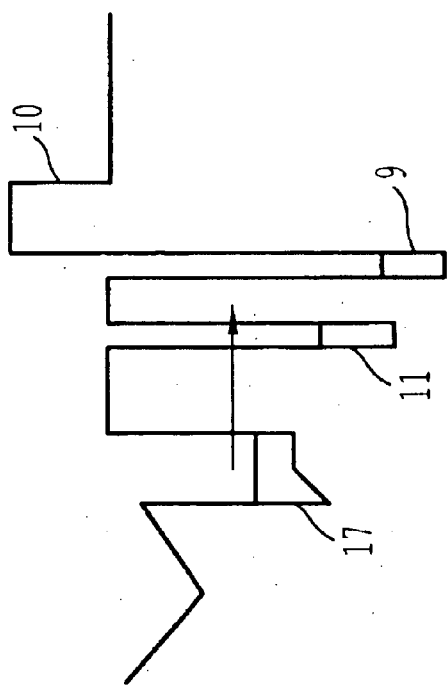
FIG. 36 shows the device of FIGS. 32 to 35 in the re-set mode.
Figure 36B:
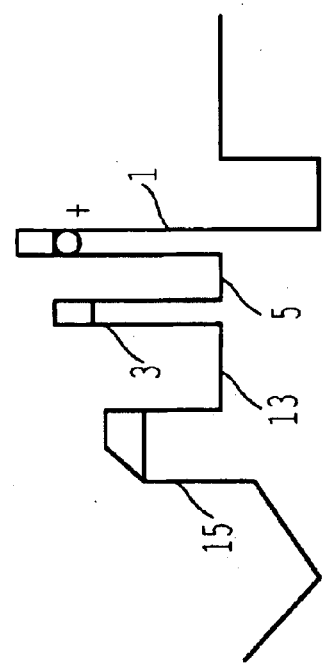

Although it is not desirable to erase or change the data in the device during the read operation, it is preferable to provide a memory whereby the memory can be re-set. This can be done as shown in FIG. 36 by varying the field across the device so that electrons tunnel from the conduction band of the quantum well layer 15 into the storage quantum dot 1 and re-combine with the holes trapped in the storage quantum dot 1.

Figure 37:
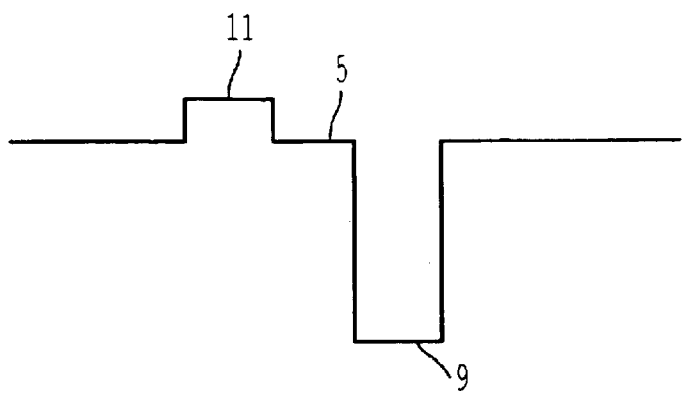
FIG. 37 shows a schematic band structure of a semiconductor device for which the two quantum dot layers are made of different materials.
Figure 38:
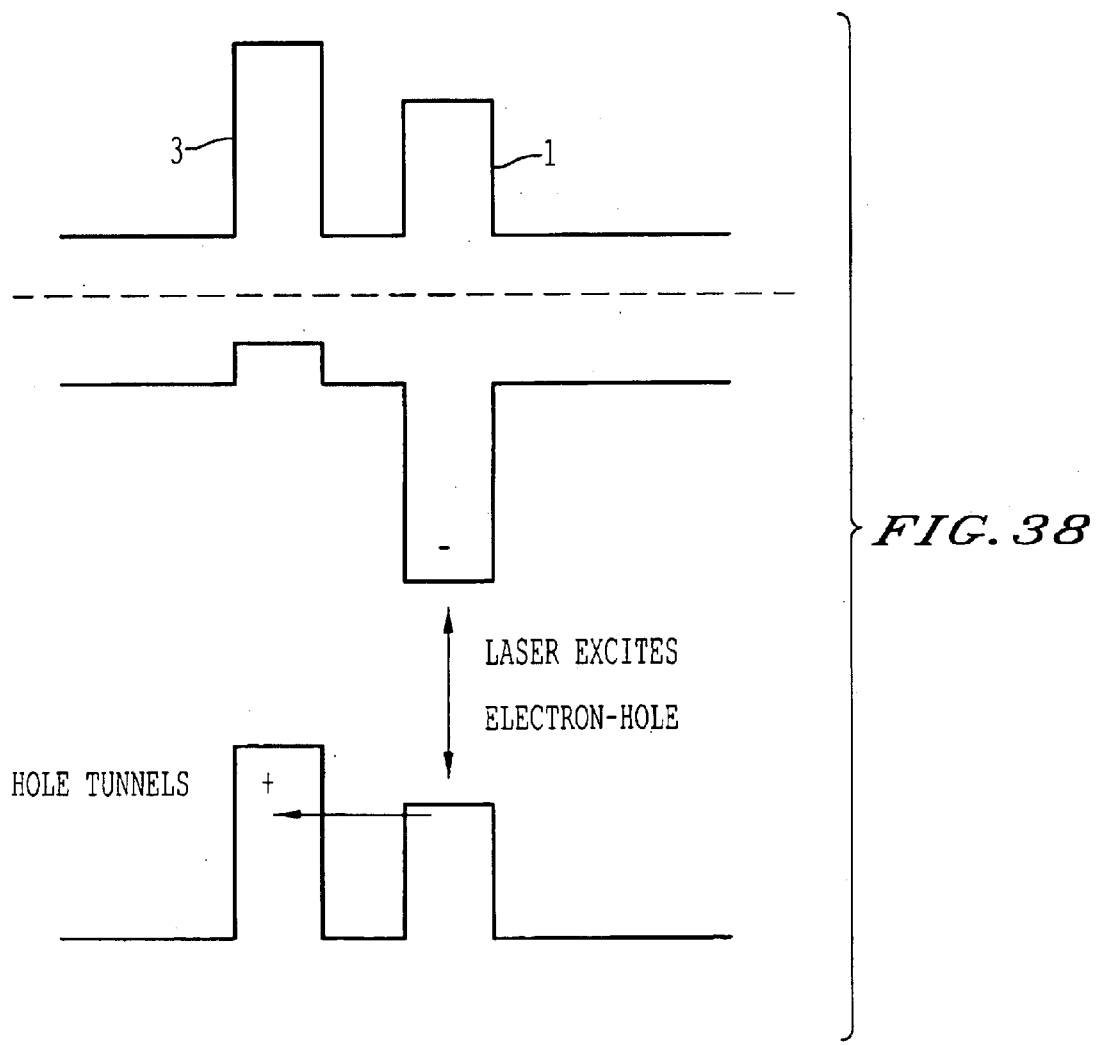
FIG. 38 shows the device of FIG. 37 in operation.

As previously mentioned, the dot layers do not have to have the same composition. FIG. 37 shows a double dot layer where one has a type I band gap and dot layer 3 has a type II band gap. There is no confining potential or trap electrons in dot layer 3 as the conduction band level 11 of the sense quantum dot is higher than the conduction band level of the barrier layer 5. The valence band edge of the sense quantum dot 3 is higher than the valence bandage of the storage quantum dot 1, thus it is energetically favourable for holes to tunnel from the storage quantum dot to the sense quantum dot 3 as shown in FIG. 38.

Figure 39:
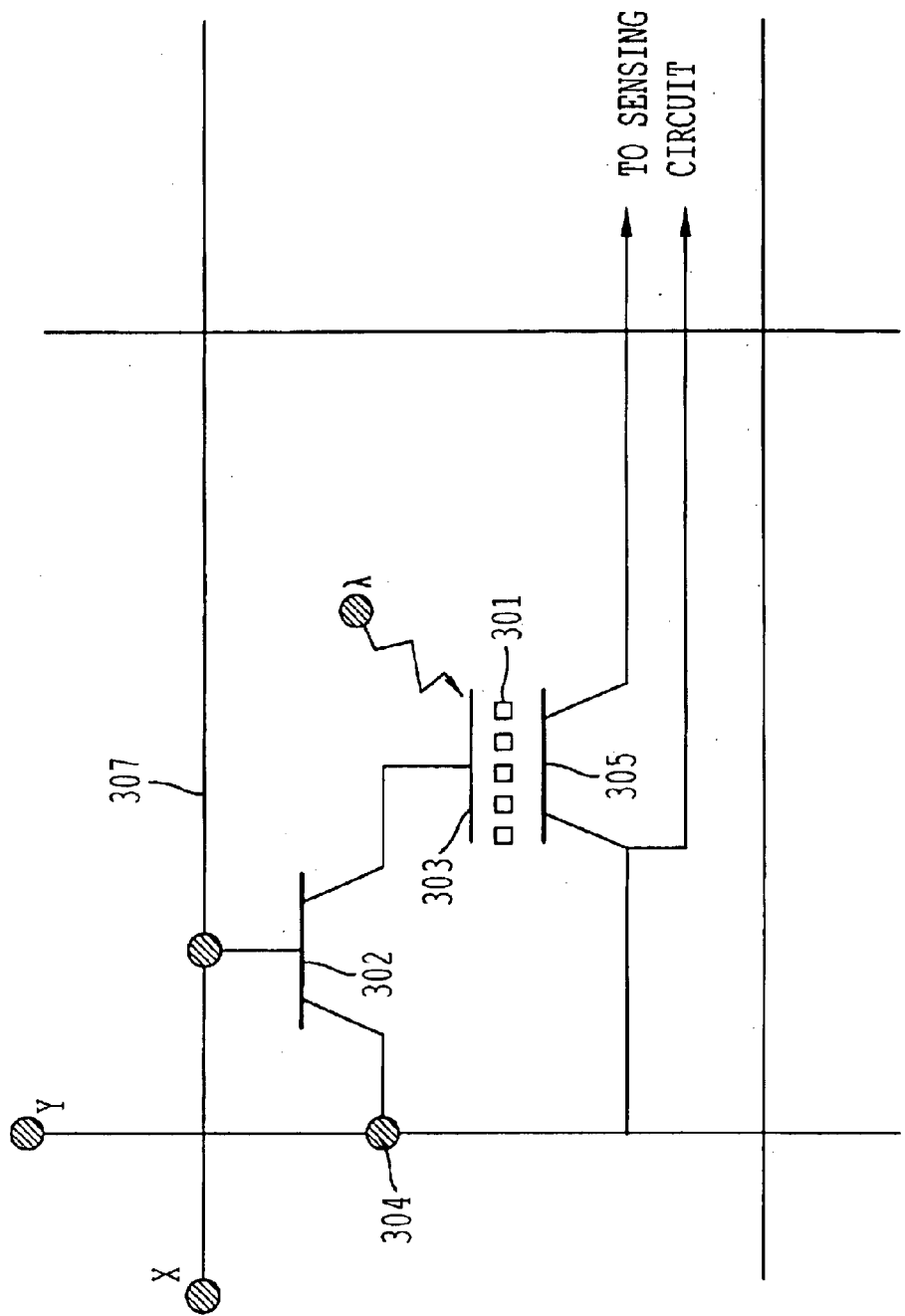
FIG. 39 shows a pixel of a memory device using a semiconductor device as described with reference to any of FIGS. 30 to 38.

FIG. 39 shows a pixel or element of a memory structure using the devices described above. The memory device would consist of an array of such pixels. Each pixel can be addressed individually by applying biases of the appropriate levels to the appropriate word 307 and bit 309 lines. Applying a voltage to the word line 307, turns the switching transistor 302 on, and thus applies the voltage on the bit line 309 to the gate of the device 303. The value of this voltage determines whether the pixel is in write, read, inactive or reset mode. Thus an appropriate voltage level should be applied to the bit fine 309 to ensure the desired function of the pixel. In this way it is possible to operate the device by illuminating all the pixels simultaneously. Only the pixel which is addressed by the appropriate word and bit line voltages will be sensitive to the incident light. Hence only this pixel will have data written to the pixel, or data written from the pixel, depending upon value of the voltage applied to the bit line. The advantage of this method is that it avoids having to scan the illumination between different pixels. Thus this addressing method allows for faster reading and writing operation of the device.

Figure 40A:
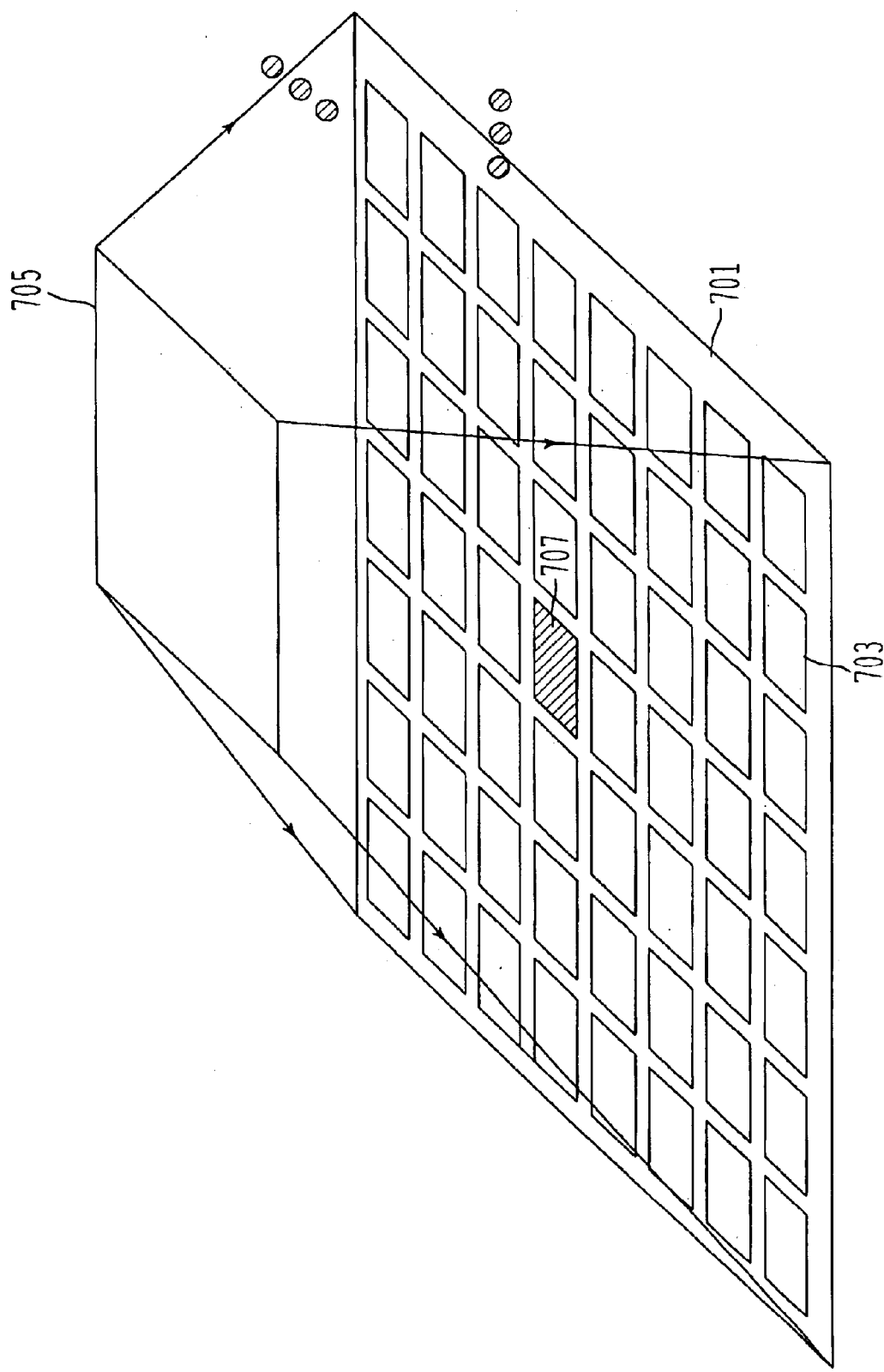
FIG. 40 shows a device according to an embodiment of the present invention in situ with a laser beam.

FIG. 40A shows a memory structure 701 comprising a plurality of pixels 703. Each pixel is addressable by a word-ine or a bit-line (not shown). The irradiating beam 705, which can either be writing or reading data illuminates a plurality of pixels. However, only the active pixel 707 which has the current voltages applied on the word and bit-lines to allow the device to read or write as required can store or provide data.

Figure 40B:
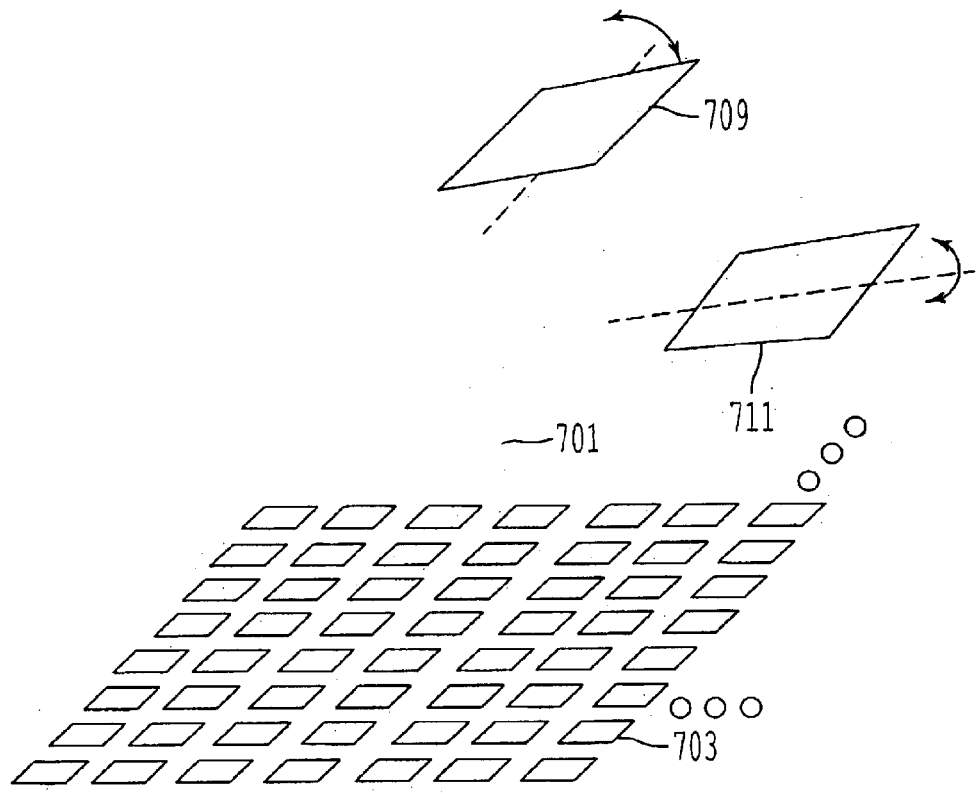

FIG. 40B shows a variation on the device of FIG. 40A. Here, again, the device comprises a plurality of pixels 703. Except here, the read/write beam 705 is focused onto a specific pixel to read and write data to that pixel. The beam is guided via mirrors 709 and 711 which are actuated by galvanometers. The laser 705 is focused to a spot size of roughly the same as the pixel at the sample surface. For this configuration, the pixel might have dimensions of about 10 $\mu$ms or less. This forms an x-y deflection system in the plane of the array which permits fast random access to a large data volume. The system could consist of several such laser beams formed by using several laser diodes or alternatively by optically splitting a single laser beam.

It will be apparent to those skilled in the art that the pixel can be designed in other ways to achieve a similar function.

As an alternative, the device may be addressed optically by focusing the light source to a spot of similar diameter to the pixel and scanning the illumination source between the different pixels of the device. The illumination source might correspond to a laser diode focused to a spot diameter of preferably between 0.25 and 10 microns. The illumination source may be scanned in the plane of the surface of the device using two mirrors attached to galvanometers.

Figure 41:
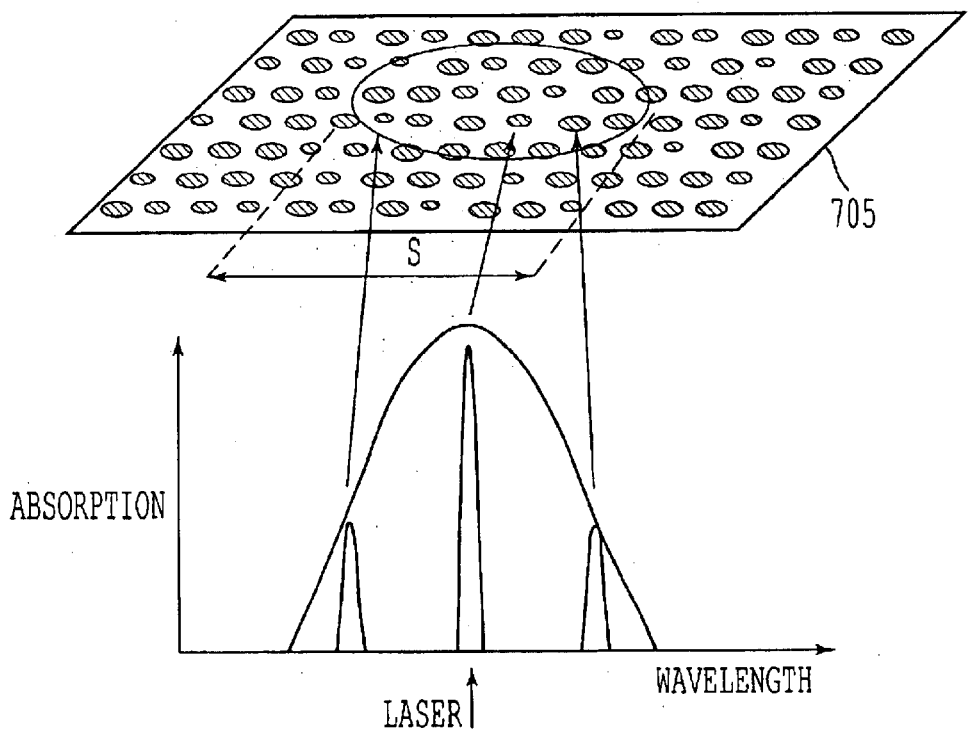
FIG. 41 shows a part of absorption of a laser beam by the storage dots against wavelengths of the laser beam.

FIG. 41 shows a graph of the absorption of the storage dot layer against wavelength.

The dots are of different sizes and hence, have a plurality of different transition energies.

Figure 42:
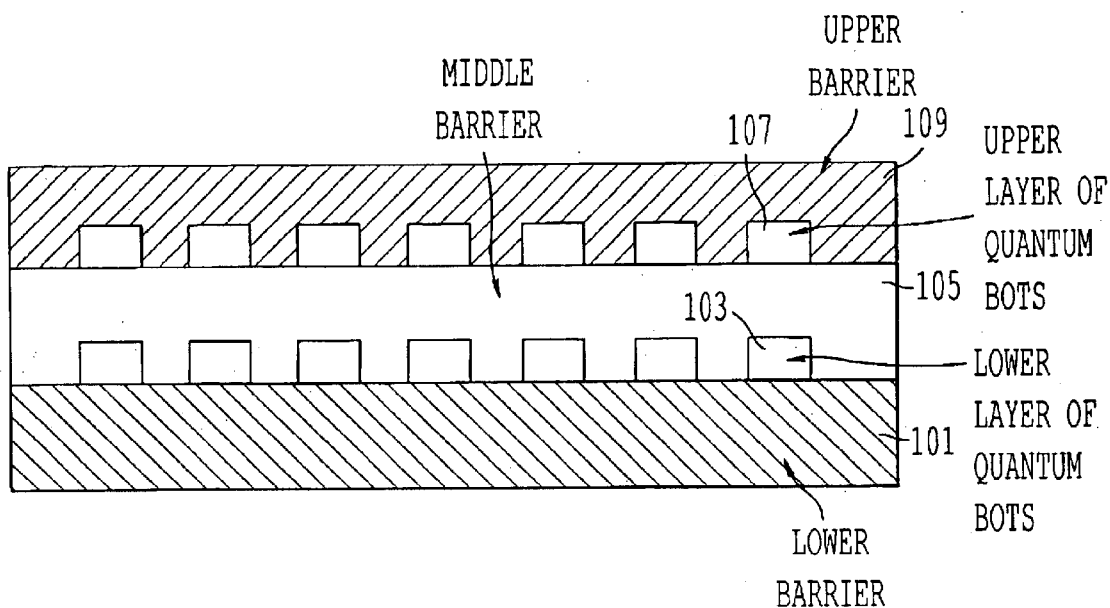
FIG. 42 shows a layer structure of a device in accordance with an embodiment of the present invention.

FIG. 42 shows an example of a structure which can be used for the memory device of the present invention. In the structure of FIG. 53, the 2DEG is omitted for clarity. On top of the 2DEG layer (not shown) is a lower barrier layer 101. On top of the lower barrier layer is formed the second dot layer 103. This layer will form the sense dots. As previously mentioned, this layer can be formed by the Stranski-Krastanow growth technique. On top of the first dot layer is formed a middle barrier layer 105. On top of the middle barrier layer is formed an upper dot layer 107. At least some of the dots in the upper dot layer 107 align with the dots in the lower dot layer 103 to form aligned double quantum dots. An upper barrier layer 109 is formed overlaying the storage dot layer.

Figure 43:
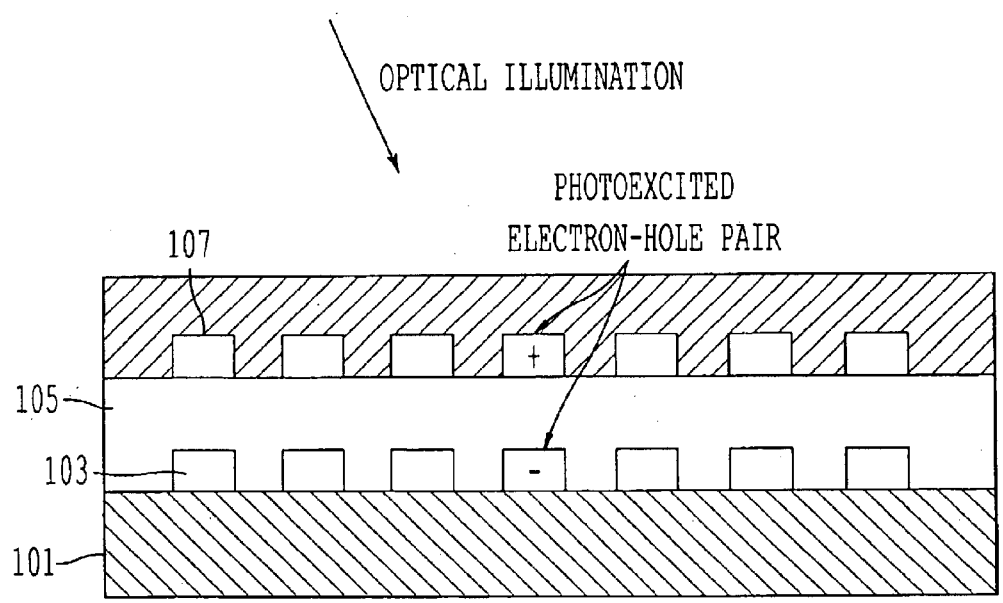
FIG. 43 shows the device of FIG. 42 when charged in a read mode.

FIG. 43 shows the structure of FIG. 42 after a dot has been illuminated, following the description accompanying the read operation, an electron hole pair is excited in a dot in the storage dot layer 107, the electron is excited into the conduction band and tunnels into the conduction band of the aligned sense quantum dot in the sense dot layer 103. This leaves a positive charge (due to the disassociated hole trapped in the valence band) in the storage dot layer 107 and a negative charge due to the trapped electron in the conduction band of the sense dot layer. These charges set up a dipole which can be detected by, for example, a 2DEG.

FIG. 44 shows typical layer structures and their conduction band profiles which may be used to fabricate the devices of the first aspect of the present invention. There are many methods for producing quantum dots. For example, they can be produced by photolithographic techniques, electron lithography etc. A preferable method is to use the Stranski-Krastanow growth mode. When a first layer is grown on top of a layer with a different lattice constant from the first layer, the first layer forms into islands. In other words, 3D islands are formed on the growth surface, which when capped with a barrier material, produces a plurality of quantum dots. The device according to the first aspect of the present invention requires two layers of quantum dots and at least one of these dots must be aligned. The alignment of two layers of quantum dots can also be achieved by using the Stanski-Krastanow growth mode. If a second layer of dots is grown on top of the barrier layer (which is grown on top of the first layer) then the spatial positions of the dots in the second layer will align with those in the first layer. It has been found that the dots in the second layer are larger than the dots in the first layer and have a lower band gap energy. Thus this provides a very convenient method for producing two coupled layers of quantum dots, in which the average band gap energy of the dots in each layer is different.

Figure 44A:
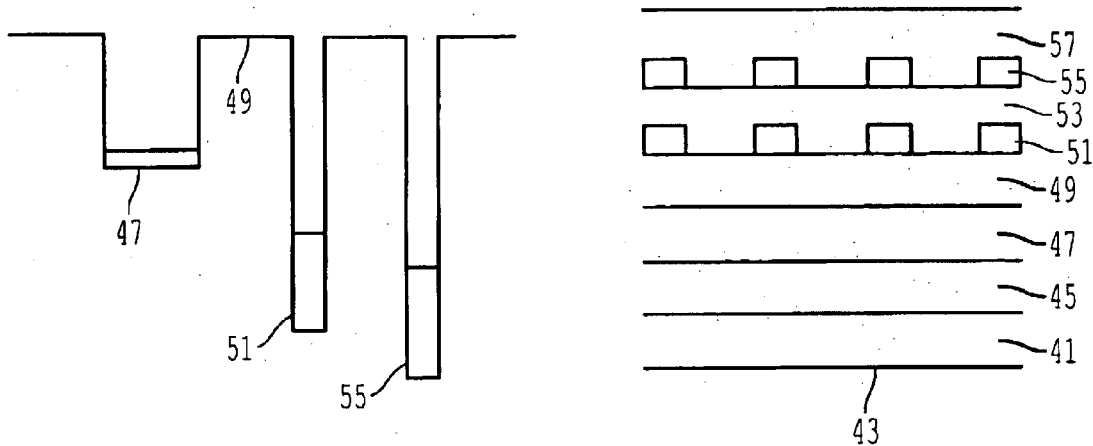
FIG. 44 shows possible variations in the layer structure of a device in accordance with an embodiment of the present invention.

In FIG. 44A, a doped barrier layer 41 of AlGaAs is formed on top of a substrate or buffer layer 43. An undoped space layer 45 is then formed on an upper surface of the doped barrier layer 41. This undoped space layer 45 and the doped barrier layer 41 together form a modulation doped barrier layer. A 2DEG layer 47 of GaAs is formed overlaying the undoped space layer 45. An undoped AlGaAs layer 49 is formed overlaying the GaAs 2DEG layer 47.

A doped layer 51 is then epitaxially grown on an upper surface of the barrier layer. This layer is InAlAs which has a substantially different lattice constant from AlGaAs. Thus, a plurality of quantum dots are formed. A further barrier layer 53 of AlGaAs is formed overlaying the quantum dot layer 51. Then, a further layer of InAlAs is epitaxially grown on the upper surface of barrier layer 53. This layer 55 also forms a plurality of dots and these dots substantially align with the dots in the first dot layer 51. The structure is then finished with a barrier layer of AlGaAs. Thus, two layers of quantum dots 51 and 55 are formed.

A schematic band structure for FIG. 44A is shown in the right of the diagram. In the "write" mode, carriers can tunnel from a dot in layer 55 trough a dot in quantum dot layer 51 and into the 2DEG in layer 47.

Figure 44B:
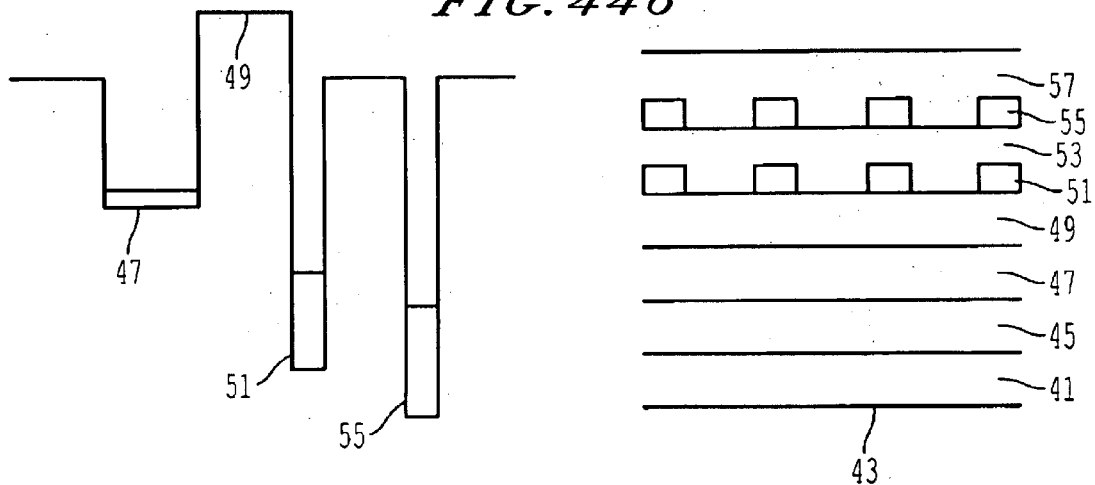

FIG. 44B shows a similar structure to that of 44A. For comparison, the layers are numbered the same as FIG. 44A. Here, an AlAs (or a AlGaAs) tunnel barrier 49 is present between the first dot layer 51 and the 2DEG layer 47. The schematic band structure shows that the tunnel barrier 49 is higher in this case than in the structure of FIG. 44A. The AlGaAs tunnel barrier 49 has a different Al content to layer 49 in FIG. 44A or layers 41 and 53 in FIG. 15B.

FIG. 44C shows again a variation on the structure of FIG. 44A. The barrier layers 41, 49 and 53 and the space layer 45 GaAs and the 2DEG layer 47 is InGaAs. The dot layers 51 and 55 are formed from either InAlAs or InAs.

Figure 44C:
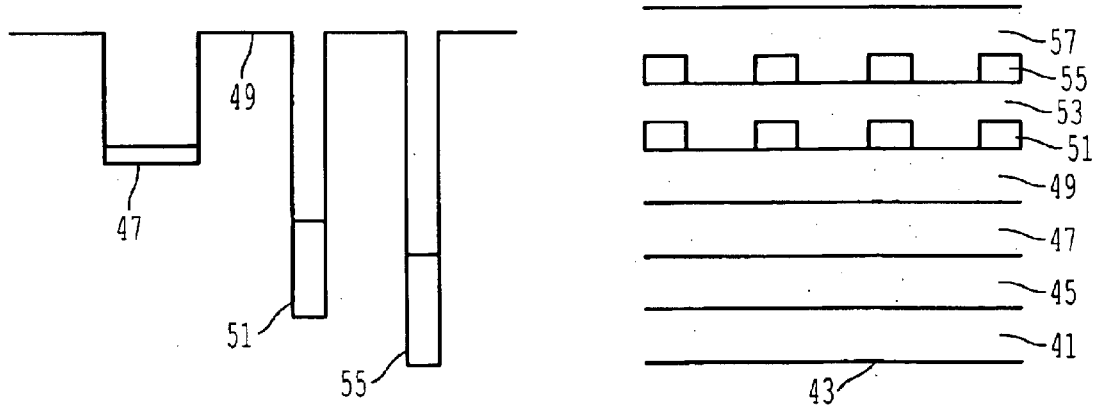
Figure 44D:
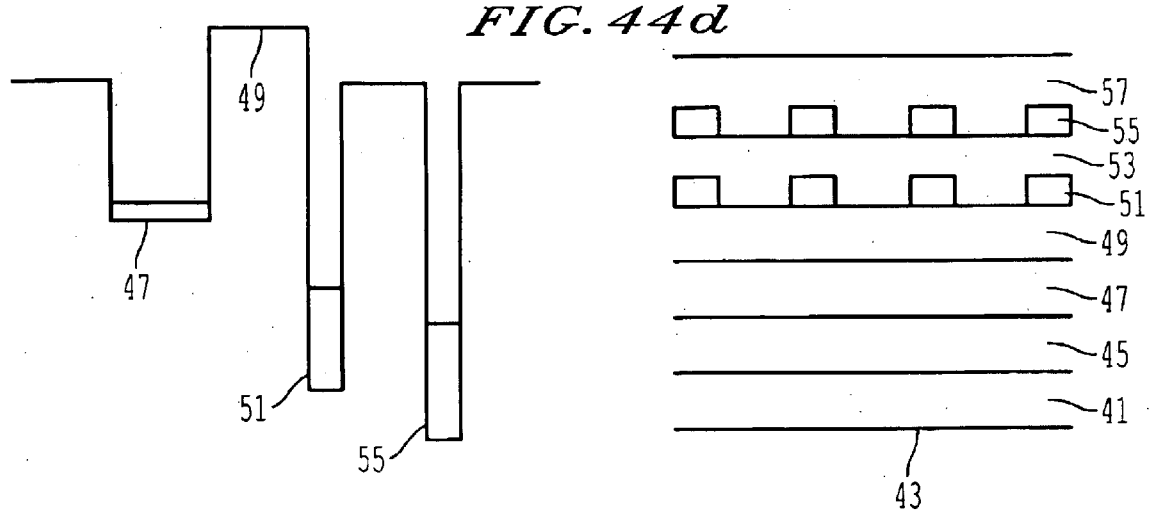

FIG. 44D shows again a slight modification on the structure of FIG. 44C. Here, the tunnel barrier 49 is either AlAs or AlGaAs. This provides a larger tunnel barrier 49 as can be seen by comparing the band structures of FIG. 44C and FIG. 44D.

Figure 44E:
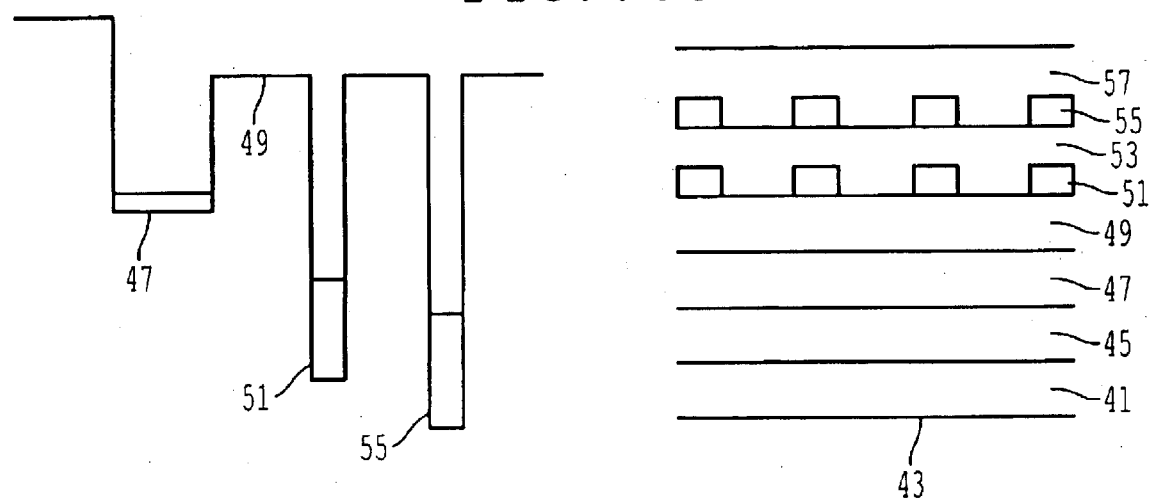

FIG. 44E shows a slight modification on the structure shown in FIG. 44C. Here, the doped barrier layer 41 and the undoped space layer 45 are AlGaAs. These layers have a larger band gap than GaAs. Therefore, it can be seen in the band structure of FIG. 44A that the conduction of band edge is higher for these layers.

Figure 44F:
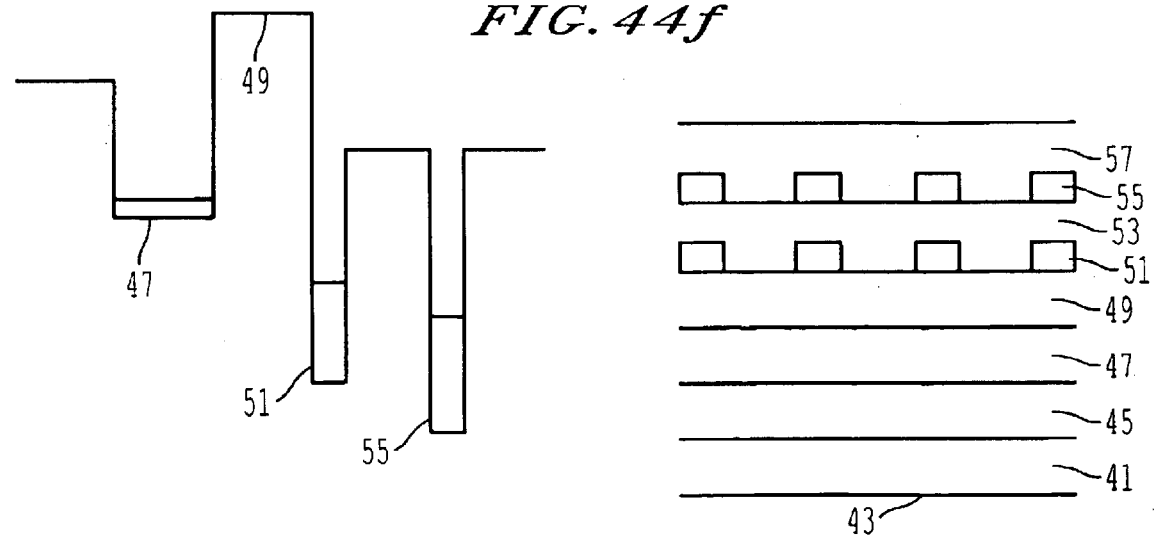

FIG. 44F shows a further modification on the structure shown in FIG. 44A. Here, the tunnel barrier 49 is also AlGaAs. The band structure shows a larger tunnel barrier 49 than that shown for the structure in FIG. 44E.

Although all the structures shown in FIG. 44 show dot layers of s it should be appreciated that the dots can be made from different materials, for example, the storage dot can be made from InAs, the sense dot could be made from GaSb.

Figure 45:
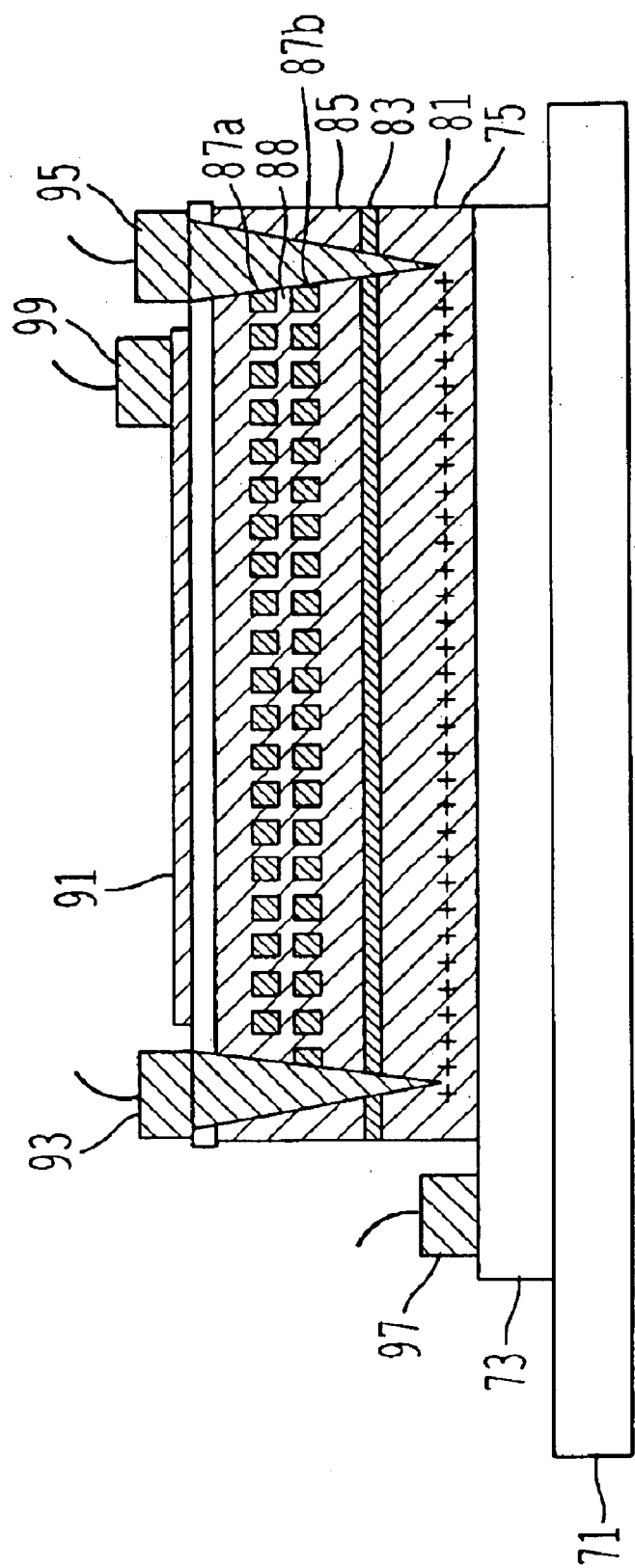
FIG. 45 shows an embodiment of the device configured as a field effect transistor.

FIG. 45 shows an embodiment of the present invention. Here, the field normal to the active layers is controlled by a front-gate and a back-gate. Essentially, the structure is a field effect transistor. A $p^+$ back-gate 73 is formed on the upper surface of a buffer layer or a substrate 71. An undoped barrier layer 75 is formed overlaying an upper surface of the back-gate 73. A modulation doped barrier layer 81 is formed overlaying an upper surface of the undoped barrier layer 75. The modulation doped barrier layer has a doped barrier layer and an undoped space layer. A quantum well layer is formed on the upper surface of the space layer 81. A tunnel barrier layer 85 is then formed on the upper surface of the quantum well layer 83. A double dot layer 87 is then formed on the upper surface of the tunnel barrier layer 85. The upper dot layer comprises a layer of sense dots (87B in FIG. 17) which are formed overlaying the upper surface of the tunnel barrier layer 85 and a layer of storage dots (87A) which is separated from the layer of sense dots by a tunnel barrier 88. A barrier layer 89 is then formed overlaying the layer of storage dots 87A. Then a capping layer is formed over the layer of storage dots 87A.

A semi-transparent Schottky gate is evaporated on the surface of the sample to form a front gate. A Schottky gate is often preferable for this type of structure as the structure is in an inactive mode when the Schottky gate is earthed. In a memory device comprising a plurality of pixels, it is preferable if the inactive state of the device corresponds to zero applied volts.

Two ohmic contacts 93 and 95 which form a source and drain respectively are made to both the quantum well layer 83 and the dot layers 87. A back-gate contact 97 is made to the back-gate 73 and a front-gate contact 99 is made to the front-gate 91. A bias can be applied between the front-gate 91 and the back-gate 73 so as to modulate the electric field normal to the quantum well layer 83 and the dot layers 87.

Figure 46:
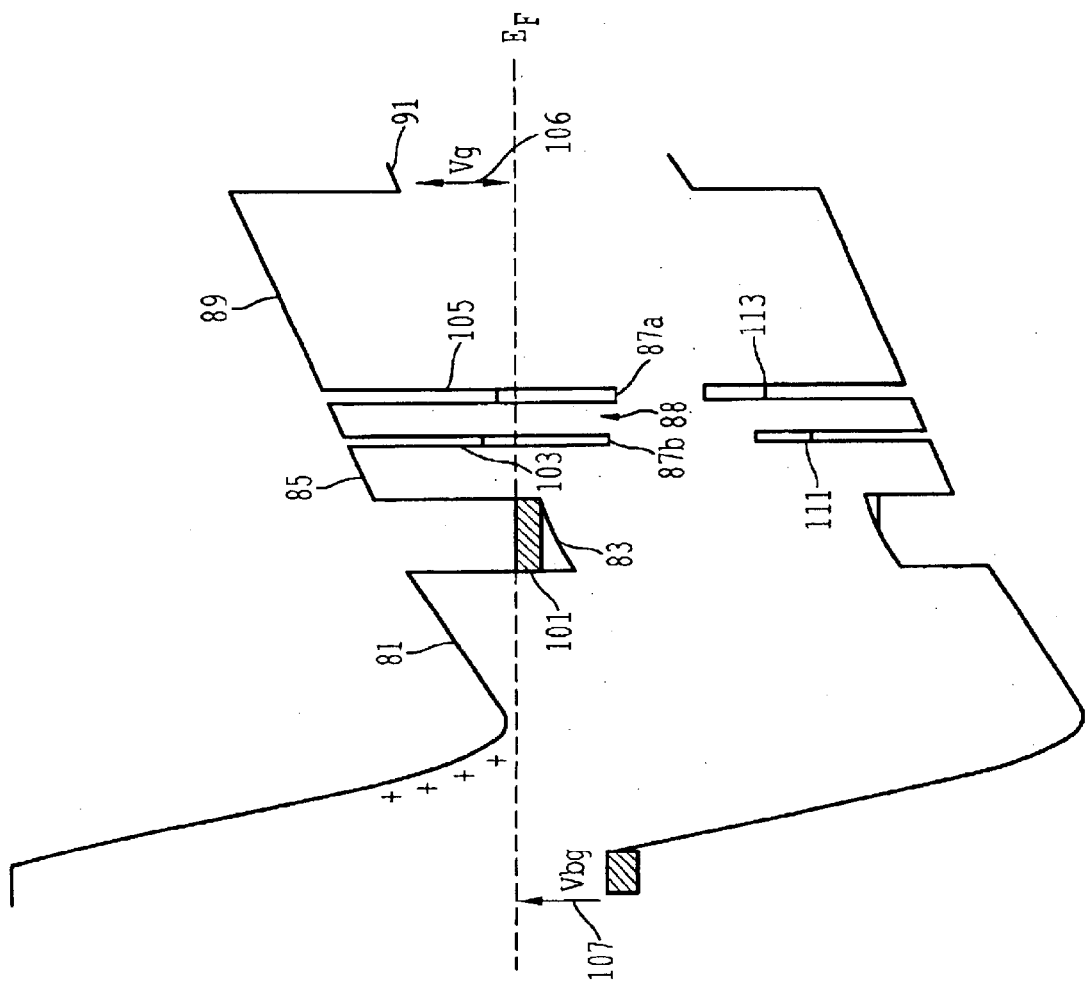
FIG. 46 shows a band structure of the device of FIG. 45.

FIG. 46 shows the band structure of the device of FIG. 45. For simplicity, the layers in the band structure have retained the same reference numerals as for FIG. 56. The diagram shows the device in its inactive state, as described earlier, where the device can not be written to, or read from under illumination. For the arrangement shown, the inactive state has been designed to occur when the potential of the front gate and 2DEG are the same, i.e. with 0V applied between the gate and an Ohmic contact. For the biased conditions shown, the conduction band edge 101 of the quantum well layer 83 lies below that of the first electron level 103 of the sense dot layer 87B. Also, the lowest electron level 105 of the storage dot layer 87A lies above the conduction band edge of the 2DEG 83 and below the lowest electron level 103 of the sense dot layer 87B.

The device can be placed into read mode, or into write mode, by applying an appropriate bias between the front gate contact and an Ohmic contact to the 2DEG. In this case a negative bias is applied to the gate in read mode, in order to allow electrons photo-excited in the storage dot to tunnel into the sense dot, but not into the 2DEG. Applying a negative bias to the front gate has the effect of raising the potential of the back gate, thereby increasing the electric field across the double quantum dot region. For write mode, a larger negative bias is applied to the front gate with respect to one of the Ohmics, so that electrons photo-excited in the storage quantum dot are able to tunnel into the 2DEG layer. The device can be reset by applying a positive bias to the front gate with respect to one of the Ohmic contacts, so that electrons tunnel from the 2DEG into the storage dot, where they recombine with trapped holes.

Figure 47:
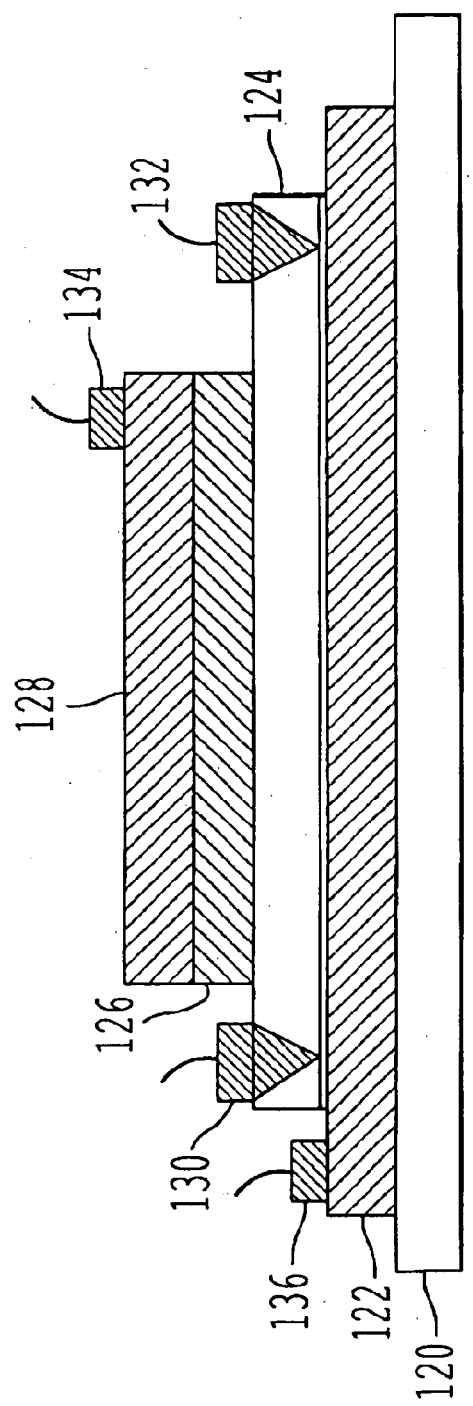
FIG. 47 shows a schematic view of the design configured as a hetero junction bi-polar transistor.

FIG. 47 shows a hetero junction bi-polar transistor structure. The simplified structure shown in FIG. 18 has a semi-insulating substrate or buffer 120 with an emitter layer 122 formed in its upper surface. A base 124 comprising a plurality of layers (which will be described with reference to FIG. 59) are formed on an upper surface of the emitter layer 122. A lightly doped p type collector 126 and a heavily doped p+ collector 128 are formed on the upper surface of the base 124.

Two ohmic contacts 130 and 132 corresponding to a source and drain are provided to the base. A collector contact 134 is made to the p+ collector 128 and an emitter contact 126 is made to the emitter layer 122.

Figure 48:
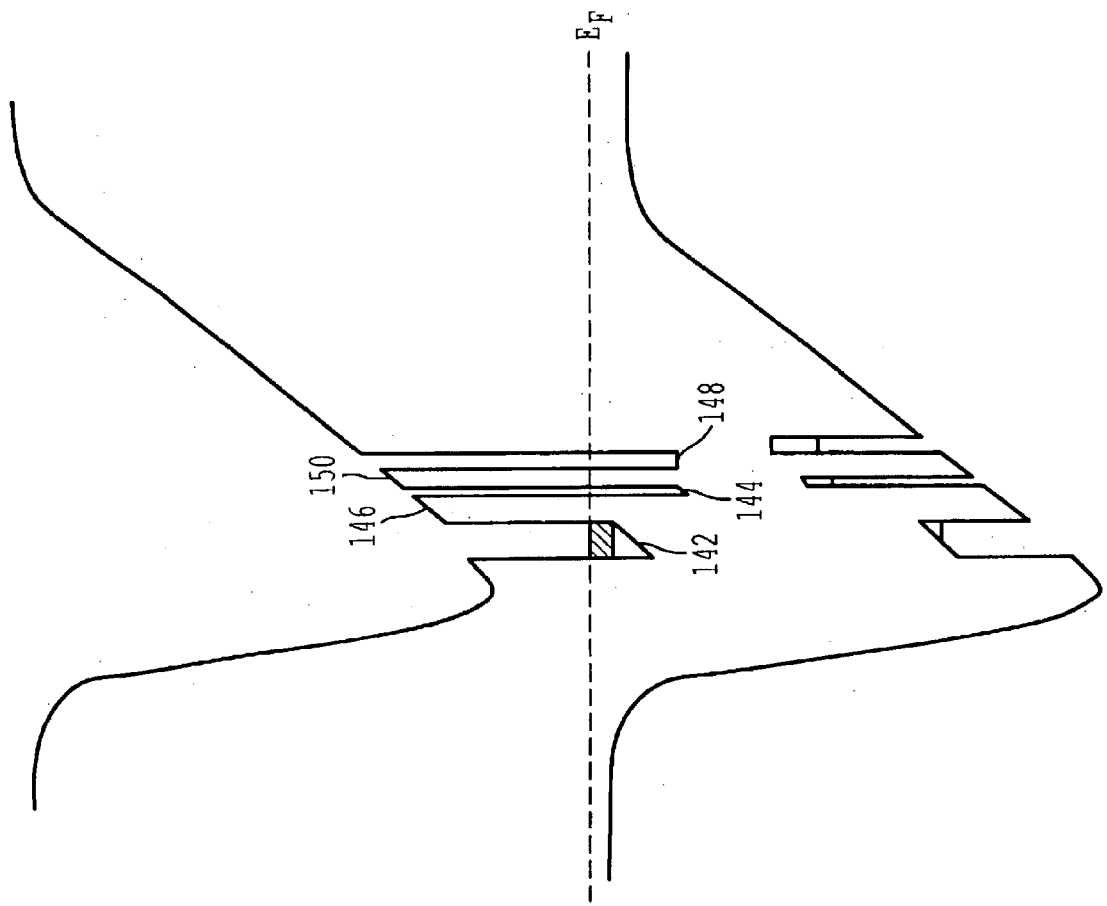
FIG. 48 shows the band structure of the device of FIG. 47.

The conduction and valence band profile of this device are shown in more detail in FIG. 48. The collector layers 126 and 128 are p-type. The base layer 124 is n-type and the emitter layer is p-type. The base section 124 comprises an undoped section 138, an n+barrier region 140, a quantum well layer 142 which is separated from the sense quantum dot layer 144 via a barrier layer 146. A storage dot quantum layer 148 is separated from the sense quantum dot layer 144 via a barrier layer 150. The field across the base cam be modulated by applying appropriate biases across the emitter and collector with respect to the Ohmic contacts to the 2DEG. By varying the bias between the collector contact 136 and one of the Ohmic contacts to the 2DEG it is possible to control the electric field across the double quantum dot region. The device can thus be set into the inactive, read, write and reset modes in a similar manner to the FET device described above.

Figure 49:
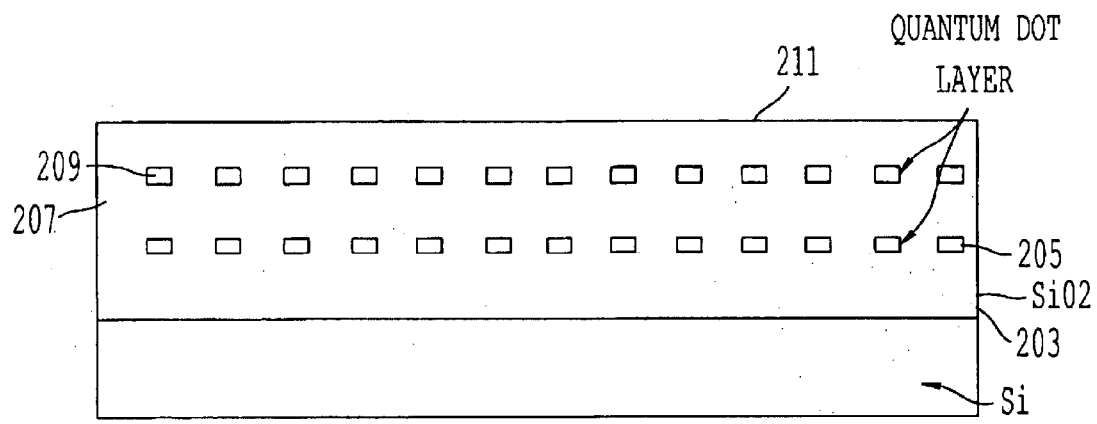
FIG. 49 shows a semiconductor device in accordance with an embodiment of the present invention fabricated from silicon.
Figure 50:
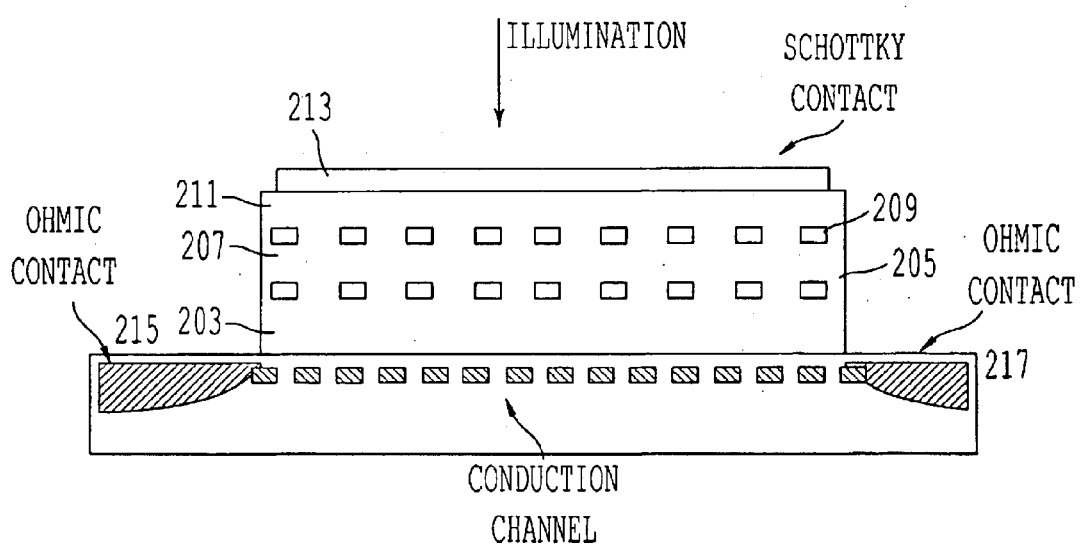
FIG. 50 shows the semiconductor device of FIG. 49 configured as a field effect transistor.

FIGS. 49 and 50 show the fabrication stages of a device according to the present invention made in silicon. A silicon base layer (for example a silicon wafer) is formed as layer 201. Next, a thermal oxide of $SiO_2$ 203 is formed at the surface of silicon base layer 201.

On top of the thermal oxide, an amorphous layer of silicon is deposited on the oxide using UHV-CVD (chemical vapour disposition) for instance. Silicon quantum dots are formed on this layer by annealing the sample at 800° C. under UHV conditions. Alternatively, another semiconductor material, for example, germanium, can be used to form the quantum dot layer in a similar manner. After formation of the quantum dot layer 205, a further $SiO_2$ layer 207 is deposited on the top of the quantum dots. A second quantum dot layer 209 is then formed on top of the $SiO_2$ layer and the layer is finished with a final $SiO_2$ layer 211.

The structure is then processed into a field effect structure as shown in FIG. 50. First, a semi-transparent metal gate 213 is formed overlaying $SiO_2$ layer 211. The areas outside of the gates are etched to expose the Si base layer 201. N-type ohmic contacts 215 and 217 are then formed into the exposed Si region on either side of the gated region. By biasing the gates, a 2DEG conduction channel is induced between contact 215 and 217.

What is claimed is:

1. A photon detector comprising:
   first and second active layers separated by a first semiconductor barrier layer;
   means for detecting a change in a characteristic of the first active layer,
   wherein the first active layer comprises a quantum well layer bounded by said first semiconductor barrier layer and a second semiconductor barrier layer and configured to support a two dimensional carrier gas and the second active layer comprises a plurality of quantum dots; and
   a gate configured to apply an electric field normal to the first and second active layers.

2. A photon detector comprising:
   first and second active layers separated by a first semiconductor barrier layer;
   means for detecting a change in a characteristic of the first active layer,
   wherein the first active layer comprises a quantum well layer bounded by said first semiconductor barrier layer and a second semiconductor barrier layer and configured to support a two dimensional carrier gas and the second active layer comprises at least one quantum dot; and
   a gate configured to apply an electric field normal to the first and second active layers.

3. The detector of claim 1, wherein the second active layer comprises no more than 10,000 active quantum dots.

4. The detector of claim 1, wherein the means for separating a photo-excited electron-hole pair comprise:
   means for applying an electric field normal to the first and second active layers.

5. The photon detector of claim 1, wherein the means for detecting a change in the characteristic of the first active layer comprise:

means for detecting a transport characteristic of carriers in the first active layer.

6. The detector of claim 1, wherein the means for detecting a change in a transport characteristic is configured to detect a change within a conduction channel of the first active layer having a length of 100 μm in a transport direction of the first active layer.

7. The detector of claim 6, wherein the means for detecting a change in a transport characteristic is configured to detect a change within a conduction channel of the first active layer having a length of 10 μm in the transport direction of the first active layer.

8. The detector of claim 1, wherein excess carriers in addition to the photo-excited electron-hole pair are provided to the quantum well layer.

9. The detector of claim 1, wherein the quantum dots comprise at least one of InAs and InGaAs.

10. The detector of claim 1, further comprising:

an absorption layer configured to absorb incident radiation, said absorption layer being a barrier layer to the second active layer, having a thickness of at least 100 nm, and located outside an active region of the photon detector, said active region comprising the first and second active layers and the first semiconductor barrier layer.

11. The detector of claim 2, wherein said a gate has an area of up to $10^{-8} m^2$.

12. The detector of claim 1, wherein said gate is a split gate.

13. The detector of claim 1, wherein the means for detecting comprises at least one of means for differentiating a signal with respect to time obtained from the change in the characteristic of the first active layer and means for detecting with time the change of the characteristic of the first active layer.

14. A photon detector array comprising:

a plurality of pixels, each pixel including the detector of claim 1; and a grid of wires configured such that each pixel may be selectively addressed by applying an appropriate voltage to at least one of said wires.

15. The array of claim 14, wherein the wires are configured to apply a control signal to the means for separating a photon-excited electron-hole pair of each photon detector.

16. A semiconductor device comprising:

an active region including, first and second active layers separated by a first semiconductor barrier layer;

a gate configured to apply an electric field normal to the first and second active layers;

means for detecting a change in a characteristic of the first active layer; and an absorption layer having a thickness of at least 100 nm, said absorption layer configured as an undoped layer located outside said active region and on a side of the second active layer, and said absorption layer configured to absorb photons and produce photo-excited carriers from the absorbed photons, wherein the first active layer comprises a quantum well layer bounded by said first semiconductor barrier layer and a second semiconductor barrier layer and configured to support a two dimensional carrier gas of excess carriers and the second active layer comprises a plurality of quantum dots.

17. A photon detector comprising:

first and second active layers separated by a first semiconductor barrier layer;

a gate configured to apply an electric field normal to the first and second active layers; and means for detecting a change in a characteristic of the first active layer, wherein said photon detector is configured such that, upon illumination, photo-excited carriers are swept into quantum dots of the second active layer, the first active layer comprises a quantum well layer bounded by said first semiconductor barrier layer and a second semiconductor barrier layer and configured to support a two dimensional carrier gas of excess carriers in addition to the photo-excited carriers, and the second active layer comprises a plurality of the quantum dots.

18. A photon detector configured to detect radiation of at least one predetermined frequency, comprising:

first and second active layers separated by a first semiconductor barrier layer;

a gate configured to apply an electric field normal to the first and second active layers; and means for detecting a change in a characteristic of the first active layer, wherein said detector is configured such that, upon illumination with radiation having said at least one predetermined frequency, photo excited carriers are excited and trapped within quantum dots of the second active layer, the first active layer comprises a quantum well layer bounded by said first semiconductor barrier layer and a second semiconductor barrier layer and configured to support a two dimensional carrier gas of excess carriers in addition to the photo-excited carriers, and the second active layer comprises a plurality of the quantum dots.

19. A photon detector comprising:

first and second active layers separated by a first semiconductor barrier layer;

means for detecting a change in a characteristic of the first active layer, wherein the first active layer comprises a quantum well layer bounded by said first semiconductor barrier layer and a second semiconductor barrier layer and configured to support a two dimensional carrier gas and the second active layer comprises a plurality of quantum dots; and a gate configured to apply an electric field normal to the first and second active layers, wherein the means for detecting comprise at least one of means for differentiating a signal with respect to time obtained from the change in the characteristic of the first active layer and means for detecting with time the change of the characteristic of the first active layer.

20. A semiconductor device comprising:

an active region including first and second active layers separated by a first semiconductor barrier layer, wherein the first active layer comprises a quantum well layer bounded by said first semiconductor barrier layer and a second semiconductor barrier layer and configured to support a two dimensional carrier gas of excess carriers and the second active layer comprises a plurality of quantum dots;

a gate configured to apply an electric field normal to the first and second active layers;

means for detecting a change in a characteristic of the first active layer;

an absorption layer having a thickness of at least 100 nm, said absorption layer comprising an undoped layer, and said electric field configured to be applied across said absorption layer such that photo-excited carriers in said absorption layer are swept into said second active layer.

21. The photon detector of claim 1, wherein the second active layer comprises a plurality of no more than 100,000 active quantum dots.

22. The photon detector of claim 2, wherein the second active layer comprises a plurality of quantum dots over an active area of no more the $10^{-8} m^2$.

23. A photon detector comprising:

first and second active layers separated by a first semiconductor barrier layer;

means for detecting a change in a characteristic of the first active layer, wherein the first active layer comprises a quantum well layer supporting a two dimensional carrier gas of excess carriers bounded by said first semiconductor barrier layer and a second semiconductor barrier layer and the second active layer comprises a plurality of quantum dots; and a gate configured to separate a photo-excited electron-hole pair.

* * * * *